US011768689B2

(12) United States Patent
Barry et al.

(10) Patent No.: US 11,768,689 B2
(45) Date of Patent: *Sep. 26, 2023

(54) APPARATUS, SYSTEMS, AND METHODS FOR LOW POWER COMPUTATIONAL IMAGING

(71) Applicant: Movidius Limited, Schiphol-Rijk (NL)

(72) Inventors: Brendan Barry, Dublin (IE); Richard Richmond, Belfast (GB); Fergal Connor, Dundalk (IE); David Moloney, Dublin (IE)

(73) Assignee: Movidius Limited, Schiphol-Rijk (NL)

( * ) Notice: Subject to any disclaimer, the term of this patent is extended or adjusted under 35 U.S.C. 154(b) by 81 days.

This patent is subject to a terminal disclaimer.

(21) Appl. No.: 17/525,398

(22) Filed: Nov. 12, 2021

(65) Prior Publication Data

US 2022/0179657 A1 Jun. 9, 2022

Related U.S. Application Data

(63) Continuation of application No. 16/719,484, filed on Dec. 18, 2019, now Pat. No. 11,188,343, which is a
(Continued)

(30) Foreign Application Priority Data

Aug. 8, 2013 (GB) .................................. 1314263
Nov. 6, 2013 (RO) .................................. A/00812

(51) Int. Cl.
*G06F 9/38* (2018.01)
*G06F 13/28* (2006.01)
(Continued)

(52) U.S. Cl.
CPC ............ *G06F 9/3867* (2013.01); *G06F 13/28* (2013.01); *G06F 15/8092* (2013.01); *G06T 1/20* (2013.01)

(58) Field of Classification Search
CPC ...... G06F 9/3867; G06F 9/38; G06F 15/8092; G06F 12/0207; G06F 12/06
See application file for complete search history.

(56) References Cited

U.S. PATENT DOCUMENTS 4,281,312 A 7/1981 Knudson
4,626,825 A 12/1986 Wayne et al.
(Continued)

FOREIGN PATENT DOCUMENTS

CA 236584 A 12/1923
CA 1236584 A 5/1988
(Continued)

OTHER PUBLICATIONS

China National Intellectual Property Administration, "Office Action and Search Report," issued in connection with Chinese Application No. 202010104557.5, dated Mar. 29, 2023, 63 pages. [English Translation Included].
(Continued)

*Primary Examiner* — William B Partridge
(74) *Attorney, Agent, or Firm* — HANLEY, FLIGHT & ZIMMERMAN, LLC

(57) ABSTRACT

The present application discloses a computing device that can provide a low-power, highly capable computing platform for computational imaging. The computing device can include one or more processing units, for example one or more vector processors and one or more hardware accelerators, an intelligent memory fabric, a peripheral device, and a power management module. The computing device can communicate with external devices, such as one or more image sensors, an accelerometer, a gyroscope, or any other suitable sensor devices.

18 Claims, 22 Drawing Sheets

Related U.S. Application Data continuation of application No. 15/900,368, filed on Feb. 20, 2018, now Pat. No. 10,521,238, which is a continuation of application No. 14/458,052, filed on Aug. 12, 2014, now Pat. No. 9,910,675, and a continuation-in-part of application No. 14/082,396, filed on Nov. 18, 2013, now Pat. No. 9,934,043, said application No. 14/458,052 is a continuation-in-part of application No. 14/082,396, filed on Nov. 18, 2013, now Pat. No. 9,934,043.

(60) Provisional application No. 62/030,913, filed on Jul. 30, 2014.

(51) Int. Cl.
*G06F 15/80* (2006.01)
*G06T 1/20* (2006.01)

(56) References Cited

U.S. PATENT DOCUMENTS

| | | |
|---|---|---|
| 4,680,730 A | 7/1987 | Omoda |
| 4,783,841 A | 11/1988 | Crayson |
| 4,996,857 A | 3/1991 | Kenichi et al. |
| 5,081,573 A | 1/1992 | Hall |
| 5,155,843 A | 10/1992 | Stamm |
| 5,226,171 A | 7/1993 | Hall |
| 5,262,973 A | 11/1993 | Richardson |
| 5,285,405 A | 2/1994 | Ohki |
| 5,333,296 A | 7/1994 | Bouchard |
| 5,379,356 A | 1/1995 | Purcell |
| 5,434,623 A | 7/1995 | Coleman |
| 5,598,544 A | 1/1997 | Ohshima |
| 5,655,098 A | 8/1997 | Witt |
| 5,689,672 A | 11/1997 | Witt |
| 5,729,714 A | 3/1998 | Dei |
| 5,768,584 A | 6/1998 | MacDonald |
| 5,809,323 A | 9/1998 | Eisen et al. |
| 5,828,873 A | 10/1998 | Lynch |
| 5,835,392 A | 11/1998 | Dulong |
| 5,861,873 A | 1/1999 | Kikinis |
| 5,881,260 A | 3/1999 | Raje |
| 5,968,167 A | 10/1999 | Whittaker |
| 6,104,836 A | 8/2000 | Buckley |
| 6,173,389 B1 | 1/2001 | Pechanek |
| 6,182,100 B1 | 1/2001 | Stanley |
| 6,184,709 B1 | 2/2001 | New |
| 6,240,508 B1 | 5/2001 | Brown, III |
| 6,275,921 B1 | 8/2001 | Iwata |
| 6,304,605 B1 | 10/2001 | Haikonen |
| 6,329,162 B1 | 12/2001 | Han |
| 6,366,999 B1 | 4/2002 | Drabenstott et al. |
| 6,412,063 B1 | 6/2002 | Samra |
| 6,425,070 B1 | 7/2002 | Zou |
| 6,467,036 B1 | 10/2002 | Pechanek |
| 6,480,872 B1 | 11/2002 | Choquette |
| 6,523,110 B1 | 2/2003 | Bright et al. |
| 6,539,470 B1 | 3/2003 | Mahurin |
| 6,577,316 B2 | 6/2003 | Brethour |
| 6,591,019 B1 | 7/2003 | Comair |
| 6,640,299 B1 | 10/2003 | Mang |
| 6,731,294 B1 | 5/2004 | Mang |
| 6,757,019 B1 | 6/2004 | Hsieh |
| 6,760,831 B2 | 7/2004 | Drabenstott |
| 6,813,390 B2 | 11/2004 | Ali |
| 6,839,728 B2 | 1/2005 | Pitsianis |
| 6,851,041 B2 | 2/2005 | Pechanek |
| 6,859,870 B1 | 2/2005 | Kim |
| 6,948,087 B2 | 9/2005 | Brethour |
| 6,954,842 B2 | 10/2005 | Drabenstott |
| 7,010,668 B2 | 3/2006 | Drabenstott |
| 7,019,674 B2 | 3/2006 | Cadambi |
| 7,038,687 B2 | 5/2006 | Booth, Jr |
| 7,124,279 B2 | 10/2006 | Topham |
| 7,146,487 B2 | 12/2006 | Drabenstott |
| 7,167,890 B2 | 1/2007 | Lin |
| 7,196,708 B2 | 3/2007 | Dorojevets |
| 7,343,471 B2 | 3/2008 | Topham |
| 7,366,874 B2 | 4/2008 | Seong |
| 7,376,813 B2 | 5/2008 | Sankaran |
| 7,409,530 B2 | 8/2008 | Kim |
| 7,424,594 B2 | 9/2008 | Pitsianis |
| 7,467,287 B1 | 12/2008 | Bratt et al. |
| 7,623,732 B1 | 11/2009 | Thieret et al. |
| 7,689,639 B2 | 3/2010 | Dent |
| 8,010,781 B2 | 8/2011 | Mauro |
| 8,131,687 B2 | 3/2012 | Bates |
| 8,200,594 B1 | 6/2012 | Bleiweiss |
| 8,615,039 B2 | 12/2013 | Lee |
| 8,713,080 B2 | 4/2014 | Moloney |
| 8,948,270 B2 | 2/2015 | Raveendran |
| 8,990,171 B2 | 3/2015 | Kalach |
| 9,146,747 B2 | 9/2015 | Moloney |
| 9,477,472 B2 | 10/2016 | Macy, Jr |
| 9,727,113 B2* | 8/2017 | Barry ................. G06T 1/20 |
| 9,864,699 B1 | 1/2018 | Xu |
| 9,910,675 B2 | 3/2018 | Barry |
| 9,934,043 B2 | 4/2018 | Moloney |
| 10,360,040 B2 | 7/2019 | Moloney |
| 10,521,238 B2 | 12/2019 | Barry |
| 10,572,252 B2 | 2/2020 | Barry et al. |
| 11,042,382 B2 | 6/2021 | Moloney et al. |
| 2002/0161986 A1 | 10/2002 | Kamigata |
| 2003/0005261 A1 | 1/2003 | Sheaffer |
| 2003/0084388 A1 | 5/2003 | Williamson |
| 2003/0149822 A1 | 8/2003 | Scott |
| 2003/0151608 A1 | 8/2003 | Chung |
| 2003/0154358 A1 | 8/2003 | Seong |
| 2003/0160794 A1 | 8/2003 | Pascual |
| 2004/0054877 A1 | 3/2004 | Macy et al. |
| 2004/0101045 A1 | 5/2004 | Yu |
| 2004/0130927 A1 | 7/2004 | Schulz |
| 2004/0133763 A1* | 7/2004 | Mathur ............ G06F 15/7867 712/34 |
| 2004/0172521 A1 | 9/2004 | Hooker |
| 2004/0260410 A1 | 12/2004 | Sakamoto |
| 2005/0036707 A1 | 2/2005 | Matsuura |
| 2005/0251644 A1 | 11/2005 | Maher |
| 2005/0278502 A1 | 12/2005 | Hundley |
| 2006/0023429 A1 | 2/2006 | Ribeiro |
| 2006/0050591 A1 | 3/2006 | Park |
| 2006/0184709 A1 | 8/2006 | Sukegawa |
| 2007/0030274 A1* | 2/2007 | Woo ................. G09G 5/363 345/501 |
| 2007/0061389 A1 | 3/2007 | Zahid |
| 2007/0186079 A1 | 8/2007 | Sih et al. |
| 2007/0277021 A1 | 11/2007 | O'Connor |
| 2007/0291571 A1 | 12/2007 | Balasundaram |
| 2008/0007562 A1 | 1/2008 | Stuttard |
| 2008/0068389 A1 | 3/2008 | Bakalash |
| 2009/0019257 A1 | 1/2009 | Shen |
| 2009/0049264 A1 | 2/2009 | Resnick |
| 2009/0094430 A1 | 4/2009 | Bergheaud |
| 2009/0187734 A1 | 7/2009 | Mejdrich et al. |
| 2009/0204837 A1 | 8/2009 | Raval |
| 2009/0228683 A1 | 9/2009 | Stuttard |
| 2009/0259708 A1 | 10/2009 | Elmer |
| 2009/0276559 A1 | 11/2009 | Allen, Jr |
| 2009/0319730 A1 | 12/2009 | Tanaka |
| 2010/0165144 A1 | 7/2010 | Lee |
| 2010/0211745 A1* | 8/2010 | Jeddeloh ............ G06F 12/0875 713/340 |
| 2010/0302413 A1 | 12/2010 | Kawashima |
| 2011/0026161 A1 | 2/2011 | Ikeda |
| 2011/0145543 A1 | 6/2011 | Damron |
| 2011/0261061 A1 | 10/2011 | Lees et al. |
| 2011/0264902 A1 | 10/2011 | Hollingworth et al. |
| 2012/0089824 A1 | 4/2012 | Fukagawa |
| 2012/0096445 A1 | 4/2012 | Berg |
| 2012/0110267 A1 | 5/2012 | Karkkainen |
| 2012/0124343 A1 | 5/2012 | Kim |
| 2012/0216019 A1 | 8/2012 | Bower |
| 2012/0293677 A1 | 11/2012 | Ostrovsky |

(56) References Cited

U.S. PATENT DOCUMENTS

| | | |
|---|---|---|
| 2012/0311360 A1 | 12/2012 | Balasubramanian |
| 2012/0314946 A1 | 12/2012 | Nomura |
| 2013/0009980 A1 | 1/2013 | Gu |
| 2013/0116986 A1 | 5/2013 | Zhang |
| 2014/0040909 A1 | 2/2014 | Winser |
| 2014/0169669 A1 | 6/2014 | Yeh |
| 2014/0176569 A1* | 6/2014 | Meixner ............... H05K 13/00 29/592 |
| 2014/0223138 A1 | 8/2014 | Ould-Ahmed-Vall |
| 2014/0223140 A1 | 8/2014 | Ould-Ahmed-Vall |
| 2014/0289498 A1 | 9/2014 | Gonion |
| 2014/0289502 A1 | 9/2014 | Gonion |
| 2014/0298068 A1 | 10/2014 | Kosonocky |
| 2015/0046673 A1 | 2/2015 | Barry |
| 2015/0046674 A1* | 2/2015 | Barry ................... G06F 1/3287 712/7 |
| 2015/0058572 A1 | 2/2015 | Olson |
| 2015/0172539 A1 | 6/2015 | Neglur |
| 2015/0324319 A1* | 11/2015 | Leidel ................. G06F 3/0607 711/148 |
| 2018/0267930 A1 | 9/2018 | Zhu |
| 2018/0349147 A1 | 12/2018 | Moloney |
| 2020/0192666 A1 | 6/2020 | Barry et al. |

FOREIGN PATENT DOCUMENTS

| | | |
|---|---|---|
| CA | 2751097 A1 | 8/2010 |
| CN | 1078841 A | 11/1993 |
| CN | 1282024 A | 1/2001 |
| CN | 1326132 A | 12/2001 |
| CN | 1523491 A | 8/2004 |
| CN | 1620819 A | 5/2005 |
| CN | 1625731 A | 6/2005 |
| CN | 101086680 A | 12/2007 |
| CN | 101268440 A | 9/2008 |
| CN | 101609438 A | 12/2009 |
| CN | 101681258 A | 3/2010 |
| CN | 102007474 A | 4/2011 |
| CN | 102131038 A | 7/2011 |
| CN | 102270112 A | 12/2011 |
| CN | 103189853 A | 7/2013 |
| CN | 107077186 A | 8/2017 |
| CN | 107077186 B | 3/2020 |
| CN | 111240460 A | 6/2020 |
| DE | 2348971 A1 | 5/1974 |
| DE | 69228442 T2 | 9/1999 |
| DE | 69519801 T2 | 6/2001 |
| DE | 69709078 T2 | 10/2002 |
| DE | 102007025948 A1 | 1/2008 |
| EP | 0240032 A2 | 10/1987 |
| EP | 0245027 A2 | 11/1987 |
| EP | 0380854 A2 | 8/1990 |
| EP | 1071010 A2 | 1/2001 |
| EP | 1158401 A2 | 11/2001 |
| EP | 1241892 A1 | 9/2002 |
| EP | 1923793 A2 | 5/2008 |
| EP | 2567312 A1 | 3/2013 |
| EP | 3175320 A1 | 6/2017 |
| EP | 3175355 A2 | 6/2017 |
| EP | 3175320 B1 | 3/2019 |
| EP | 3506053 A1 | 7/2019 |
| EP | 3506053 B1 | 12/2021 |
| EP | 3982234 A2 | 4/2022 |
| EP | 3982234 A3 | 5/2022 |
| ES | 2171919 T3 | 9/2002 |
| FI | 97096 B | 6/1996 |
| FI | 97096 C | 10/1996 |
| FR | 2835934 A1 | 8/2003 |
| GB | 710876 A | 6/1954 |
| GB | 1314263 A | 4/1973 |
| GB | 1488538 A | 10/1977 |
| GB | 2311882 A | 10/1997 |
| GB | 2348971 A | 10/2000 |
| GB | 2362055 A | 11/2001 |
| GB | 2362733 A | 11/2001 |
| GB | 2366643 A | 3/2002 |
| JP | H01243126 A | 9/1989 |
| JP | H0342969 A | 2/1991 |
| JP | H0342969 B2 | 6/1991 |
| JP | H04246745 A | 9/1992 |
| JP | H07200398 A | 8/1995 |
| JP | 3042969 U | 11/1997 |
| JP | H1021074 A | 1/1998 |
| JP | H1049370 A | 2/1998 |
| JP | 2000029704 A | 1/2000 |
| JP | 2000112757 A | 4/2000 |
| JP | 3042969 B2 | 5/2000 |
| JP | 2000305894 A | 11/2000 |
| JP | 2001344195 A | 12/2001 |
| JP | 2002007211 A | 1/2002 |
| JP | 2002510099 A | 4/2002 |
| JP | 2002366350 A | 12/2002 |
| JP | 2002541586 A | 12/2002 |
| JP | 2004013255 A | 1/2004 |
| JP | 2004178056 A | 6/2004 |
| JP | 3956652 B2 | 8/2007 |
| JP | 2007207024 A | 8/2007 |
| JP | 2007526536 A | 9/2007 |
| JP | 2007272357 A | 10/2007 |
| JP | 2008104126 A | 5/2008 |
| JP | 2008277926 A | 11/2008 |
| JP | 2009530753 A | 8/2009 |
| JP | 2010282637 A | 12/2010 |
| JP | 2010282649 A | 12/2010 |
| JP | 2011516971 A | 5/2011 |
| JP | 5000641 B2 | 8/2012 |
| JP | 2012168871 A | 9/2012 |
| JP | 2013251884 A | 12/2013 |
| JP | 2016536692 A | 11/2016 |
| JP | 2017525047 A | 8/2017 |
| JP | 6695320 B2 | 5/2020 |
| JP | 2020129386 A | 8/2020 |
| JP | 7053713 B2 | 4/2022 |
| JP | 2022097484 A | 6/2022 |
| KR | 20020018071 A | 3/2002 |
| KR | 20020088063 A | 11/2002 |
| KR | 20110058410 A | 6/2011 |
| KR | 20120104364 A | 9/2012 |
| KR | 20130024860 A | 3/2013 |
| KR | 20130031258 A | 3/2013 |
| KR | 20170067716 A | 6/2017 |
| KR | 102459716 B1 | 10/2022 |
| KR | 20220148328 A | 11/2022 |
| KR | 102515720 B1 | 3/2023 |
| WO | 9313628 A1 | 7/1993 |
| WO | 9608928 A1 | 3/1996 |
| WO | 9738372 A1 | 10/1997 |
| WO | 9950785 A1 | 10/1999 |
| WO | 9963751 A1 | 12/1999 |
| WO | 0022503 A1 | 4/2000 |
| WO | 0034887 A1 | 6/2000 |
| WO | 0045282 A1 | 8/2000 |
| WO | 0062182 A2 | 10/2000 |
| WO | 0143074 A1 | 6/2001 |
| WO | 0184849 A1 | 11/2001 |
| WO | 0251099 A2 | 6/2002 |
| WO | 02080563 A2 | 10/2002 |
| WO | 03088033 A1 | 10/2003 |
| WO | 2005051099 A1 | 6/2005 |
| WO | 2005091109 A1 | 9/2005 |
| WO | 2006117562 A1 | 11/2006 |
| WO | 2008010634 A1 | 1/2008 |
| WO | 2008087195 A | 7/2008 |
| WO | 2010067522 A1 | 6/2010 |
| WO | 2010086919 A1 | 8/2010 |
| WO | 2015019197 A2 | 2/2015 |
| WO | 2015040450 A1 | 3/2015 |
| WO | 2015084966 A2 | 6/2015 |

(56) References Cited

FOREIGN PATENT DOCUMENTS

| WO | 2016016726 A2 | 2/2016 |
|---|---|---|
| WO | 2016016730 A1 | 2/2016 |

OTHER PUBLICATIONS

Korean Intellectual Property Office," Written Decision on Registration," issued in connection with Korean Patent Application No. 20217040695, dated Apr. 4, 2023, 6 pages. [English Machine Translation Included].

United States Patent and Trademark Office, "Final Office Action," issued in U.S. Appl. No. 18/087,467, dated Jun. 15, 2023, 8 pages.

Korean Intellectual Property Office, "Notice of Preliminary Rejection," issued in connection with Korean Patent Application No. 20227036929, dated Jun. 13, 2023, 6 pages. [English Machine Translation Included].

Japanese Patent Office, "Notice of Reasons for Refusal," issued in connection with Japanese Appl. No. 2019-035945, dated Jan. 23, 2020, 15 pages. [English translation included].

Japanese Patent Office, "Request for a Patent," issued in connection with Japanese Appl. No. 2017-504804, dated Jul. 27, 2015, 4 pages. [English translation included].

United States Patent and Trademark Office, "Final Office Action," issued in connection with U.S. Appl. No. 14/082,396 dated Aug. 18, 2016, 13 pages.

United States Patent and Trademark Office, "Notice of Allowance," mailed in connection with U.S. Appl. No. 14/458,052, dated Oct. 24, 2017, 8 pages.

Japanese Patent Office, "Notice of Reasons for Refusal," issued in connection with Japanese Appl. No. 2016-558274, dated Nov. 17, 2017, 6 pages. [English translation inclued].

Korean Intellectual Property Office, "Notification of Reason for Refusal," issued in connection with Korean Patent Application No. 10-2021-7006168 dated Apr. 19, 2021, 4 pages including partial English translation.

European Patent Office, "Extended European Search Report," mailed in connection with European Patent Application No. 18183679.2, dated Oct. 30, 2018, 6 pages.

The State Intellectual Property Office of People's Republic of China, "First Office Action," issued in connection with China Patent Application No. 201580051186.6, dated Aug. 10, 2018, 14 pages.

United States Patent and Trademark Office, "Non-Final Office Action," issued in connection with U.S. Appl. No. 14/082,396, dated Jun. 15, 2017, 16 Pages.

No Author Listed: "x86 instruction listings, "retrieved from Wikipedia, Apr. 20, 2018, pp. 1-15.

United States Patent and Trademark Office, "Non-Final Office Action," issued in connection with U.S. Appl. No. 15/382,467, dated Apr. 26, 2018, 12 Pages.

European Patent Office, "Communication pursuant to Article 94(3) EPC," issued in connection with European patent appl. No. 18183679. 2-1203, dated Apr. 20, 2022, 4 pages.

European Patent Office, "European Search Report," issued in connection with European patent appl. No. 21212555, dated Mar. 17, 2022, 3 pages.

United States Patent and Trademark Office, "Notice of Allowance," issued in connection with U.S. Appl. No. 14/457,929, dated Feb. 14, 2018, 6 Pages.

United States Patent and Trademark Office, "Notice of Allowance," issued in connection with U.S. Appl. No. 15/382,467, dated Oct. 2, 2019, 7 Pages.

The State Inatellectual Property Office of Peoples's of China, "Notification to Grant Patent Right for Invention," issued in connection with Chinese Patent Application No. 201580051324 dated Dec. 5, 2019, 3 Pages. (Machine Translation Included).

Rosten, E. et al., "Machine learning for high-speed corner detection," Department of Engineering, Cambridge University, UK, 9th European Conference on Computer Vision, Graz, Austria, May 7-13, 2006, pp. 1-14.

The State Intellectual Property Office of People's Republic of China, "Notification to Grant Patent Right for Invention," issued in connection with China Patent Application No. 201580051186.6, dated May 7, 2019, 3 Pages.

Japanese Patent Office, "Notice of Reasons for Rejection," issued in connection with Japanese Patent Application No. 2016532759, dated Mar. 26, 2019, 4 pages.

Japanese Patent Office, "Decision to Grant," issued in connection with Japanese Patent Application No. 2017504804, dated Apr. 6, 2017, 5 pages.

Korean Patent Office,"Request for the Submission of an Opinion" and translation, issued in connection with Korean Patent Application No. 10-2017-7005783, dated Apr. 20, 2022, 7 Pages.

Korean Patent Office, "Written Opinion," issued in connection with Korean Patent Application No. 10-2021-7040695, dated Dec. 26, 2022, 18 pages.

Japanese Patent Office, "Notice of Reasons for Rejection," issued in connection with Japanese Patent Application No. 2020217605, dated Oct. 26, 2021, 12 pages.

Japanese Patent Office, "Notice of Reasons for Refusal," issued in connection with Japanese Appl. No. 2016-532759, Mar. 18, 2019, 4 pages. [English translation included].

Korean Intellectual Property Office "Written Decision on Registration" and translation, mailed in connection with Korean Application No. 10-2022-7021273, dated Dec. 29, 2022, 6 pages.

Japanese Patent Office, "Written Opinion," issued in connection with Japanese Appl. No. 2021-189244, dated Jun. 14, 2022, 4 pages. [English translation included].

Japanese Patent Office, "Written Opinion," issued in connection with Japanese Appl. No. 2016-558274, dated Nov. 28, 2017, 8 pages. [English translation inclued].

The State Intellectual Property Office of People's Republic of China, "Second Office Action," issued in connection with China Patent Application No. 201480045179, dated May 31, 2019, 9 Pages.

Korean Intellectual Property Office, "Notice of Preliminary Rejection," mailed in connection with Korean Patent Application No. 10-2017-7005792, dated Apr. 22, 2019, 7 pages (machine translation provided).

International Searching Authority, "International Search Report and Written Opinion," issued in connection with International Patent Application No. PCT/IB2015/001805, dated May 11, 2016, 16 pages.

Japanese Patent Office, "Decision to Grant a Patent," issued in connection with Japanese Appl. No 2021-189244, dated Jul. 1, 2022, 5 pages. [English translation included].

Japanese Patent Office, "Decision of Refusal," issued in connection with Japanese Patent Application No. 2020217605, dated Apr. 26, 2022, 9 pages.

Japanese Patent Office, "Decision to Grant," issued in connection with Japanese Patent Application No. 2016-532759, dated Jul. 9, 2019, 5 pages. (English Translation).

United States Patent and Trademark Office, "Notice of Allowance," issued in connection with U.S. Appl. No. 15/900,368, dated Aug. 12, 2019, 9 Pages.

Japanese Patent Office, "Written of Opinion" issued in connection with Japanese Patent Application No. 2020217605, dated Jan. 26, 2022, 4 pages.

Intellectual Property of India, "Examination Report," issued in connection with Indian Patent Application No. 201637004756, dated Sep. 21, 2020 (5 pages).

The State Intellectual Prpoerty Office of Korea, "Written Decision on Registration," malled in connection with Korean Patent Application No. 20167005928, dated Nov. 27, 2020, 8 pages (English Translation included).

Japanese Patent Office, "Decision of Refusal," issued in connection with Japanese Appl, No. 2019-035945, Aug. 21, 2020, 8 pages. [English translation included].

ARM, "ARM Architecture Reference Manual," ARMv7-A and ARMv7-R edition, 2734 pages (1996-1998, 2000, 2004-2012).

United States Patent and Trademark Office, "Notice of Allowance," issued in connection with U.S. Appl. No. 14/082,396, dated Nov. 16, 2017, 5 Pages.

(56) References Cited

OTHER PUBLICATIONS

No Author Listed: "Intel 64 and IA-32 Architectures Optimization Reference Manual," Intel, Mar. 2014, 660 pages. (The relevance of this reference is provided by the Korean Office correspondence dated Sep. 9, 2021, which was previously submitted in an IDS dated Jan. 20, 2022, and identified as considered by the Examiner.).
Japanese Patent Office, "Notice of Reasons for Refusal," issued in connection with Japanese Patent Application No. 2022004451, dated Feb. 7, 2023, 6 pages.
Williamson, David, "ARM Cortex A8: A High Performance Processor for Low Power Applications," in Unique Chips and Systems, John and Rubio Eds., CRC Press, pp. 1-23, Published Nov. 15, 2007 (23 pages—entire document).
Japanese Patent Office, "Notification of Determination of Application Number," issued in connection with Japanese Appl. No. 2020-075406, dated Apr. 21, 2020, 2 pages. [English translation included].
European Patent Office, "Communication," issued in connection with European patent appl. No. 22192673.6-1203, dated Dec. 12, 2022, 4 pages.
Japanese Patent Office, "Notice of Reasons for Refusal," issued in connection with Japanese Appl. No. 2016-532759, dated Jul. 17, 2018, 10 pages. [English translation included].
The State Intellectual Property Office of People's Republic of China, "First Office Action," issued in connection with China Patent Application No. 201480045179, dated Jul. 20, 2018, 9 Pages.
The State Inatellectual Property Office of Peoples's of China , "First Office Action," issued in connection with Chinese Patent Application No. 201580051324 dated Jun. 5, 2019, 10 Pages. (Machine Translation Included).
Japanese Patent Office, "Decision to Grant a Patent," issued in connection with Japanese Appl. No. 2016-558274, dated Jun. 18, 2018, 5 pages. [English translation inclued].
Korean Intellectual Property Office, "Request for the Submission of an Opinion," issued in connection with Korean Patent Application No. 10-2021-7040695, dated Oct. 24, 2022, 6 pages including partial English translation.
Korean Patent Office," Written Opinion" and translation, issued in connection with Korean Patent Application No. 10-2017-7005792, dated Apr. 22, 2019, 5 pages.
Korean Patent Office, "Written Decision on Registration" and translation, issued in connection with Korean Patent Application No. 10-2017-7005783, dated Jul. 25, 2022, 4 pages.
United States Patent and Trademark Office, "Notice of Allowance," issued in connection with U.S. Appl. No. 14/457,929, dated Aug. 10, 2016, 12 Pages.
Korean Patent Office, "Written Opinion" and translation, issued in connection with Korean Patent Application No. 10-2017-7005783, dated Apr. 20, 2022, 7 pages.
Buckler et al., "Reconfiguring the Imaging Pipeline for Computer Vision," Aug. 1, 2017, 15 pages.
European Patent Office, "Examination report," issued in connection with European Patent Application No. 14815431.3 dated Mar. 24, 2020, 8 pages.
Japanese Patent Office, "Notice of Reasons for Refusal," issued in connection with Japanese Appl. No. 2021-189244, dated Apr. 26, 2022, 6 pages. [English translation included].
STMicroelectronics, "Variable-Length Encoding (VLE) extension programming interface manual", UM0438 User manual, pp. 1-50, Jul. 2007.
European Patent Office, "Extended European Search Report," issued in connection with European Patent Application No. 19156946.6, dated Jun. 4, 2019, 8 pages.
Japanese Patent Office, "Notice of Reasons for Rejection," issued in connection with Japanese Patent Application No. 2017-504810, dated May 14, 2019, 33 pages.
European Patent Office, "Communication under Rule 71(3) EPC," issued in connection with European patent appl. No. 15797388.4-1916, dated Sep. 25, 2018, 5 pages.

Patent Cooperation Treaty, "International Preliminary Report on Patentability Chapter I," issued in connection with International Patent Application No. PCT/IB2015/001845, dated Feb. 9, 2017, 9 pages.
United States Patent and Trademark Office, "Corrected Notice of Allowability," issued in connection with U.S. Appl. No. 15/900,327, dated Jun. 17, 2019, 2 pages.
Dally et al., "Efficient Embedded Computing," IEEE Computer Society, Jul. 2008, pp. 27-32, 6 pages.
International Searching Authority, "International Preliminary Report on Patentability," issued in connection with PCT No. PCT/IB2015/001845, dated Jul. 29, 2015, 8 pages.
China National Intellectual Property Administration, "Notification to Grant," issued in connection with Chinese Patent Application No. 201480045179.0, dated Dec. 25, 2019, 4 pages (English Translation Included).
European Patent Office, "Communication," issued in connection with European patent appl. No. 19156946.6-1216, dated Jun. 18, 2019, 2 pages.
International Searching Authority, "International Preliminary Report on Patentability Chapter I" mailed in connection with International Patent Application No. PCT/IB2014/002541, dated Feb. 18, 2016, 7 pages.
United States Patent and Trademark Office, Final Office Action, issued in connection with U.S. Appl. No. 15/382,467, dated Sep. 19, 2018, 17 Pages.
Won-Jong Lee et al., "SGRT: A Mobile GPU Architecture for Real-Time Ray Tracing," HPG 2013, vol. 120, Jul. 19, 2013, p. 109, XP055221370, DOI: 10.1145/2492045.2492057.
No Author Listed, "Cortex-A9 NEON Media Processing Engine," Revision r3p0, Technical Reference Manual, 49 pages (2008-2011).
United States Patent and Trademark Office, "Notice of Allowance," mailed in connection with U.S. Appl. No. 14/458,052, dated Aug. 24, 2016, 18 pages.
Nvidia Corporation, "Chimera™; The NVIDIA Computational Photography Architecture", Whitepaper, pp. 1-15, Mar. 2013.
European Patent Office, "European Search Report," issued in connection with European patent appl. No. 19156946, dated May 24, 2019, 3 pages.
European Patent Office, "Communication," issued in connection with European patent appl. No. 21212555.3-1216, dated Apr. 11, 2022, 7 pages.
International Searching Authority, "International Preliminary Report on Patentability", issued in connection with International Application No. PCT/IB2015/001805, dated Jan. 31, 2017 (10 pages).
No Author Listed, "Cortex-A8," Revision r3p2, Technical Reference Manual, 580 pages (2006-2010).
Korean Patent Office, "Written Opinion," issued in connection with Korean Patent Application No. 10-2017-7005783, dated Jun. 17, 2022, 11 pages.
Korean Patent Office, "Request for the Submission of an Opinion" and translation, issued in connection with Korean Patent Application No. 10-2020-7000089, dated Oct. 21, 2020, 5 Pages.
Patent Cooperation Treaty, "International Search Report" issued in connection with International Patent Application No. PCT/IB2015/001845, dated Aug. 1, 2016, 4 pages.
Japanese Patent Office, "Notice of Reasons for Refusal," issued in connection with Japanese Appl. No. 2020-075406, dated Jun. 1, 2021, 8 pages. [English translation included].
Korean Patent Office," Written Opinion," issued in connection with Korean Patent Application No. 10-2021-7006168, dated Aug. 18, 2021, 7 Pages.
Korean Patent Office, "Written Decision on Registration" and translation, issued in connection with Korean Patent Application No. 10-2017-7005792, dated Oct. 1, 2019, 4 pages.
Korean Patent Office," Written Opinion," issued in connection with Korean Patent Application No. 10-2017-7005792, dated Jun. 5, 2019, 8 Pages.
European Patent Office, "Decision to grant a European patent pursuant to Article 97(1) EPC," issued in connection with European patent appl. No. 19156946.6-1216. dated Nov. 11, 2021, 1 page.

(56) References Cited

OTHER PUBLICATIONS

European Patent Office, "European Search Report," issued in connection with European patent appl. No. 18183679, dated Oct. 19, 2018, 3 pages.
Korean Patent Office," Written Opinion," issued in connection with Korean Patent Application No. 10-2020-7000089, dated Feb. 25, 2021, 7 Pages.
United States Patent and Trademark Office, "Notice of Allowance," issued in connection with U.S. Appl. No. 16/444,559, dated May 26, 2021, 2 Pages.
Chinese Patent Office, "First Office Action, "mailed in connection with Chinese Application No. 201910648783.7, dated Nov. 23, 2022, 27 pages. Machine translation included.
Zheng et al., "Architecture Design of a Variable Length Instruction Set VLIW DSP,"Tsinshua Science and Technology, vol. 14, No. 5, Oct. 2009, pp. 561-569, 9 pages.
United States Patent and Trademark Office, "Non-Final Office Action", issued in connection with U.S. Appl. No. 16/797,881, dated Aug. 20, 2021, 8 Pages.
United States Patent and Trademark Office, Notice of Allowance, issued in connection with U.S. Appl. No. 16/797,881, dated Jan. 6, 2023, 2 Pages.
International Searching Authority, "International Preliminary Report On Patentability", issued in connection with International Patent Application No. PCT/IB2014/002541, dated Feb. 9, 2016, 7 pages.
Korean Intellectual Property Office, "Notice of Preliminary Rejection" and translated summary, mailed in connection with Korean Patent Application No. 10-2020-7000089, dated Dec. 21, 2020, 4 pages.
United States Patent and Trademark Office, "Non-Final Office Action," issued in connection with U.S. Appl. No. 17/353,697, dated Mar. 28, 2022, 11 Pages.
United States Patent and Trademark Office, "Non-Final Office Action," issued in connection with U.S. Appl. No. 14/458,014, dated May 20, 2016, 10 Pages.
Korean Intellectual Property Office "Notice of Allowance" and translated summary, mailed in connection with Korean Application No. 10-2020-7000089, dated Feb. 26, 2021,2 pages.
Japanese Patent Office, "Notice of Reasons for Rejection,"mailed in connection with Japanese Patent Application No. 2019-035945, dated Jan. 23, 2020, 15 pages.
Kahle et al., "Introduction to the Cell Multiprocessor," IBM J. Res. Dev., vol. 48, No. 4/5, Jul./Sep. 2005, ages 589-604, 16 pages.
United States Patent and Trademark Office, Notice of Allowance, issued in connection with U.S. Appl. No. 16/797,881, dated Aug. 17, 2022, 9 Pages.
Lin et al., "Synthesis of Concurrent System Interface Modules with Automatic Protocol Coversion Generation," Computer-Aided Design, IEEE Computer Society Press, Los Alamitos, California, Nov. 6, 1994, 8 pages.
United States Patent and Trademark Office, "Notice of Allowance," issued in connection with U.S. Appl. No. 17/353,697, dated Nov. 30, 2022, 3 Pages.
United States Patent and Trademark Office, "Notice of Allowance," issued in connection with U.S. Appl. No. 15/900,327, dated Mar. 11, 2019, 5 pages.
International Searching Authority, "International Search Report and Written Opinion," issued in connection with International Patent Application No. PCT/IB2014/002541, dated Jul. 20, 2015, 14 pages.
Japanese Patent Office, "Decision to Grant a Patent," issued in connection with Japanese Patent Application No. 2019-145645, dated Dec. 7, 2021, 5 pages including partial English translation.
Alexander, "Evolution and Use of the VME Subsystem Bus-VSB," VSB History of VME Subsystem Buses, utterworth & Co., vol. 10, No. 6, Aug. 31, 1986, pp. 307-312, 6 pages.
United States Patent and Trademark Office, Non-Final Rejection, issued in connection with U.S. Appl. No. 14/082,396, dated Mar. 29, 2016, 10 pages.

United States Patent and Trademark Office, Notice of Allowance, issued in connection with U.S. Appl. No. 16/444,559, dated Febuary 18, 2021, 9 pages.
Sharp et al., "Soft Scheduling for Hardware," In. "Pattern Recognition. 5th Asian Conference, ACPR 2019, Auckland, New Zealand, Nov. 26-19, 2019, Revised Selected Papers, Part II," Springer International Publishing, vol. 2126, 16 pages.
United States Patent and Trademark Office, "Notice of Allowance," issued in connection with U.S. Appl. No. 17/353,697, dated Sep. 14, 2022, 6 Pages.
Freescale Semiconductor, Inc., "MSC8256 Reference Manual," Six Core Digital Signal Processor, Rev. 0, Jul. 2011, 1272 pages.
Japanese Patent Office, "Notice of Reasons for Rejection," issued in connection with Japanese Patent Application No. 2019-145645, dated Apr. 13, 2021, 4 pages including partial English translation.
European Patent Office, "Examination Report," issued in connection with European Patent Application No. 14815431.3, on May 10, 2022, 9 pages.
Japanese Patent Office, "Notice of Allowance," mailed in connection with Japanese Patent Application No. 2017-504810, dated Mar. 16, 2020, 4 pages.
Indian Patent Office, "Examination Report," mailed in connection with Indian Patent Application No. 201747002510, dated May 5, 2021, 5 pages.
Korean Intellectual Property Office, "Notice of Allowance of Patent," issued in connection with Korean Patent Application No. 10-2021-7006168, dated Sep. 10, 2021, 4 pages including partial English translation.
Smith, "NVIDIA Announces CUDA 4.0," AnandTech, Feb. 28, 2011, 11 pages.
United States Patent and Trademark Office, "Notice of Allowance," issued in connection with U.S. Appl. No. 16/719,484, dated Sep. 2, 2021, 3 Pages.
Starcore, "SC140 DSP Core Reference Manual," Rev. 3, Nov. 2001, 712 pages.
United States Patent and Trademark Office, "Supplemental Notice of Allowability," issued in connection with U.S. Appl. No. 15/900,327, dated Apr. 17, 2019, 2 pages.
Korean Intellectual Property Office, "Notification of Reason for Refusal," issued in connection with Korean Patent Application No. 10-2021-7040695, dated Apr. 18, 2022, 8 pages including partial English translation.
Freescale Semiconductor, Inc,. "IMX 6Dual/6Quad Applications Processor Reference Manual," Rev. 4, Sep. 2017, 5833 pages.
NVIDIA Corporation, "NVIDIA GPUDirectTM Technology," 2012, 20 pages.
European Patent Office, "Communication pursuant to Article 94(3) EPC," issued in connection with European Patent Application No. 14815431, dated Mar. 14, 2023, 6 pages.
Brazilian National Institute of Industrial Property, "Notice of Allowance" and machine translation, mailed in connection with Brazilian Patent Application No. 1120170011975-2, dated Nov. 30, 2022, 4 pages.
Korean Intellectual Property Office "Notice of Preliminary Rejection" and translation, mailed in connection with Korean Application No. 10-2022-7021273, dated Aug. 20, 2022, 8 pages.
United States Patent and Trademark Office, "Notice of Allowance," issued in connection with U.S. Appl. No. 16/719,484, dated Jul. 16, 2021, 12 Pages.
Japanese Patent Office, "Decision to Grant a Patent," issued in connection with Japanese Appl. No. 2020-075406, dated Mar. 4, 2022, 6 pages. [English translation included].
Japanese Patent Office, "Notice of Reasons for Rejection," issued in connection with Japanese Patent pplication No. 2019-145645, dated Nov. 4, 2020, 8 pages.
United States Patent and Trademark Office, "Non-Final Office Action," issued in connection with U.S. Appl. No. 15/900,327, dated Sep. 27, 2018, 9 Pages.
European Patent Office, "Communication Pursuant to Article 94(3) EPC,"mailed in connection with European Patent Application No. 18183679.2, dated Jul. 3, 2019, 4 pages.

(56) References Cited

OTHER PUBLICATIONS

Japanese Patent Office, "First Search Report and English Translation," issued in connection with Japanese Patent Application No. 2019-145645, dated Sep. 30, 2020 (53 pages).
United States Patent and Trademark Office, "Notice of Allowance," mailed in connection with U.S. Appl. No. 14/458,052, dated Mar. 1, 2017, 7 pages.
European Patent Office, "European Search Report," issued in connection with European patent appl. No. 21192673, dated Nov. 30, 2022, 3 pages.
Pan, Heidi, "High Performance, Variable-Length Instruction Encodings," Department of Electrical Engineering and Computer Science, Massachusetts Institute of Technology, May 24, 2002, pp. 1-53.
Rahman: "Xeon Phi Vector Architecture and Instruction Set,"from Intel Xeon Phi Architecture and Tools, Chapter 3, Sep. 2013, pp. 31-47.
Japanese Patent Office, "Written Opinion," issued in connection with Japanese Appl. No. 2016-532759, dated Jun. 19, 2019, 6 pages. [English translation included].
Brazilian Patent Office, "Office Action" and translation, mailed in connection with Brazil Application No. BR112017001981-7, dated Aug. 31, 2022, 10 pages.
Korean Patent Office, "Written Opinion," issued in connection with Korean Patent Application No. 10-2021-7040695, dated Sep. 14, 2022, 11 pages.
International Searching Authority, "International Search Report and Written Opinion,"mailed in connection with International Patent Application No. PCT/IB2014/003104, dated Jun. 25, 2015, 10 pages.
Korean Patent Office, "Written Opinion," issued in connection with Korean Patent Application No. 10-2022-7021273, dated Nov. 21, 2022, 13 pages.
European Patent Office, "Communication under Rule 71(3) EPC," issued in connection with European patent appl. No. 19156946.6-1216, dated Jun. 17, 2021, 5 pages.
Japanese Patent Office, "Notice of Allowance," mailed in connection with Japanese Patent Application No. 2017-504804, dated Jan. 29, 2019, 6 pages (machine translation provided).
Young, "Code Scheduling Methods for Some Architectural Features in Pipe," Microprocessing and Microprogramming, vol. 22, No. 1, Jan. 1, 1988, pp. 39-63, 15 pages.
Japanese Patent Office, "Decision to grant a patent," issued in connection with Japanese Appl. No. 2016-532759, dated Jun. 28, 2019, 5 pages. [English translation included].
Japanese Patent Office, "First Search Report and English Translation," issued in connection with Japanese Patent Application No. 2016-532759, dated Jul. 18, 2018 (37 pages).
Shute, "MIPS Instruction Coding," Feb. 19, 2009, 4 pages. Retrieved from http://www.cs.sunysb.edu/˜lw/spim/MIPSinstHex.pdf.
Korean Intellectual Property Office, "Notification of Reason for Refusal," issued in connection to Korean Patent Application No. 10-2021-7016084, dated Sep. 9, 2021 (9 pages including partial English translation).
Wikipedia, "Delay Slot,"Jul. 9, 2017, 3 pages. Retrieved from https://en.wikipedia.org/wiki/Delay_slot.
National Intellectual Property Administration of China, "Office Action," mailed in connection with Chinese Patent Application No. 201580051324.0, dated Jun. 5, 2019, 13 pages.
United States Patent and Trademark Office, "Final Office Action", issued in connection with U.S. Appl. No. 16/797,881, dated Feb. 2, 2022, 9 Pages.
Korean Patent Office, "Written Opinion," issued in connection with with Korean Patent Application No. 10-2021-7016084, dated Nov. 9, 2021, 8 Pages.
United States Patent and Trademark Office, "Notice of Allowance," issued in connection with U.S. Appl. No. 14/457,929, dated Sep. 16, 2016, 6 Pages.
European Patent Office, "Communication under Rule71(3)EPC," issued in connection with European Patent Application No. 15801496.9, Feb. 9, 2018, 90 pages.
European Patent Offce, " Communication under Rule 94(3)EPC," issued in connection with European Patent Application No. 14 815 431.3, dated Mar. 24, 2022, 8 Pages.
European Patent Office, "Decision to grant a European patent pursuant to Article 97(1) EPC," issued in connection with European Patent Application No. 15801496.9, Jun. 21, 2018, 2 pages.
United States Patent and Trademark Office, "Notice of Allowance," issued in connection with U.S. Appl. No. 14/082,645, dated May 22, 2015, 9 Pages.
Indian Patent Office, "Examination Report, "mailed in connection with Indian Patent Application No. 201747002615, dated Aug. 26, 2020, 8 pages.
International Searching Authority, "International Search Report and Written Opinion,"mailed in connection with International Patent Application No. PCT/IB2015/001845, dated Jan. 8, 2016, 13 pages.
United States Patent and Trademark Office, "Notice of Allowance," issued in connection with U.S. Appl. No. 14/458,014, dated Dec. 21, 2016, 5 Pages.
United States Patent and Trademark Office, "Notice of Allowance," issued in connection with U.S. Appl. No. 14/458,014, dated Mar. 28, 2017, 5 Pages.
Brazilian National Institute of Industrial Property, "Office Action" and machine translation, mailed in connection with Brazilian Patent Application No. 112017001981-7, dated Aug. 18, 2020, 5 pages.
United States Patent and Trademark Office, Notice of Allowance , issued in connection with U.S. Appl. No. 16/797,881, dated Oct. 27, 2022, 2 Pages.
European Patent Office, "Communication Pursuant to Article 94(3) EPC,"mailed in connection with European Patent Application No. 18183679.2, dated Feb. 9, 2021, 4 pages.
International Searching Authority, "International Search Report and Written Opinion,"mailed in connection with International Patent Application No. PCT/IB2014/003059, dated May 11, 2015, 10 pages.
Korean Intellectual Property Office, "Notice of Allowance"mailed in connection with Korean Application No. 10-2021-7016084, dated Mar. 21, 2022, 3 pages. (Non-English; submitted for the purpose of identifying the references cited on the bottom of p. 1 of the document).

* cited by examiner

APPARATUS, SYSTEMS, AND METHODS FOR LOW POWER COMPUTATIONAL IMAGING

CROSS-REFERENCE TO RELATED APPLICATIONS

This application is a continuation of U.S. patent application Ser. No. 16/719,484, entitled "APPARATUS, SYSTEMS, AND METHODS FOR PROVIDING COMPUTATIONAL IMAGING PIPELINE," filed on Dec. 18, 2019, which is a continuation of U.S. patent application Ser. No. 15/900,368, entitled "APPARATUS, SYSTEMS, AND METHODS FOR PROVIDING COMPUTATIONAL IMAGING PIPELINE," filed on Feb. 20, 2018, which is a continuation of U.S. patent application Ser. No. 14/458,052, entitled "APPARATUS, SYSTEMS, AND METHODS FOR LOW POWER COMPUTATIONAL IMAGING," filed on Aug. 12, 2014. U.S. patent application Ser. No. 14/458,052 claims benefit of the earlier priority date of U.S. Provisional Patent Application No. 62/030,913, entitled "LOW POWER COMPUTATIONAL IMAGING COMPUTING DEVICE," filed Jul. 30, 2014. U.S. patent application Ser. No. 15/900,368, and U.S. patent application Ser. No. 14/458,052 are also continuation-in-part applications of U.S. patent application Ser. No. 14/082,396, entitled "APPARATUS, SYSTEMS, AND METHODS FOR PROVIDING COMPUTATIONAL IMAGING PIPELINE," filed on Nov. 18, 2013. This application, U.S. patent application Ser. No. 16/719,484, U.S. patent application Ser. No. 15/900,368, U.S. patent application Ser. No. 14/458,052, and U.S. patent application Ser. No. 14/082,396 all claim priority to the Romanian Patent Application OSIM Registratura A/00812, entitled "APPARATUS, SYSTEMS, AND METHODS FOR PROVIDING CONFIGURABLE AND COMPOSABLE COMPUTATIONAL IMAGING PIPELINE," filed on Nov. 6, 2013, and to the U.K. Patent Application No. GB1314263.3, entitled "CONFIGURABLE AND COMPOSABLE COMPUTATIONAL IMAGING PIPELINE," filed on Aug. 8, 2013. Each one of the applications is hereby incorporated by reference herein in its entirety.

FIELD OF THE APPLICATION

This present application relates generally to providing a low power computational imaging computing device.

BACKGROUND

Computational imaging is a new imaging paradigm that is capable of providing unprecedented user-experience and information based on images and videos. For example, computational imaging can process images and/or videos to provide a depth map of a scene, provide a panoramic view of a scene, extract faces from images and/or videos, extract text, features, and metadata from images and/or videos, and even provide automated visual awareness capabilities based on object and scene recognition features.

While computational imaging can provide interesting capabilities, it has not been widely adopted. The slow adoption of computational imaging can be attributed to the fact that computational imaging comes with fundamental data processing challenges. Oftentimes, image resolution and video frame rates are high. Therefore, computational imaging generally requires hundreds of gigaflops of computational resources, which may be difficult to obtain using regular computer processors, especially where that performance has to be sustainable and backed up by high memory bandwidth at low power dissipation. Furthermore, computational imaging is generally sensitive to latency. Because users are unlikely to wait several minutes for a camera to recognize an object, computational imaging cameras are generally designed to process images and videos quickly, which further burdens the computational requirement of computational imaging.

Unfortunately, it is difficult to implement computational imaging techniques in customized hardware. As the field of computational imaging is in its relative infancy, implementation techniques are in constant flux. Therefore, it is difficult to customize computational imaging entirely in hardware as changes to implementation techniques would require redesigning the entire hardware. Accordingly, it is generally desirable to provide a flexible hardware architecture and a flexible hardware infrastructure.

At the same time, the demand for such video and image processing is coming to a large extent from portable electronic devices, for example tablet computers and mobile devices, where power consumption is a key consideration. As a result, there is a general need for a flexible computational imaging infrastructure that can operate even under a constrained power budget.

SUMMARY

In accordance with the disclosed subject matter, systems and methods are provided for providing low power computational imaging.

Disclosed subject matter includes a computing device. The computing device can include a plurality of vector processors, wherein one of the plurality of vector processors is configured to execute an instruction that operates on a first array of values. The computing device can also include a hardware accelerator configured to perform a filtering operation on a second array of values. The computing device can also include a memory fabric comprising a plurality of memory slices and an interconnect system having a first interface and a second interface, wherein the first interface is configured to couple the plurality of vector processors to the plurality of memory slices and wherein the second interface is configured to couple the hardware accelerator to the plurality of memory slices. In addition, the computing device can include a host processor configured to cause the memory fabric to provide the first array of values to the one of the plurality of vector processors via the first interface and to provide the second array of values to the hardware accelerator via the second interface, thereby enabling the one of the plurality of vector processors to process the first array of values in accordance with the instruction and enabling the hardware accelerator to process the second array of values in accordance with the filtering operation.

In some embodiments, the computing device can include a plurality of power islands each comprising at least one power domain, wherein a first of the plurality of power islands is coupled to a first supply voltage to provide the first supply voltage to one of the plurality of vector processors, and wherein a second of the plurality of power islands is coupled to a second supply voltage to provide the second supply voltage to the hardware accelerator.

In some embodiments, the computing device can include a power management module configured to provide an enable signal to a switch that couples the first of the plurality of power islands to the first supply voltage, thereby placing the one of the plurality of vector processors into an active mode.

In some embodiments, the one of the plurality of vector processors can comprise a logic circuit region for processing the first array of values and local memory for storing at least a subset of the first array of values, and the power management module can be configured to cause the first supply voltage to be provided to the logic circuit region and to cause a third supply voltage to be provided to the local memory to control a power consumption of the logic circuit region and the local memory independently.

In some embodiments, the power management module can be configured to turn off the switch to disconnect the first of the plurality of power islands from the first supply voltage, thereby placing the one of the plurality of vector processors into a low-power mode.

In some embodiments, the power management module can comprise a valid signal generator configured to generate a valid signal, indicating a time instance at which circuit blocks in the first of the plurality of power islands are ready to process input data, wherein the valid signal generator comprises a daisy chain of switches that provides the first supply voltage to the circuit blocks in the first of the plurality of power islands.

In some embodiments, the computing device can include a peripheral device coupled to a plurality of input/output (I/O) pins, wherein the peripheral device is configured to provide a communication channel between at least one of the plurality of vector processors and an external device.

In some embodiments, the peripheral device can be within a power island that is always powered on.

In some embodiments, the peripheral device can be configured to monitor signals from the external device to detect an event to which one of the plurality of vector processors should respond to, and when the peripheral device detects the event, cause the power management module to place the one of the plurality of vector processors into the active mode.

In some embodiments, the peripheral device can comprise an emulation module that is configured to cause the peripheral device to emulate a functionality of a plurality of standard protocol interfaces via a common set of the I/O pins.

In some embodiments, the peripheral device can be coupled to a differential pair of I/O pins, and the peripheral device is configured to change a polarity of the differential pair based on a polarity control signal.

In some embodiments, the differential pair of I/O pins can comprise a differential pair of Mobile Industry Processor Interface (MIPI) lanes.

In some embodiments, the peripheral device can comprise a bypass buffer that is configured to perform a bypass between an input I/O pin and an output I/O pin, thereby providing a communication channel between the input I/O pin and the output I/O pin without placing the one of the vector processors in an active mode.

Disclosed subject matter includes a method. The method can include providing a memory fabric comprising a plurality of memory slices and an interconnect system having a first interface and a second interface. The method can also include coupling, using the first interface, the plurality of memory slices and a plurality of vector processors, and coupling, using the second interface, the plurality of memory slices and a hardware accelerator. The method can further include providing, by the memory fabric, a first array of values to one of the plurality of vector processors via the first interface and providing a second array of values to the hardware accelerator via the second interface, executing, at the one of a plurality of vector processors, an instruction that operates on the first array of values, and performing, by the hardware accelerator, a filtering operation on the second array of values.

In some embodiments, the method can include providing a first supply voltage to one of the plurality of vector processors, and providing a second supply voltage to the hardware accelerator, wherein the one of the plurality of vector processors and the hardware accelerator are associated with a first power island and a second power island, respectively.

In some embodiments, the method can include providing, by a power management module, an enable signal to a switch that couples the first power island to the first supply voltage, thereby placing the one of the plurality of vector processors into an active mode.

In some embodiments, the method can include generating a valid signal, indicating a time instance at which circuit blocks in the first power island are ready to process input data, using a daisy chain of switches that provides the first supply voltage to the circuit blocks in the one of the plurality of vector processors.

In some embodiments, the method can include providing a peripheral device coupled to a plurality of input/output (I/O) pins, wherein the peripheral device is associated with a power island that is always powered on.

In some embodiments, the method can include monitoring signals from an external device to detect an event to which the one of the plurality of vector processors should respond to, and causing the power management module to place the one of the plurality of vector processors into the active mode.

In some embodiments, the method can include emulating, by the peripheral device, a functionality of a plurality of standard protocol interfaces via a common set of the I/O pins.

In some embodiments, the peripheral device is coupled to a differential pair of I/O pins, and the method further comprises changing a polarity of the differential pair based on a polarity control signal.

In some embodiments, the method can include performing a bypass between an input I/O pin and an output I/O pin using a bypass buffer, thereby providing a communication channel between the input I/O pin and the output I/O pin without placing the one of the vector processors in an active mode.

Disclosed subject matter includes an electronic device. The electronic device can include a plurality of vector processors, wherein one of the plurality of vector processors is configured to execute an instruction that operates on a first array of values. The electronic device can also include a hardware accelerator comprising a programmable datapath pipeline that is programmed using configuration information received from a software module, wherein the programmable datapath pipeline is configured to perform a filtering operation on a second array of values in accordance with the configuration information. The electronic device can also include a memory fabric comprising a plurality of memory slices. The electronic device can further include a host processor configured to cause the memory fabric to provide the first array of values to the one of the plurality of vector processors and to provide the second array of values to the hardware accelerator, thereby enabling the one of the plurality of vector processors to process the first array of values in accordance with the instruction and enabling the hardware accelerator to process the second array of values in accordance with the configuration information.

In some embodiments, the hardware accelerator can include an output buffer for receiving a scan-line of an image processed by the programmable datapath pipeline, and a pipeline stall controller configured to stall an operation of the programmable datapath pipeline when the output buffer is full.

In some embodiments, the hardware accelerator can include a plurality of functional units that are chained together to perform the filtering operation.

In some embodiments, an order in which the plurality of functional units is chained together is determined using the configuration information received from the software module.

In some embodiments, an output of a first of the plurality of functional units is provided to a buffer in a memory fabric, and an input of a second of the plurality of functional units is received from the buffer.

In some embodiments, the hardware accelerator can include a depth map client that is configured to receive depth information that is indicative of a depth of an object represented by a pixel in the scan-line of the image.

In some embodiments, the hardware accelerator can include a depth map module that is configured to process the depth information to match a resolution of the depth information to a resolution of the scan-line of the image.

In some embodiments, the depth map module is configured to time-synchronize the depth information to the scan-line of the image.

In some embodiments, the memory fabric can include a mutual-exclusion (mutex) controller that is configured to monitor a status of an exclusive access request requesting an exclusive access to a shared resource by one of the vector processors, and when the one of the vector processors receives an exclusive access to the shared resource, send an acknowledgement message to the one of the vector processors, indicating that the one of the vector processors has the exclusive access to the shared resource.

In some embodiments, the memory fabric can include a plurality of buffers, wherein a first of the plurality of buffers is associated with a first of the vector processors, and wherein a second of the vector processors is configured to send data to the first of the vector processor by storing the data in the first of the plurality of buffers.

In some embodiments, the memory fabric can be configured to dynamically modify a capacity of the first of the plurality of buffers based on an amount of data transferred to the first of the vector processors.

In some embodiments, the memory fabric can be configured to dynamically associate two or more of the plurality of buffers to the first of the vector processors based on an amount of data transferred to the first of the vector processors.

In some embodiments, the plurality of buffers can be a part of one of the plurality of memory slices in the memory fabric.

In some embodiments, the memory fabric can be configured to store state information of one of the vector processors when the one of the vector processors enters a low-power mode.

In some embodiments, the state information is stored in a static random access memory in the memory fabric.

In some embodiments, the memory fabric can include a direct memory access (DMA) controller, wherein the DMA controller comprises an operation list indicating an order in which DMA operations are to be performed.

In some embodiments, the DMA controller can be configured to perform a subset of the DMA operations in the operation list based on an enable buffer, wherein the enable buffer includes a plurality of bits, wherein one of the plurality of bits is associated with one of the DMA operations, and a value of the one of the plurality of bits is indicative of whether the one of the DMA operations is to be performed by the DMA controller.

Disclosed subject matter includes a method. The method can include providing, by a memory fabric comprising a plurality of memory slices, a first array of values to one of a plurality of vector processors. The method can also include providing, by the memory fabric, a second array of values to a hardware accelerator comprising a programmable datapath pipeline, executing, by one of the plurality of vector processors, an instruction that operates on the first array of values, configuring the datapath pipeline in the hardware accelerator using configuration information, and performing, using the datapath pipeline in the hardware accelerator, a filtering operation on the second array of values in accordance with the configuration information.

In some embodiments, the method can include receiving, at an output buffer, a scan-line of an image processed by the programmable datapath pipeline; and stalling, by a pipeline stall controller, an operation of the programmable datapath pipeline when the output buffer is full.

In some embodiments, the hardware accelerator comprises a plurality of functional units, and the method includes chaining the plurality of functional units in accordance with the configuration information to perform the filtering operation.

In some embodiments, the plurality of functional units comprises a first functional unit and a second functional unit, and wherein chaining the plurality of functional units comprises an output of the first functional unit to an input of the second functional unit.

In some embodiments, the method can include receiving depth information that is indicative of a depth of an object represented by a pixel in the scan-line of the image; and synchronizing the depth information to the scan-line of the image.

In some embodiments, the method can include monitoring, by a memory controller in the memory fabric, a status of an exclusive access request requesting an exclusive access to a shared resource by one of the vector processors, and when the one of the vector processors receives an exclusive access to the shared resource, sending an acknowledgement message to the one of the vector processors, indicating that the one of the vector processors has the exclusive access to the shared resource.

In some embodiments, the memory fabric can include a plurality of buffers, wherein a first of the plurality of buffers is associated with a first of the vector processors, and the method further comprises sending, by a second of the vector processors, data to the first of the vector processor by storing the data in the first of the plurality of buffers.

In some embodiments, the method can include dynamically modifying a capacity of the first of the plurality of buffers based on an amount of data transferred to the first of the vector processors.

In some embodiments, the method can include dynamically associating two or more of the plurality of buffers to the first of the vector processors based on an amount of data transferred to the first of the vector processors.

In some embodiments, the method can include storing state information of one of the vector processors in the memory fabric when the one of the vector processors enters a low-power mode.

In some embodiments, the state information is stored in a static random access memory in the memory fabric.

In some embodiments, the method can include maintaining, at a direct memory access (DMA) controller, an operation list indicating an order in which DMA operations are to be performed.

In some embodiments, the method can include performing a subset of the DMA operations in the operation list based on an enable buffer, wherein the enable buffer includes a plurality of bits, wherein one of the plurality of bits is associated with one of the DMA operations, and a value of the one of the plurality of bits is indicative of whether the one of the DMA operations is to be performed by the DMA controller.

DESCRIPTION OF DRAWINGS

Various objects, features, and advantages of the disclosed subject matter can be more fully appreciated with reference to the following detailed description of the disclosed subject matter when considered in connection with the following drawings, in which like reference numerals identify like elements. The accompanying figures are schematic and are not intended to be drawn to scale. For purposes of clarity, not every component is labeled in every figure. Nor is every component of each embodiment of the disclosed subject matter shown where illustration is not necessary to allow those of ordinary skill in the art to understand the disclosed subject matter.

DETAILED DESCRIPTION

In the following description, numerous specific details are set forth regarding the systems and methods of the disclosed subject matter and the environment in which such systems and methods may operate, etc., in order to provide a thorough understanding of the disclosed subject matter. It will be apparent to one skilled in the art, however, that the disclosed subject matter may be practiced without such specific details, and that certain features, which are well known in the art, are not described in detail in order to avoid complication of the disclosed subject matter. In addition, it will be understood that the examples provided below are exemplary, and that it is contemplated that there are other systems and methods that are within the scope of the disclosed subject matter.

Computational imaging can transform the ways in which machines capture and interact with the physical world. For example, via computational imaging, machines can capture images that were extremely difficult to capture using traditional imaging techniques. As another example, via computational imaging, machines can understand their surroundings and react in accordance with their surroundings.

One of the challenges in bringing computational imaging to a mass market is that computational imaging is inherently computationally expensive. Computational imaging often uses a large number of images at a high resolution and/or a large number of videos with a high frame rate. Therefore, computational imaging often needs the support of powerful computing platforms. Furthermore, because computational imaging is often used in mobile settings, for example, using a smart phone or a tablet computer, computational imaging often needs the support of powerful computing platforms that can operate at a low power budget.

Figure 1:
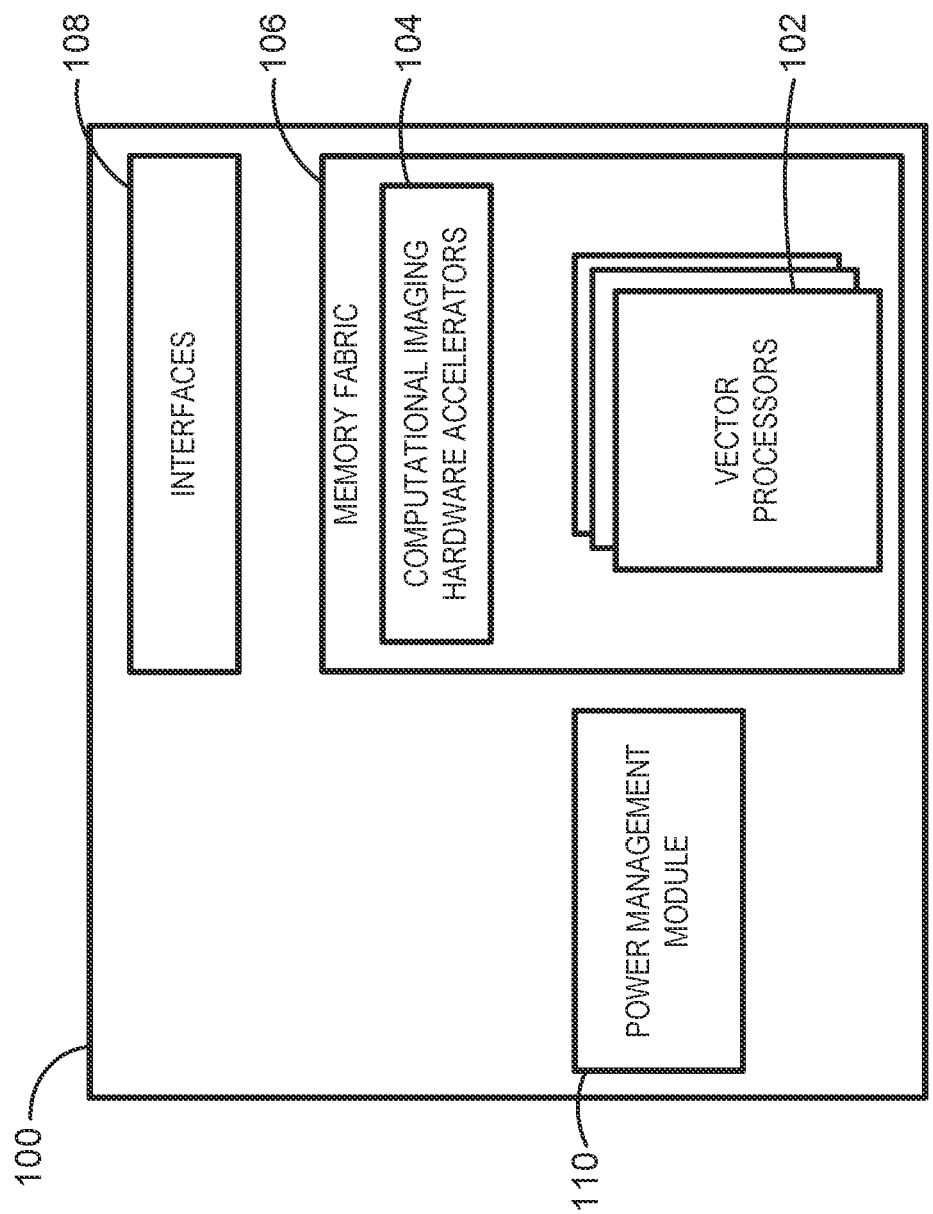
FIG. 1 provides a high level illustration of a computing device in accordance with some embodiments.

The present application discloses a computing device that can provide a low-power, highly capable computing platform for computational imaging. FIG. 1 provides a high level illustration of a computing device in accordance with some embodiments. The computing device 100 can include one or more processing units, for example one or more vector processors 102 and one or more hardware accelerators 104, an intelligent memory fabric 106, a peripheral device 108, and a power management module 110.

The one or more vector processors 102 includes a central processing unit (CPU) that implements an instruction set containing instructions that operate on an array of data called vectors. More particularly, the one or more vector processors 102 can be configured to perform generic arithmetic operations on a large volume of data simultaneously. In some embodiments, the one or more vector processors 102 can include a single instruction multiple data, very long instruction word (SIMD-VLIW) processor. In some embodiments, the one or more vector processors 102 can be designed to execute instructions associated with computer vision and imaging applications.

The one or more hardware accelerators 104 includes computer hardware that performs some functions faster than is possible in software running on a more general-purpose CPU. Examples of a hardware accelerator in non-vision applications include a blitting acceleration module in graphics processing units (GPUs) that is configured to combine several bitmaps into one using a raster operator.

In some embodiments, the one or more hardware accelerators 104 can provide a configurable infrastructure that is tailored to image processing and computer vision applications. The hardware accelerators 104 can be considered to include generic wrapper hardware for accelerating image processing and computer vision operations surrounding an application-specific computational core. For example, a hardware accelerator 104 can include a dedicated filtering module for performing image filtering operations. The filtering module can be configured to operate a customized filter kernel across an image in an efficient manner. In some embodiments, the hardware accelerator 104 can output one fully computed output pixel per clock cycle.

The intelligent memory fabric 106 can be configured to provide a low power memory system with small latency. Because images and videos include a large amount of data, providing a high-speed interface between memory and processing units is important. In some embodiments, the intelligent memory fabric 106 can include, for example, 64 blocks of memory, each of which can include a 64-bit interface. In such embodiments, the memory fabric 106 operating at 600 MHz, for example, is capable of transferring data at 307.2 GB/sec. In other embodiments, the intelligent memory fabric 106 can include any other number of blocks of memory, each of which can include any number of interfaces implementing one or more interface protocols.

The peripheral device 108 can be configured to provide a communication channel for sending and receiving data bits to and from external devices, such as an image sensor and an accelerometer. The peripheral device 108 can provide a communication mechanism for the vector processors 102, the hardware accelerators 104, and the memory fabric 106 to communicate with external devices.

The power management module 110 can be configured to control activities of designated blocks within the computing device 100. More particularly, the power management module 110 can be configured to control the power supply voltage of designated blocks, also referred to as power islands, within the computing device 100. For example, when the power management module 110 enables a power supply of a power island, the computing device 100 can be triggered to provide an appropriate power supply voltage to the power island. In some embodiments, each power island can include an independent power domain. Therefore, the power supply of power islands can be controlled independently. In some embodiments, the power management module 110 can also be configured to control activities of power islands externally attached to the computing device 100 via one or more of input/output pins in the computing device 100.

Figure 2:
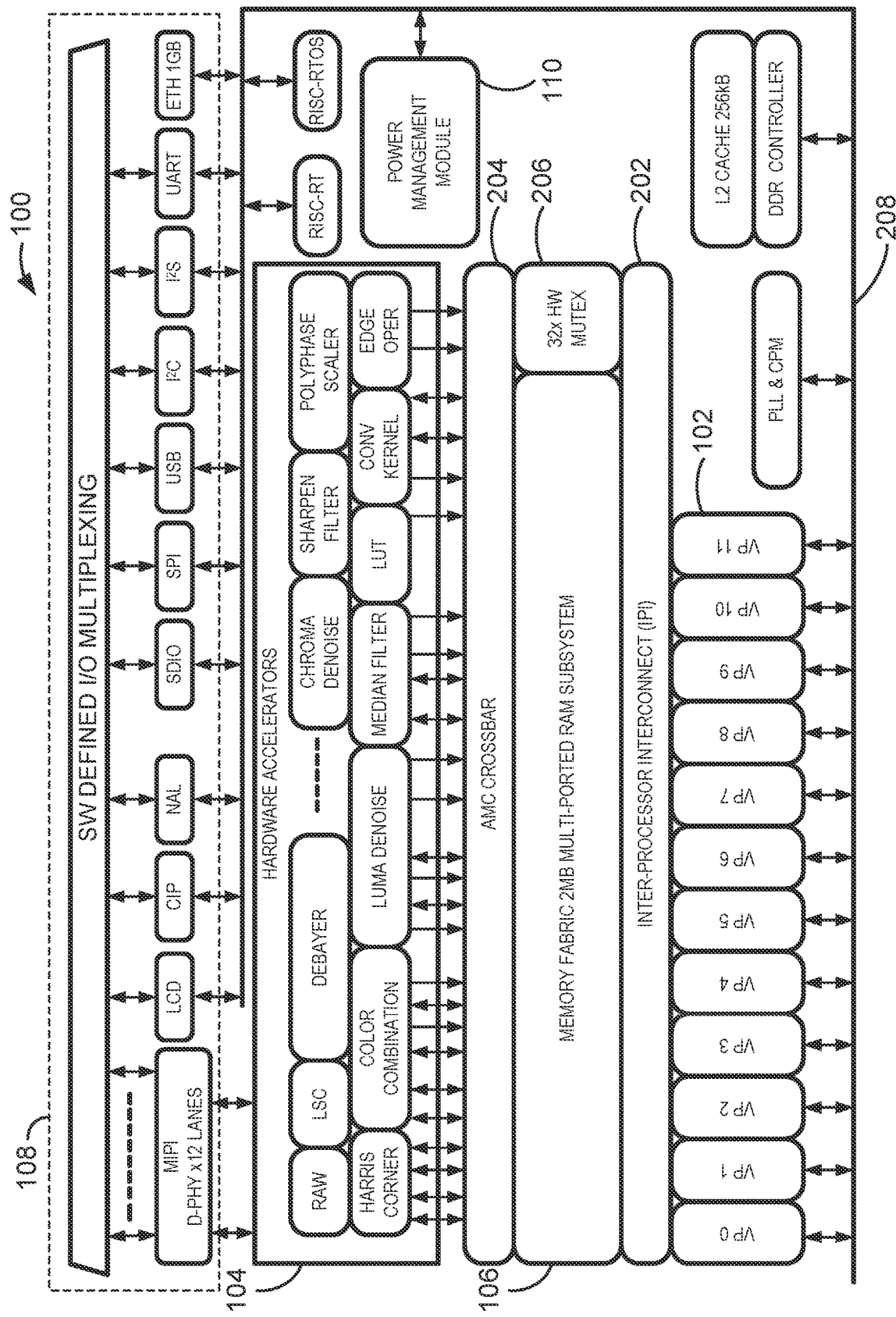
FIG. 2 illustrates a detailed illustration of a computing device in accordance with some embodiments.

FIG. 2 illustrates a detailed illustration of a computing device in accordance with some embodiments. The computing device 100 can include a plurality of vector processors 102. In this illustration, the computing device 100 includes 12 vector processors 102. The vector processors 102 can communicate with one another via the inter-processor interconnect (IPI) 202. The vector processors 102 can also communicate with other components in the computing device 100, including the memory fabric 106 and/or hardware accelerators 104, via the IPI 202 and the Accelerator Memory Controller (AMC) crossbar 204 or a memory-mapped processor bus 208.

In some embodiments, the one or more vector processors 102 can be designed to execute a proprietary instruction set. The proprietary instruction set can include a proprietary instruction. The proprietary instruction can be a variable length binary string that includes an instruction header and one or more unit instructions. The instruction header can include information on the instruction length and the active units for the associated proprietary instruction; the unit instruction can be a variable length binary string that includes a number of fields that are either fixed or variable. The fields in the unit instruction can include an opcode that identifies the instruction and an operand that specifies the value use in the unit instruction execution.

Details of the vector processors 102 are provided in U.S. patent application No. TBD, entitled "VECTOR PROCESSOR," filed on an even date herewith, which is herein incorporated by reference in its entirety.

The computing device 100 can include hardware accelerators 104. The hardware accelerators 104 can include a variety of accelerator modules that are configured to perform predefined processing functions. In some embodiments, a predefined processing function can include a filtering operation. For example, the hardware accelerators 104 can include a raw image processing module, a lens shading correction (LSC) module, a bayer pattern demosaicing module, a sharpen filter module, a polyphase scaler module, a Harris corner detection module, a color combination module, a luma channel denoise module, a chroma channel denoise module, a median filter module, a look-up table, a convolution module, an edge detection module, and/or any other suitable module or combination of modules. The hardware accelerators 104 can be configured to retrieve and store data in memory devices residing in the memory fabric 106.

The memory fabric 106 can include a central memory system that coordinates memory operations within the computing device 100. The memory fabric 106 can be designed to reduce unnecessary data transfer between processing units, such as vector processors 102 and hardware accelerators 104. The memory fabric 106 is constructed to allow a plurality of processing units to access, in parallel, data and program code memory without stalling. Additionally, the memory fabric 106 can make provision for a host processor to access the memory system in the memory fabric 106 via a parallel bus such as the Advanced eXtensible Interface (AXI) or any other suitable bus 208.

In some embodiments, a processing unit can read/write up to 128-bits per cycle through its load-store unit (LSU) ports and read up to 128 bit program code per cycle through its instruction port. In addition to IPI 202 and AMC 204 interfaces for processors 102 and hardware accelerators 104, respectively, the memory fabric 106 can provide simultaneous read/write access to a memory system through the Advanced Microcontroller Bus Architecture (AMBA) High-performance Bus (AHB) and AXI bus interfaces. The AHB and AXI are standard parallel interface buses which allow processing units, a memory system, and a peripheral device to be connected using a shared bus infrastructure. Any other suitable buses can be used. In some embodiments, the memory fabric 106 can be configured to handle a peak of 18×128-bit memory accesses per clock cycle. In other embodiments, the memory fabric 106 can be designed to handle any number of memory accesses per clock cycle using a high-speed interface with a large number of bits.

A memory system in the memory fabric 106 can include a plurality of memory slices, each memory slice being associated with one of the vector processors 102 and giving preferential access to that processor over other vector processors 102. Each memory slice can include a plurality of Random Access Memory (RAM) tiles, where each RAM tile can include a read port and a write port. In some cases, each memory slice may be provided with a memory slice controller for providing access to a related memory slice.

The processors and the RAM tiles can be coupled to one another via a bus, also referred to as an IPI 202. In some cases, the IPI 202 can couple any of the vector processors 202 with any of the memory slices in the memory fabric 106. Suitably, each RAM tile can include a tile control logic block for granting access to the tile. The tile control logic block is sometimes referred to as tile control logic or an arbitration block.

In some embodiments, each memory slice can include a plurality of RAM tiles or physical RAM blocks. For instance, a memory slice having the size of 128 kB can include four 32 kB single-ported RAM tiles (e.g., physical RAM elements) organized as 4 k×32-bit words. As another instance, a memory slice having a size of 256 kB can include eight 32 kB single-ported RAM tiles (e.g., physical RAM elements) organized as 8 k×32-bit words. In some embodiments, the memory slice can have a capacity as low as 16 kB and as high as 16 MB. In other embodiments, the memory slice can be configured to have as much capacity as needed to accommodate a variety of applications handled by the computing device.

In some embodiments, a RAM tile can include a single ported complementary metal-oxide-semiconductor (CMOS) RAM. The advantage of a single ported CMOS RAM is that it is generally available in most semiconductor processes. In other embodiments, a RAM tile can include a multi-ported CMOS RAM. In some embodiments, each RAM tile can be 16-bit wide, 32-bit wide, 64-bit wide, 128-bit wide, or can be as wide as needed by the particular application of the computing device.

The use of single-ported memory devices can increase the power and area efficiency of the memory subsystem but can limit the bandwidth of the memory system. In some embodiments, the memory fabric 106 can be designed to allow these memory devices to behave as a virtual multi-ported memory subsystem capable of servicing multiple simultaneous read and write requests from multiple sources (processors and hardware blocks). This can be achieved by using multiple physical RAM instances and providing arbitrated access to them to service multiple sources.

In some embodiments, each RAM tile can be associated with tile control logic. The tile control logic is configured to receive requests from vector processors 102 or hardware accelerators 104 and provide access to individual read and write-ports of the associated RAM tile. For example, when a vector processor 102 is ready to access data in a RAM tile, before the vector processor 102 sends the memory data request to the RAM tile directly, the vector processor 102 can send a memory access request to the tile control logic associated with the RAM tile. The memory access request can include a memory address of data requested by the processing element. Subsequently, the tile control logic can analyze the memory access request and determine whether the vector processor 102 can access the requested RAM tile. If the vector processor 102 can access the requested RAM tile, the tile control logic can send an access grant message to the vector processor 102, and subsequently, the vector processor 102 can send a memory data request to the RAM tile.

In some embodiments, the tile control logic can be configured to determine and enforce an order in which many processing units (e.g., vector processors and hardware accelerators) access the same RAM tile. For example, the tile control logic can include a clash detector, which is configured to detect an instance at which two or more processing units attempt to access a RAM tile simultaneously. The clash detector can be configured to report to a runtime scheduler that an access clash has occurred and that the access clash should be resolved.

The memory fabric 106 can also include a memory bus for transferring data bits from memory to vector processors 102 or hardware accelerators 104, or from vector processors 102 or hardware accelerators 104 to memory. The memory fabric 106 can also include a direct memory access (DMA) controller that coordinates the data transfer amongst vector processors 102, hardware accelerators 104, and memory.

In some embodiments, the hardware accelerators 104 can be coupled to the memory fabric 106 via a separate bus. The separate bus can include an accelerator memory controller (AMC) 204, which is configured to receive requests from at least one hardware accelerator and to grant, to the hardware accelerator, an access to a memory slice through the related memory slice controller. It will thus be appreciated that the memory access path employed by the hardware accelerators 104 can be different to the path employed by the vector processors 102. In effect, the AMC 204 can perform address filtering, arbitration and multiplexing. In some embodiments, the hardware accelerators 104 can include an internal buffer (e.g., a FIFO memory) to account for delays in accessing the memory fabric 106.

In some embodiments, the AMC 204 may be coupled to one or more peripheral devices 108, including, for example, a plurality of Mobile Industry Processor Interface (MIPI) camera interfaces. The AMC 204 can also be connected to AXI and APB interfaces to allow two system RISC processors to access memory slices in the memory fabric 106 via the AMC 204.

In some embodiments, the AMC 204 can include a pair of 64 bit ports into each memory slice of the memory fabric 106. The AMC 204 can be configured to route requests from a hardware accelerator 104 to an appropriate memory slice by partial address decode.

In some embodiments, the AMC 204 can be coupled to a wide variety of processing units to provide access to memory slices in the memory fabric 106. For example, the AMC 204 may be coupled to any type of hardware accelerators or 3rd party elements to provide access to memory slices in the memory fabric 106. The AMC 204 may also be configured to provide access to a wider memory space of a computing system, including memory devices that lie outside of the computing device 100.

In some embodiments, the AMC 204 can arbitrate simultaneous memory access requests to the same memory slice in a round-robin manner. For example, a processing unit, such as a hardware accelerator 104, can send, to the AMC 204, a memory access request, which includes a memory address. When the AMC 204 receives the memory access request, the AMC 204 determines whether the memory address in the memory access request is associated with a memory slice in the memory fabric 106. If the memory address in the memory access request is not associated with a memory slice in the memory fabric 106, then the AMC 204 can forward the memory request to the AMC's AXI master.

If the memory address in the memory access request is associated with a memory slice in the memory fabric 106, the AMC 204 can arbitrate the memory access request to provide access to the desired memory location.

The peripheral device 108 can be configured to provide a communication channel for sending and receiving data bits to and from external devices, such as multiple heterogeneous image sensors and an accelerometer. The peripheral device 108 can provide a communication mechanism for the vector processors 102, the hardware accelerators 104, and the memory fabric 106 to communicate with external devices.

Traditionally, the functionality of a peripheral device has been fixed and hard-coded. For example, mobile industry processor interface (MIPI) peripherals were only able to interface with an external device that also implements lower-rate digital interfaces such as the SPI, I2C, I2S, or any other suitable standards.

However, in some embodiments of the present disclosure, the functionality of the peripheral device 108 may be defined using software. More particularly, the peripheral device 108 can include an emulation module that is capable of emulating the functionality of standardized interface protocols, such as SPI, I2C, I2S, or any other suitable protocol.

The power management module 110 is configured to control activities of blocks within the computing device 100. More particularly, the power management module 110 is configured to control the power supply voltage of designated blocks, also referred to as power islands. For example, when the power management module 110 enables a power supply of a power island, the computing device 100 is configured to provide an appropriate power supply voltage to the power island. The power management module 110 can be configured to enable a power supply of a power island by applying an enable signal in a register or on a signal line on a bus. In some embodiments, the power management module 110 can also be configured to control activities of external device via one or more of input/output pins in the computing device 100.

In some embodiments, a power island can be always powered-on (e.g., the power supply voltage is always provided to the power island.) Such a power island can be referred to as an always-on power island. In some embodiments, the always-on power-island can be used to monitor signals from, for example, General-Purpose-Input-Output (GPIO) pins, external interfaces, and/or internal functional blocks such as a low frequency timer or power-on reset. This way, the computing device 100 can respond to an event or a sequence of events and adaptively power-up only the power-islands that are needed to respond to the event or the sequence of events.

Figure 3:
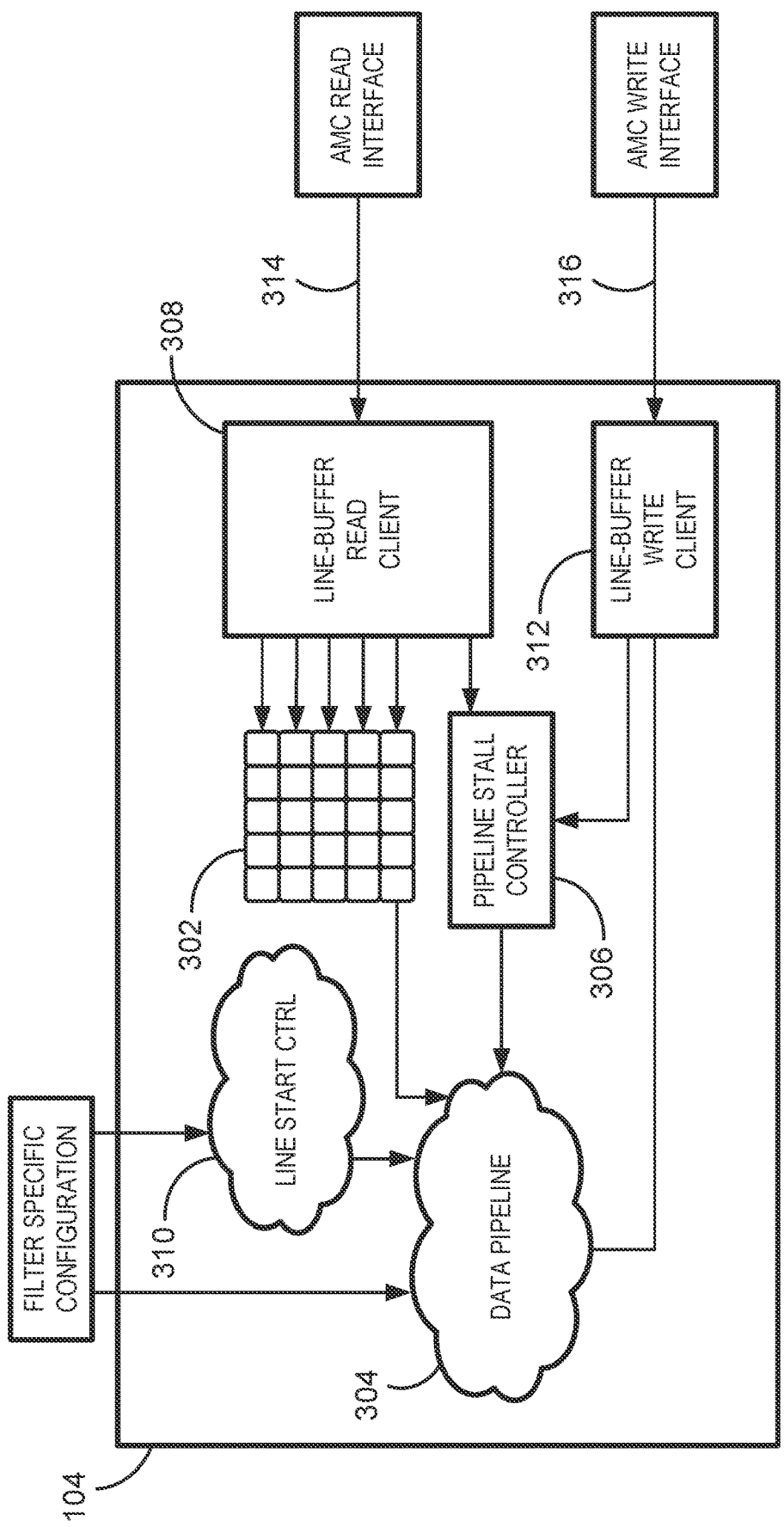
FIG. 3 illustrates a hardware accelerator in accordance with some embodiments.

FIG. 3 illustrates a hardware accelerator in accordance with some embodiments. The hardware accelerator 104 can include a collection of hardware image processing filters. The hardware accelerator 104 can enable some of the computationally intensive functionalities to be offloaded from the vector processors 102. The accelerator 104 can be coupled to the AMC 204 to access memory slices in the memory fabric 106 at a high bandwidth.

In some embodiments, the hardware accelerator 104 can be coupled to the memory fabric 106 via the AMC 204. In some embodiments, the hardware accelerator 104 can include one or more filter modules (e.g., 20 filter modules), including a MIPI receiver filter and a MIPI transmitter filter. In some embodiments, a filter module may include one read-only AMC interface (a read client interface) and one write-only AMC interface (a write client interface). In other embodiments, a filter module can also have a plurality of read-only AMC interfaces. For example, a filter module may have a plurality of read-only AMC interfaces for a parallel access to multiple input buffers, multiple planes (from the same buffer). The plurality of read-only AMC interface can be used to provide an extra memory read bandwidth to sustain the filter module's processing throughput. The descriptions of a hardware accelerator 104 can be equally applicable to each filter module since a hardware accelerator 104 may only have a single filter module. Likewise, the descriptions of a filter module can be equally applicable to a hardware accelerator since the filter module may be the only filter module in the hardware accelerator.

In some embodiments, the AMC 204 has one or more bi-directional (e.g., read/write) ports into each memory slice in the memory fabric 106. The ports can accommodate a large number of bits. For example, the ports can accommodate a 64-bit communication. In some embodiments, the AMC 204 can also include an AXI master, which provides a direct connectivity to external DRAM devices.

In some embodiments, a filter module can be designed primarily to process buffers in the memory fabric 106. For example, with the exception of a MIPI receiver module and a MIPI transmitter filter module, a filter module can input and output data only via its AMC clients. The configuration of filter modules, including their buffer base addresses, can be achieved via several APB slave interfaces.

In some embodiments, the hardware accelerator 104 can receive image data via a MIPI receiver filter module and a MIPI transmitter filter module. The MIPI receiver filter module and the MIPI transmitter filter module can allow other filter modules in the hardware accelerator 104 to establish a direct connection to a MIPI receiver controller and a MIPI transceiver controller. The MIPI receiver filter module and the MIPI transmitter filter module can connect to the MIPI controllers via parallel interfaces and can be used to stream data into/out of the memory fabric 106 directly from/to the MIPI Controller.

In some embodiments, the hardware accelerator 106 can operate on scan-lines of image data buffered in the memory fabric 106, accessed via the AMC 204. The AMC 204 can route transactions from its client interfaces to the target memory slice (or the AXI master) and arbitrate between simultaneous transactions from different clients at each memory slice. In some embodiments, multiple filter modules in the hardware accelerator 106 may be connected together in a streaming fashion by coupling an output buffer of one or more filter modules (also referred to as producers/parents) to input buffers of other filter modules (also referred to as consumers/children).

In some embodiments, a filter module in a hardware accelerator 104 can operate a 2-dimensional kernel on pixels centered at the current pixel. All the pixels in the kernel can contribute in processing pixels centered at the current pixel.

In some embodiments, a filter module in a hardware accelerator 104 can process an image line-by-line. For example, a filter module can scan an image from the top to bottom to generate a scan-line of an image, and process the scan-lines, for instance, moving from left to right. In other examples, a filter module can generate scan-lines of an image by scanning an image in any orientation/ordering suitable for the filter processing.

In some embodiments, a filter module can process a scan-line of an image by reading data to form a kernel for a first pixel on the scan-line. The filter module can process the scan-line by sliding the kernel in a sliding-window manner.

Once the processing is complete, the filter module can write the output pixels into an output buffer or a memory location.

In some embodiments, kernels for filtering are typically square and often have an odd number of pixels along each side, e.g. 3×3, 5×5, or 7×7. If a filter module uses a K×K pixel kernel, then K scan-lines of image data can be read from an input buffer for each line of image data processed and written to the its output buffer.

In some embodiments, the hardware accelerator 104 can use a circular input buffer. Suppose that a target filter module is configured to receive, as input, an output scan-line of another filter module (also referred to as a parent filter module). Suppose also that the target filter module uses a K×K pixel kernel. Then the input buffer for the target filter module can be designed to maintain at least (K+1) scan-lines of image data: K scan-lines for the filter module and one (or more) scan-line for simultaneously receiving an output scan-line of the parent filter module. In this example, because the input buffer is circular, after receiving (K+1) scan-lines from the parent filter module, the (K+2)th scan-line can be written over the location of the first line. In most cases, the parent filter module can be ahead of the target filter module in terms of its current line number within the input image. After the initial configuration, the filter modules' read and write AMC clients can take care of circular buffer address wrapping when accessing the filter modules' input and output buffers.

In some embodiments, buffers in the hardware accelerator 104 can be aligned by a predetermined number of bytes. For example, buffers in the hardware accelerator 104 can be aligned on 8-byte boundaries. To ease the transaction routing, the read and write clients and the AMC can be configured to provide only aligned buffer accesses. When an image width is not a multiple of a predetermined number of bytes, then the hardware accelerator 104 can be configured to write null bytes to output buffers between the (unaligned) end of each scan-line and the next byte boundary.

FIG. 3 illustrates an implementation of a hardware accelerator for operating a filter kernel, stored in a filter kernel register 302, on an input data stream (e.g., scan-lines of one or more images). The input data streams can correspond to pixels in one or more images. The hardware accelerator 104 can include a datapath pipeline 304, a pipeline stall controller 306, a line buffer read client 308, a line start control input 310, and a line buffer write client 310. In some embodiments, a hardware accelerator 104 can include at least one AMC read client interface 314 and/or at least one AMC write client interface 316 to access a memory slice in the memory fabric 106. The number of read/write client interfaces on the AMC 204 is suitably configurable.

In some embodiments, the filter kernel register 302 can be programmed to modify the kernel to be operated on the input data stream. The filter kernel register 302 can be configured to accommodate a variety of kernel sizes. For example, the filter kernel register 302 can be configured to accommodate a 3×3 kernel, a 5×5 kernel, a 7×7 kernel, a 9×9 kernel, or any other kernel sizes represented as m×n. In some cases, m can be the same as n; in other cases, m can be different from n. In some embodiments, the filter kernel register 302 can be configured to accommodate kernels of various dimensions. For example, the filter kernel register 302 can be configured to accommodate a one-dimensional filter, a two-dimensional filter, a three-dimensional filter, or any integer-dimensional filters.

In some embodiments, the line buffer read client 308 is configured to receive a scan-line of an image (e.g., a row or a column of an image on an image grid) and to provide the scan-line to the datapath pipeline 304. The line buffer read client 308 can receive the scan-line of an image via an AMC read interface 314. Once the datapath pipeline 304 receives a kernel and a scan-line of an image, the datapath pipeline 304 can perform the filtering operation. Once the datapath pipeline 304 completes the filtering operation, the datapath pipeline 304 can store the resulting line in the line-buffer write client 312. The line buffer write client 312 can, optionally, store the resulting line in a memory slice via an AMC write interface 316. The pipeline stall controller 306 can stall certain parts of the pipeline to ensure that the line-buffer write client 312 does not overflow.

In some embodiments, the line start controller 310 can control a time instance at which the datapath pipeline 304 starts processing the received scan-line of an image. The line start controller 310 can also be configured to selectively enable one or more portions of the datapath pipeline 304 to perform customized operations. In some cases, the line start controller 310 can also control coefficients to be used during the filtering operation by the datapath pipeline 304.

In some embodiments, the datapath pipeline 304 and the line start controller 310 can be programmable. The datapath pipeline 304 and the line start controller 310 can be programmed so that different types of filtering operations can be performed by the hardware accelerator 104. For example, the datapath pipeline 304 and the line start controller 310 can be programmed with filter operation parameters, such as coefficient sets and/or thresholds, so that customized filtering operation can be carried out by the hardware accelerator 104. The filter operation parameters can also include a filter kernel size, coefficients, scaling ratios, gains, thresholds, look-up tables, or any other suitable parameters. Therefore, the hardware accelerator 104 can be considered as a generic wrapper for accommodating various image filtering operations.

In some embodiments, the datapath pipeline 304 can be configured to process numbers represented in one or more number formats. For example, the datapath pipeline 304 can be designed to operate on floating point numbers, e.g., fp16 (IEEE754-like 16-bit floating-point format), integer numbers, fixed-point numbers, or any other number formats suitable for image processing.

The hardware accelerator 104 can be configured to control how the datapath pipeline 304 consumes scan-lines from an input data buffer 308 and how the datapath pipeline 304 stores processed scan-lines to an output data buffer 312. The hardware accelerator 104 can be configured to implement one of two control modes: the buffer fill control (BFC) mode and the synchronous mode.

In some embodiments, under BFC mode, the hardware accelerator 104 can be configured to maintain internal counts of fill levels (e.g., the number of scan-lines stored in the input buffer). The hardware accelerator 104 can be configured to process a scan-line from its input buffer autonomously when (1) the hardware accelerator is enabled, (2) its input buffer has sufficient number of scan-lines, and (3) there is space in its output buffer to store a processed scan-line. In some cases, the buffer fill level needed to run the datapath pipeline 304 can depend on the height of a kernel. For example, when a kernel is 3×3, then the hardware accelerator 104 can require at least three scan-lines to operate a filter.

In some embodiments, under a synchronous control mode, a filter module in a hardware accelerator can be configured to run when a start bit for the filter module is turned on. The start bit can be turned on using, for example, a software module. Under synchronous control, the software module can be configured to determine that the input buffer for the filter module has a sufficient number of scan-lines and that the output buffer for the filter module has sufficient space to store processed scan-lines from the filter module. Once these conditions are satisfied, the software module can turn on the start bit of the filter module.

Under both modes, once a filter module processes a scan-line, the filter module can update its current line index within its buffer and within the input image. In some embodiments, when the output image does not have the same size as the input image, the filter module can update its current line index in the output image as well. The values of the line indices (and buffer fill levels for buffer fill control) can represent the internal state of a filter module. This internal state can be accessed by a software module and may be saved, updated, and restored such that the context of the filter module may be switched before the filter module is run in the next cycle.

In some embodiments, buffers in a hardware accelerator 104 can be configured to maintain a plurality of data planes. For example, buffers in a hardware accelerator 104 can be configured to maintain the red-channel, the green-channel, and the blue-channel of an image in separate planes. In some examples, the buffers in a hardware accelerator 104 can be configured to support up to sixteen planes. The scan-lines of an image data in each plane can be stored contiguously and planes can be defined by their number and by a plane stride.

In some embodiments, a filter module in a hardware accelerator 104 can be configured to process a scan-line from each data plane sequentially, one at a time. For sequential processing, from the control point of view, scan-lines from all planes may be considered to have the same time stamp. In other embodiments, a filter module in a hardware accelerator 104 can be configured to process multiple data planes in parallel.

In some embodiments, prior to processing an image/video stream, or if context is switched, a filter module can be appropriately configured and enabled. Each filter module can include a set of software programmable registers defining its input buffer(s) and output buffer configuration.

In some embodiments, a buffer in a filter module can be programmed using one or more of following parameters:
  base: Base address. This parameter can specify the base address of the buffer. Addresses can be aligned on byte boundaries (e.g., the width of the AMC client data bus).
  nl: Number of scan-lines. In circular buffer mode, this parameter can specify the size of a circular buffer in scan-lines. The maximum number of scan-lines for a circular buffer can be 1023, but other upper bounds are also possible. If a buffer is configured with nl=0, it indicates that the buffer is in a non-circular mode. Therefore, nl=0 puts the read/write client(s) accessing the buffer into non-circular or no-wrap mode in which the number of scan-lines in the buffer corresponds to the height of the image and no circular buffer pointer wrapping occurs.
  ls: Line stride. The line stride can be a multiple of a fixed number of bytes, for example, 8 bytes. The maximum line stride can be predetermined. For example, the maximum line stride can be (32 MB−8) bytes. The line stride and number of lines can be used by read/write clients to perform circular buffer pointer arithmetic. The line stride can be greater than or equal to the image width.
  np: Number of planes. This parameter indicates a number of planes represented by a buffer. When np=0, it indicates that the buffer represents non-planar data (e.g., a single plane data). The amount of line buffer storage in a buffer can be multiplied by the number of planes.
  ps: Plane stride. The plane stride can be a multiple of a fixed number of bytes, for example, 8 bytes. The maximum plane stride can be predetermined. For example, the maximum plane stride can be (32 MB−8) bytes. Normally, the plane stride can be greater than or equal to nl multiplied by ls. However, other plane stride can be possible.
  format: Buffer data format. This parameter can specify the size of the pixel data in bytes. For example, for an FP16 buffer, the format can be set to 2, indicating 2 bytes per pixel.

In some embodiments, an output buffer in a filter module can be programmed using one or more of following parameters:
  offset: The offset can specify the offset from the base address (and the start of each line) to the first pixel. This parameter may be used to work-around the limitation of buffers being aligned on a byte boundary. Using the offset, a space may be reserved on the left of scan-lines, for example for horizontal pixel padding by an output buffer's consumer. The default offset is zero. If a non-zero offset is specified, then the null bytes can be written to each output scan-line before the first output pixel.

In some embodiments, a filter module may support a variety of data types. The most common data types supported by a filter module are listed below:
  U8—unsigned 8 bit integer data
  U8F—unsigned 8 bit fractional data the range [0, 1.0]
  U16—unsigned 16 bit integer data
  U32—unsigned 32 bit integer data
  FP16—half-precision (16 bit) floating point
  FP32—full-precision (32 bit) floating point In some embodiments, the datapath pipeline of a filter module can be optimized for its operation: half-precision floating point (FP16) arithmetic can used for operations involving a high dynamic range; optimized fixed-point arithmetic can be used where maintaining high precision is more important.

In some embodiments, a filter module implemented using a FP16 arithmetic may not be restricted to reading/writing only to FP16 buffers. U8F buffers may also be accessed with conversion to/from FP16 taking place automatically within the filter modules.

In some embodiments, where a filter module is implemented using FP16 arithmetic, the buffers may be either FP16 or U8F. When a buffer is FP16, the buffer configuration format can be set to 2. If a buffer is U8F, the buffer configuration format can be set to 1. For filter modules with FP16 datapath pipeline, if the input buffer format is "1." the read client can convert the U8F input data to FP16 automatically before processing. If the output buffer format is "1," the write client can convert FP16 from the datapath pipeline to U8F before storage.

In some embodiments, U8F is converted to normalized FP16, in the range [0, 1.0], by multiplying by 1.0/255. Normalized FP16 can be converted to U8F by multiplying by 255 and rounding, effectively quantizing the floating-point values into 8 bits. In some embodiments, the output data from filter modules with FP16 datapath pipeline may optionally be clamped into the normalized range [0, 1.0]. If conversion to U8F is enabled, then the clamp to the normalized range is implicitly enabled and is performed prior to the conversion to U8F described above. Filter modules implemented using FP16 datapath pipelines are not limited to processing data in the normalized range [0, 1.0]; the full range of FP16 can also be supported.

In some embodiments, a filter module is configured to track its vertical position in an input image. A filter module can use this information to perform vertical padding at the top and bottom of the image by line replication or reflection. A filter module that does not perform vertical padding may create an output image that is smaller than an input image, which may not be desirable in some cases.

In some embodiments, when a filter module is configured to perform vertical padding, the minimum number of scan-lines M that can be maintained by an input buffer can be:

$$M=(K>>1)+1, \text{ where } >> \text{ indicates a right bit-shift operator.}$$

At the top of the image, when the capacity of the input buffer (in terms of scan-lines) is less than M, there are not enough scan-lines in the buffer to perform the filtering operation. When the capacity of the input buffer (in terms of scan-lines) is greater than or equal to M, data may be processed if vertical padding is performed. Similarly, at the bottom of the image, when processing the last (K>>1) lines, the filter module can perform the replication of line N−1 (or reflection of line N−1 and the lines above it).

In some embodiments, vertical padding can be performed when the kernel has an even dimension. Vertical padding for a kernel with an even dimension can be virtually identical to vertical padding for a kernel with an odd dimension, except that one less line should be padded at the bottom.

In some embodiments, a filter module can perform a horizontal padding. The horizontal padding of a pixel kernel can be performed as data is read from the input buffer and written to the pixel kernel registers. The filter module can be aware of its position on the current line and at the start and end of a line. Therefore, valid pixel kernel registers can be replicated into those which do not hold valid data. As with vertical padding, whether horizontal padding is performed or not can depend on the specific functionality and requirements of a given filter module.

In some embodiments, in a circular buffer mode, a filter module can be configured to process one scan-line from its input buffer and write the processed scan-line to its output buffer. This set of operation can be referred to as a filter run.

In some embodiments, for flexibility, two different control mechanisms can be provided by which filter runs may be controlled. In the first mechanism, called buffer fill control mode, a filter module can track the fill levels of its circular buffers and determine, on its own, whether it can run. This approach is asynchronous in nature; the filter module can run, possibly repeatedly, as long as the required conditions are met. Control bits in registers are provided to allow software to inform the filter modules when a scan-line has been added to an input buffer or removed from an output buffer. When a scan-line is added to an input buffer, the fill level can be increased; when a scan-line is removed from an output buffer, the fill level can be decreased. In this mode, a filter module, together with its input and output buffers, may be viewed as a first-in-first-out (FIFO) with scan-lines occupying its entries and the depth of the FIFO configured by the number of scan-lines programmed for the input and output buffers.

In some embodiments, another filter module may add a scan-line to the FIFO if the filter module's input buffer is not full. Software can check the fill level of an input buffer before allowing another filter module to add a scan-line to the input buffer. Subsequently, the software or a filter module can increase a fill level associated with the input buffer. On the output side, the software can check the fill level of the output buffer, or respond to an interrupt event signifying that a filter module has added a new scan-line to its output buffer, before decrementing the output buffer's fill level (e.g. after a line in the filter's output buffer has been processed by another filter, like reading the FIFO).

The second mechanism, called a synchronous mode, depends on software to explicitly schedule each filter run. Start bits for each filter module can be provided in registers to which software may write to start a filter run immediately. When started by this mechanism, a filter module can be executed exactly once.

In some embodiments, a filter module can be interrupted when it receives an interrupt request. In some cases, a filter module can have a plurality of interrupt request sources which are mapped to external interrupt request lines and routed an interrupt controller. When a filter module flags an interrupt and that interrupt is enabled, then the corresponding external interrupt request line can be flagged.

In some embodiments, the plurality of interrupt request sources can include:
  Input buffer fill level decrement interrupt
  Output buffer fill level increment interrupt
  Frame done interrupt The output buffer fill level increment interrupt may also be deemed to indicate that a filter module has finished its filter run when the filter module is configured to operate in synchronous mode.

In some embodiments, the hardware accelerator 104 can adapt the filtering operation based on depth information. For example, the hardware accelerator 104 can be configured to conditionally blur only the pixels associated with objects that are further than 30 yards away or pixels that are beyond 5 yards could be blurred less than those beyond 10 yards, etc.

Figure 4:
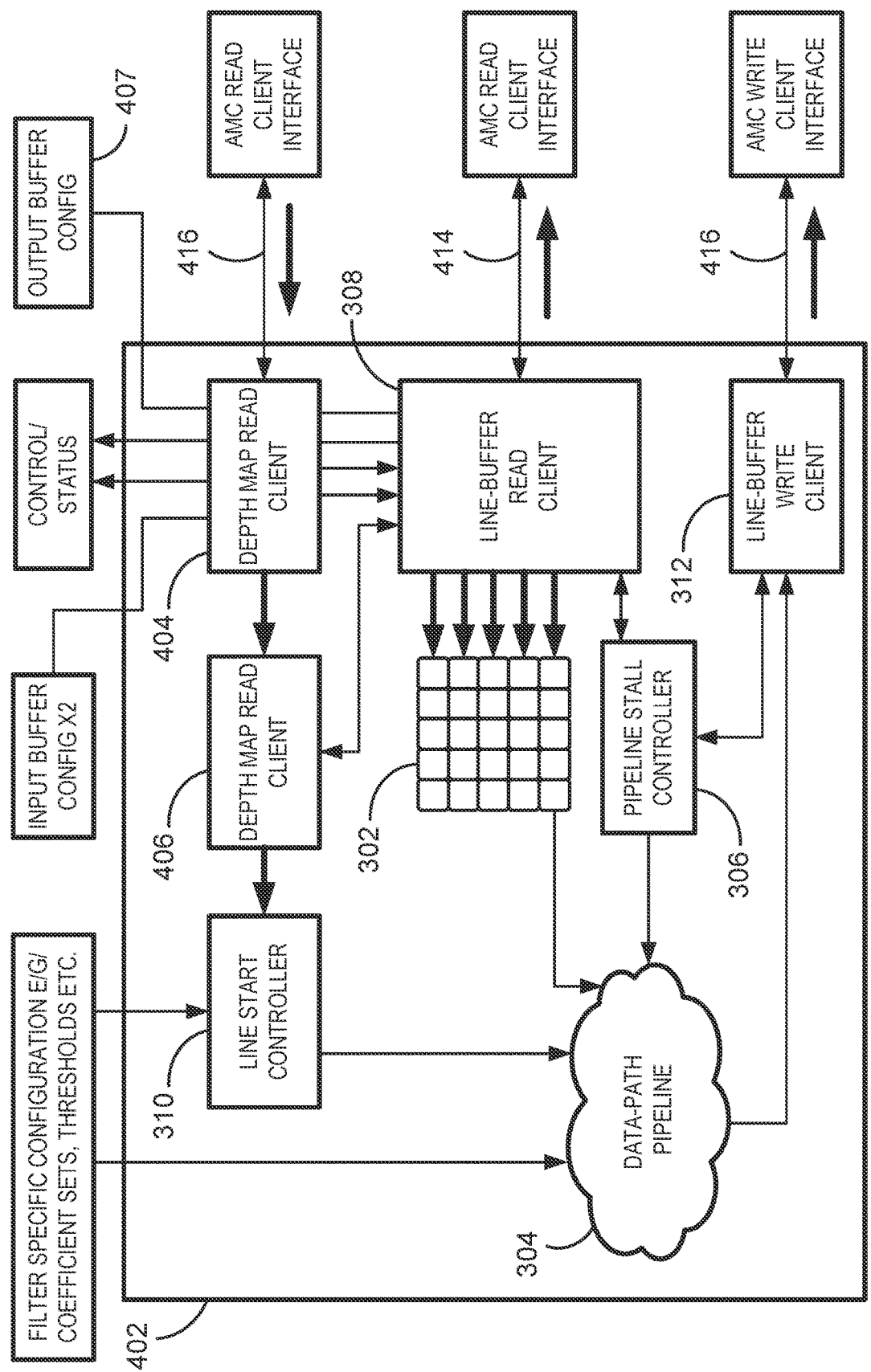
FIG. 4 illustrates a hardware accelerator that can adapt a filtering operation based on depth information in accordance with some embodiments.

FIG. 4 illustrates a hardware accelerator that can adapt a filtering operation based on depth information in accordance with some embodiments. The depth-aware hardware accelerator 402 includes, in addition to modules in the hardware accelerator 104 in FIG. 3, a depth map read client 404 and a depth map module 406. The depth map read client 404 is configured to receive a depth map that indicates a depth of an object represented by a pixel in the corresponding image. For example, when the line buffer read client 308 receives a scan-line of an image, the depth map read client 404 can be configured to receive a depth map corresponding to the scan-line of the image.

Subsequently, the depth map read client 404 can provide the depth map to the depth map module 406. When the resolution of the depth map is lower than the resolution of a scan-line of an image, the depth map module 406 can be configured to up-sample the depth map to match the resolution of the depth map to the resolution of the scan-line. When the depth map is not time-synchronized with a scan-line of an image, the depth map module 406 can be configured to synchronize the depth map and the scan-line. The depth map module 406 can subsequently provide the processed depth map to the line start controller 310 so that the line start controller 310 can control the operation of the datapath pipeline 304. More generally, an arithmetic function can be applied conditionally either based on comparison of the depth at a pixel location to one or more thresholds using a comparator, or alternately, directly using a binary control bit associated with each pixel which can be applied in place of the comparator output using a bypass multiplexer.

Figure 5:
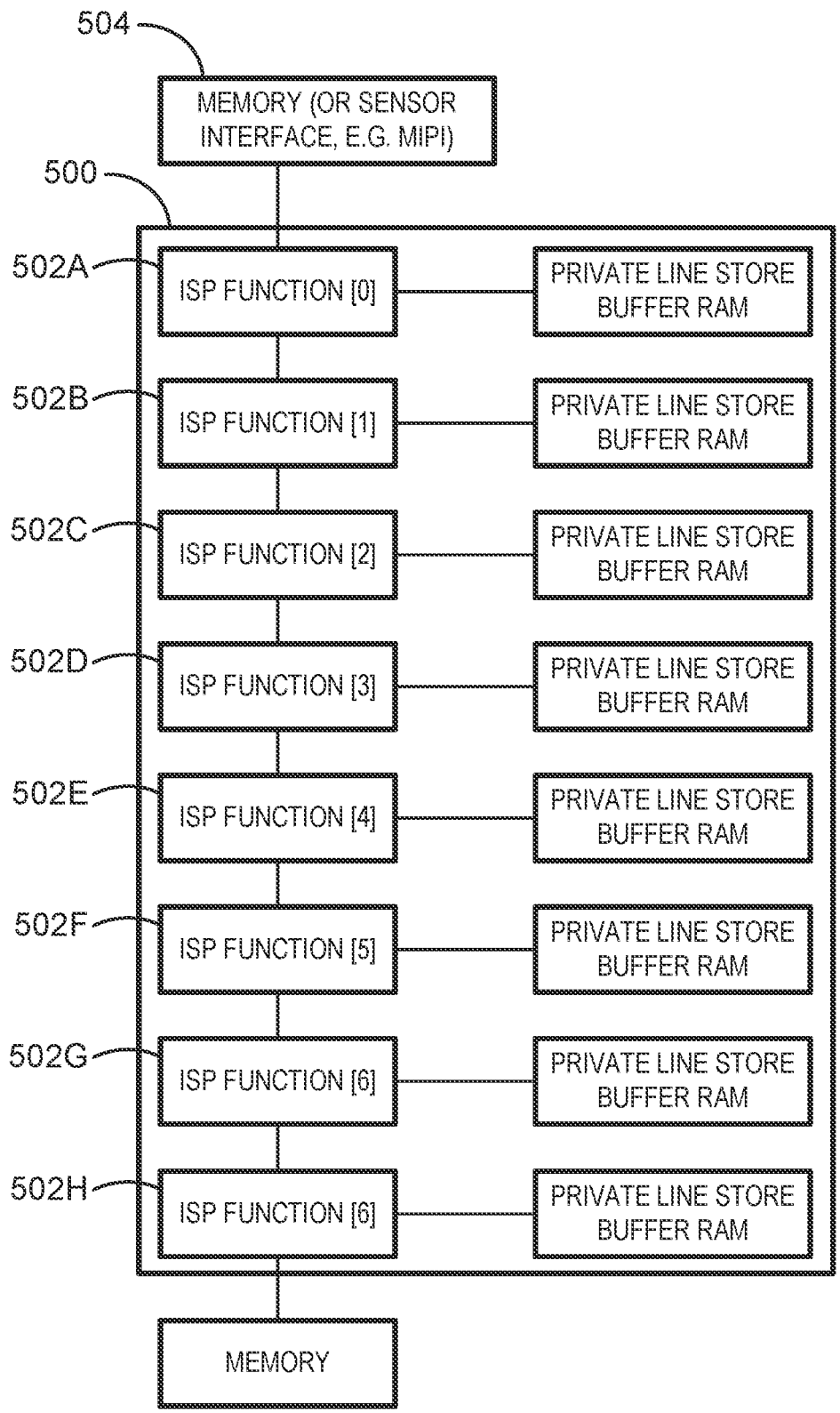
FIG. 5 illustrates a hardware accelerator.

Traditionally, hardware accelerators for image processing operations included a fixed set of hard-wired image signal processing (ISP) functions arranged in a predetermined order. FIG. 5 illustrates a traditional hardware accelerator. A traditional hardware accelerator 500 would receive an image from a memory device 504, and process the received image using ISP functions 502A-502H in the order that is predetermined at design time. In the example shown in FIG. 5, the hardware accelerator 500 uses 8 ISP functions in the illustrated order to process the received image. This approach is rather inflexible and may limit application areas in which the hardware accelerator 500 can be used. Image sensor technology is moving fast and it is difficult to envision using a single fixed ISP pipeline for all current and future sensors. Furthermore, when an ISP function operates a filter on multiple scan-lines of an image, the ISP function has to store, in a buffer, incoming scan-lines until sufficient number of scan-lines are present. These buffers are typically implemented using RAM devices sized according to the resolution of the image, and the size of the buffer is predetermined at the design time of the hardware accelerator 500. Therefore, the buffer for the ISP can effectively force a hard limit on the image resolution that may be handled by the hardware accelerator 500. Additionally, since the buffer is private to the TSP function, the buffer cannot be used in other scenarios (for example by software) and can consume a large amount of die area.

In some embodiments, the hardware accelerator 104 addresses the inflexibility of traditional hardware accelerators by chaining generic, common ISP functions. Frequently, the difference between hardware accelerators lie not so much in the functionality of ISP functions implemented by the hardware accelerators, but the order (and in some cases number of times) in which the ISP functions are invoked. Therefore, the hardware accelerator 104 can be configured to perform a desired function by chaining one or more generic, common function modules that are implemented efficiently.

For example, a convolution operation can be represented as a multiplication and a summation. Likewise, a finite impulse response (FIR) filtering operation can also be represented as a multiplication and a summation, although the order in which the FIR filtering operation performs the multiplication and summation may be different from that of the convolution operation. Despite the difference between the convolution operation and the FIR filtering operation, the multiplication operation and the summation operation are the common functions for the convolution operation and the FIR filtering operation. Therefore, the hardware accelerator 104 can be designed to perform the convolution operation and the finite impulse response filtering operation using the same multiplication module and the same summation module.

In some embodiments, the order in which the generic, common functions are invoked can be determined using software. For example, software can program the hardware accelerator to invoke the multiplication module and the summation module to perform either the convolution operation or the FIR filtering operation by chaining the multiplication module and the summation module in a different order.

Figure 6:
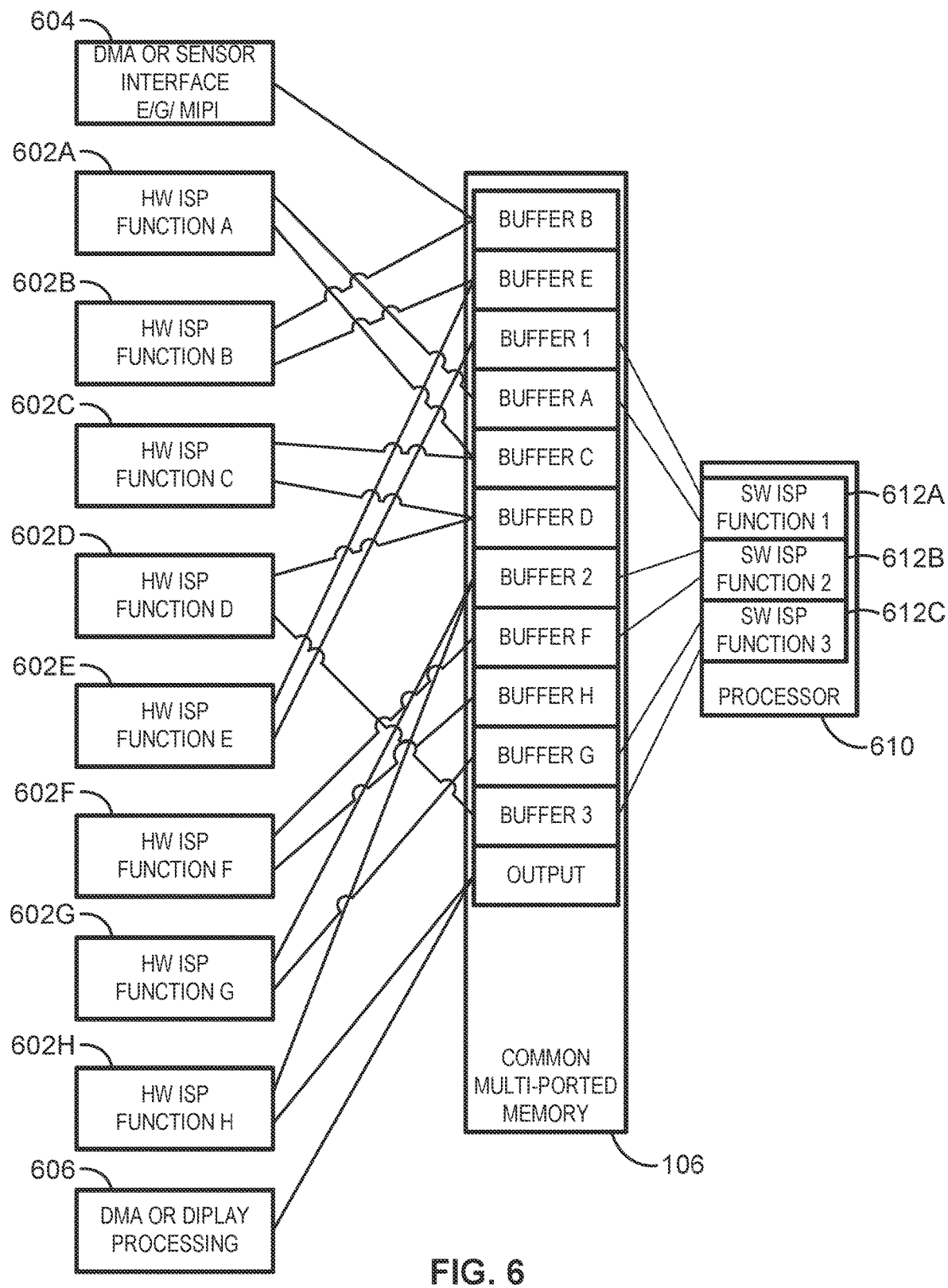
FIG. 6 illustrates a hardware accelerator based on generic functions in accordance with some embodiments.

FIG. 6 illustrates a hardware accelerator based on generic functions in accordance with some embodiments. The hardware accelerator 102 can include a plurality of generic ISP function modules 602A-602H, a data receiver module 604 for receiving one or more scan-lines of an image for processing, and a data output module 606 for outputting one or more scan-lines that have been processed by one or more generic ISP function modules 602A-602H. In some embodiments, the one or more generic ISP function modules 602A-602H can include a configuration register and a control register. The values for these registers can be controlled using software. In some embodiments, the plurality of generic ISP function modules 602A-602H can be a part of the datapath pipeline 304.

In some embodiments, one or more of the generic ISP function modules 602A-602H can include a self-contained hardware filter that also includes direct memory access (DMA) capabilities. The one or more of the generic ISP function modules 602A-602H can use the DMA capabilities to load and/or store data from and/or to a memory slice in the memory fabric 106. The DMA capabilities can be controlled using software.

In some embodiments, the data receiver module 604 can include a DMA module for retrieving one or more scan-lines of an image. In other embodiments, the data receiver module 604 can include a sensor interface module such as a MIPI module. In some embodiments, the data output module 606 can include a DMA module for storing one or more processed scan-lines of an image. In other embodiments, the data output module 606 can include a display device.

In some embodiments, the hardware accelerator 102 can be coupled to a memory fabric 106 that includes an TSP table. The ISP table can include one or more buffers 608. Each buffer can include a pointer to one of the generic ISP function modules 602A-602H. Since the memory fabric 106 can include a multi-ported common (or uniform) memory, multiple devices can access the one or more buffers 608 in the ISP table to identify available generic TSP function modules.

In some embodiments, software ISP functions 612A-612C, running on a processor 610, can be designed to execute one or more generic ISP function modules 602A-602H in the hardware accelerator 102. For example, a software ISP function 612A can determine (1) a list of generic ISP function modules 602A-602H to be executed to perform a desired function and (2) an order in which the list of generic ISP function modules 602A-602H should be executed. Then, the software ISP function 612A can use one or more buffers 608 corresponding to the list of generic ISP function modules 602A-602H to chain the generic ISP function modules, thereby performing the desired function. In essence, the functionality of the hardware accelerator can be determined by software in its look-up of the buffers 608 in the ISP table.

Figure 7:
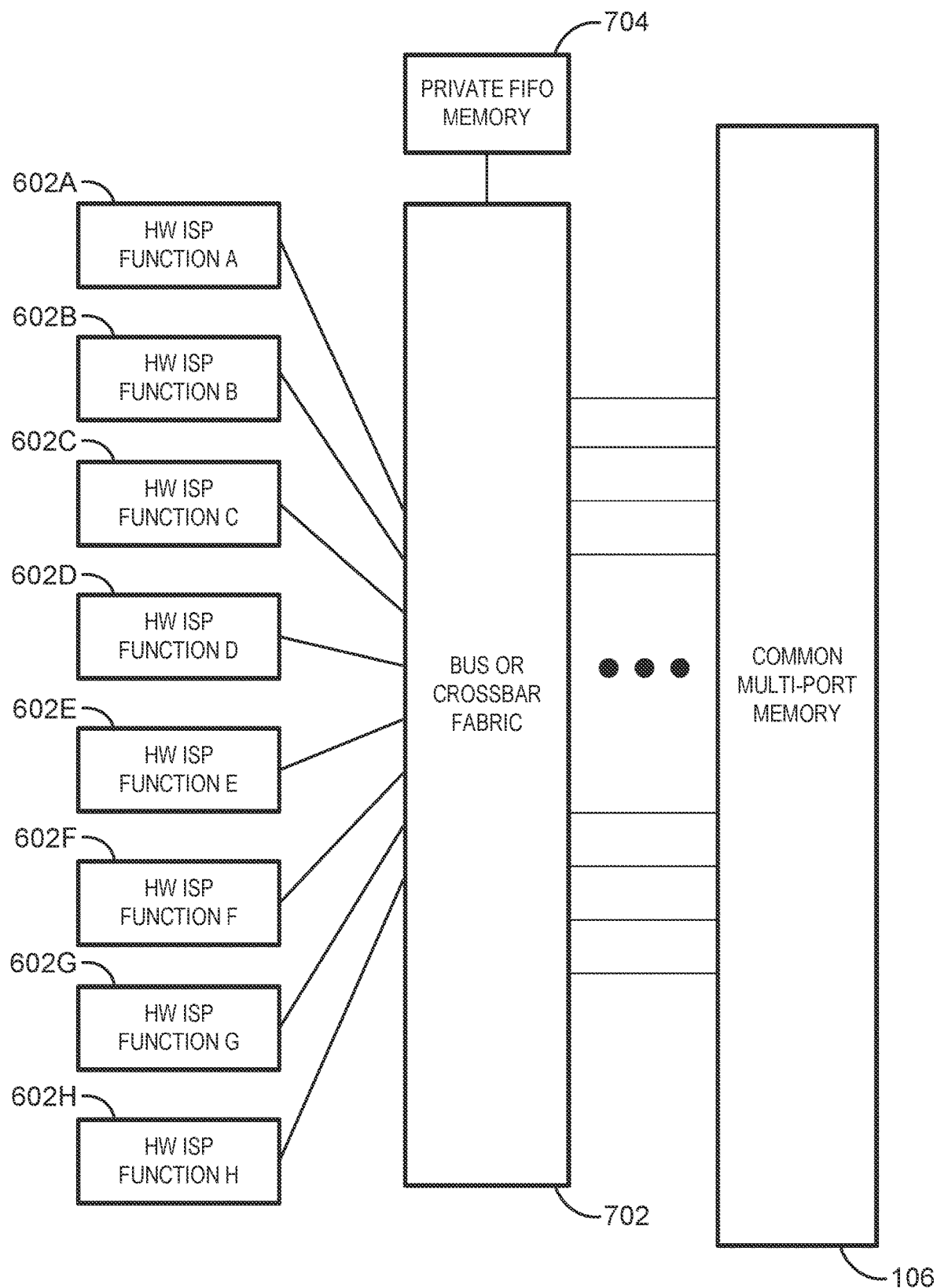
FIG. 7 illustrates a hardware accelerator that includes a first-in-first-out (FIFO) buffer for communication between image signal processing (ISP) function modules in accordance with some embodiments.

In some embodiments, an input interface of ISP function modules may be directly coupled to an output interface of other ISP function modules by means of a small memory mapped first-in-first-out (FIFO) buffer. FIG. 7 illustrates a hardware accelerator that includes a FIFO buffer for communication between ISP function modules in accordance with some embodiments. The ISP function modules 602 can be coupled to a memory bus interface 702, which is in turn coupled to a FIFO buffer 704 and a memory fabric 106.

When a first ISP function module 602A completes its operation on a scan-line of an image, the first ISP function module 602A can store the processed scan-line in a FIFO buffer 704. As the first ISP function module 602A continues to process additional scan-lines, the first ISP function module 602A can continue to store the processed scan-lines in the FIFO buffer 704 until the FIFO buffer 704 is full. When the FIFO buffer 704 is full, the first ISP function module 602A can be stalled until the FIFO buffer 704 is no longer full. In the meanwhile, a second ISP function module 602B can retrieve processed scan-lines from the FIFO buffer 704 for further processing, until the FIFO buffer 704 is empty. In effect, the first ISP function module 602A can be considered the producer of data: the second ISP function module 602B can be considered the consumer of data; and the FIFO buffer 704 can be considered an arbitrator. Since the second ISP function module 602B can retrieve processed scan-lines from the FIFO buffer 704, which has a lower latency compared to a memory slice in the memory fabric 106, the FIFO buffer 704 can reduce the latency of a chain of ISP function modules 602.

In some embodiments, the computing device 100 can include a plurality of power islands. Each power island can be associated with a dedicated power domain. Therefore, the power supply voltage of each power island can be controlled independently. For example, the computing device 100 can determine which power islands are needed to perform a certain operation, and turn on the power supply voltage of only those power islands that are needed. This way, the computing device 100 can reduce the leakage power consumption.

In some embodiments, when the computing device 100 determines that a power island is currently in a low-power mode (e.g., no power supply voltage is provided), and that the power island is needed for a particular operation, the computing device 100 can invoke a power-up sequence for the power island and provide a power supply voltage to the power island.

In some embodiments, each of the vector processors 102 can be associated with a unique power island. In some embodiments, the hardware accelerator 104 can be associated with a unique power island. In some embodiments, the memory fabric 106 can be associated with a unique power island. In some embodiments, the peripheral device 108 can be associated with a unique power island.

In some embodiments, the computing device 100 can invoke a power-up sequence by providing an enable signal to the power island. The enable signal can subsequently close switches located between a power supply voltage and the power island, thereby providing the power supply voltage to the power island. This operation is sometimes referred to as power supply gating.

Figure 8:
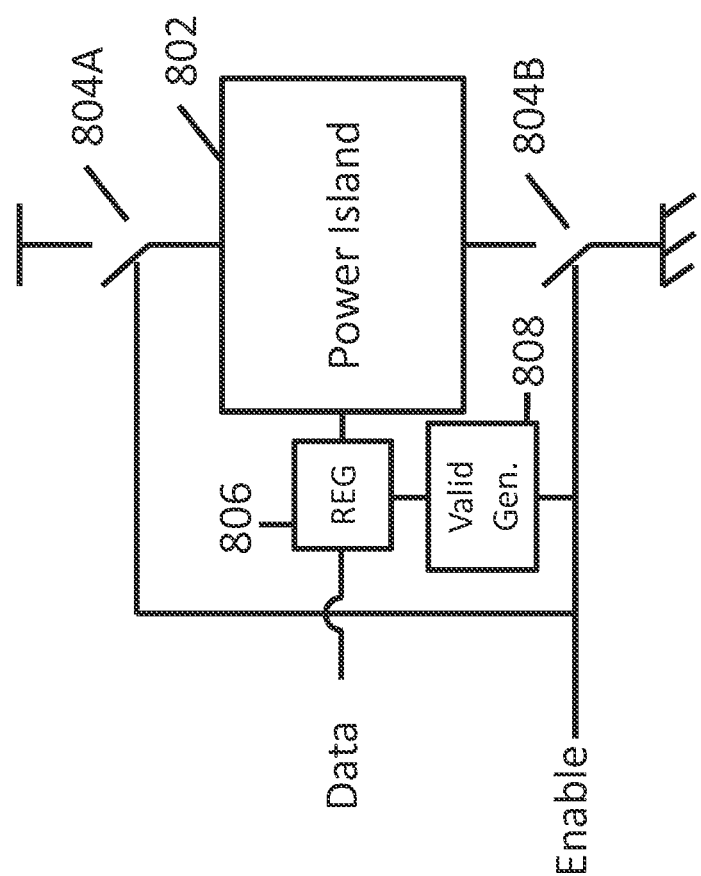
FIG. 8 illustrates power supply gating of a power island in accordance with some embodiments.

FIG. 8 illustrates power supply gating of a power island in accordance with some embodiments. FIG. 8 shows a power island 802, which may include circuit blocks for processing input data, one or more switches 804A-804B for providing a power supply voltage or a ground signal to the power island 802, and an input register 806 for holding input data until the power island 802 is ready to process the input data. In some embodiments, the input register 806 is triggered to provide the input data to the power island 802 when the input register 806 receives a valid signal received from a valid signal generator 808, indicating that the power island 802 is ready to process the input data.

In some embodiments, the computing device 100 is configured to generate a valid signal indicating that the power supply voltage of the power island has reached an appropriate operating voltage. The valid signal can indicate a time instance at which circuits in the power island can be used to perform desired operations. The valid signal can be generated by the valid signal generator 808.

The valid signal generator 808 could generate the valid signal using a timer. For example, the valid signal generator 808 can determine a time instance at which the enable signal is applied to the power-island, and wait a predetermined amount of time using a timer, and then generate the valid signal. However, determining the predetermined amount of time at design time is difficult because the amount of time it takes to ramp up the power supply voltage of a power island would be subject to process, voltage and temperature (PVT) variations. To address the PVT variations, the predetermined amount of time is often set conservatively (e.g., to be sufficiently large) to accommodate worst-case PVT corners, which may unnecessarily add latency to the power-up sequence.

To address these issues, in some embodiments, the valid signal generator 808 is configured to generate the valid signal adaptively. More particularly, the power island can be configured to generate the valid signal by adaptively delaying the enable signal provided to the power island.

Figure 9:
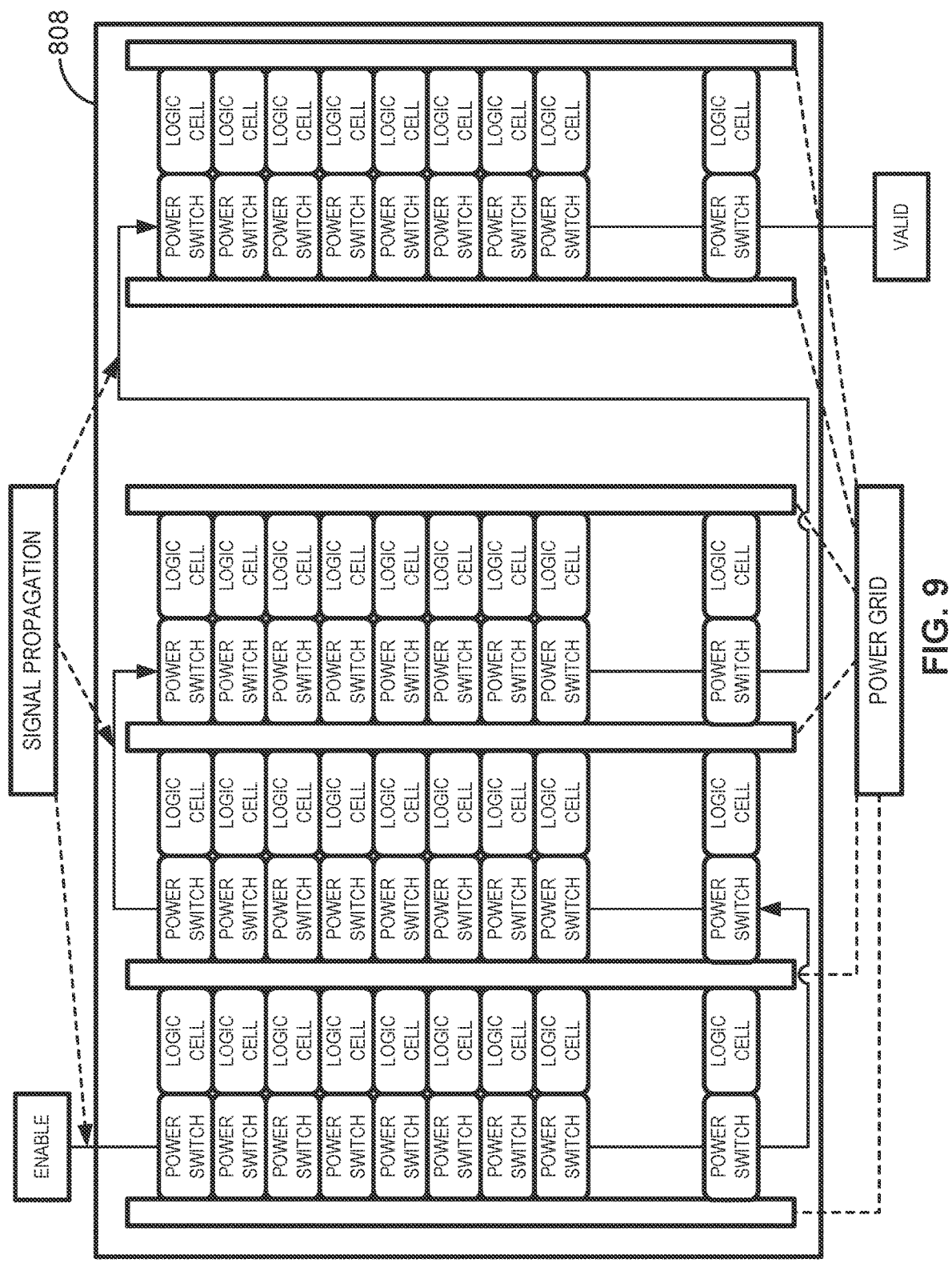
FIG. 9 illustrates a valid signal generator in accordance with some embodiments.

FIG. 9 illustrates a valid signal generator in accordance with some embodiments. The valid signal generator 808 can include a plurality of power switches configured to provide a power supply voltage to logic cells coupled to the plurality of power switches. In some embodiments, the power switches can be a part of each logic cell. For example, the power switches can include one or more P-channel devices in series with the positive supply and/or one or more N-channel devices in series with the negative supply (ground). These power switches can be distributed throughout the logical block comprising the power-island. In FIG. 9, for simplicity, the N and P-channel power switches are shown as a single power-switch block associated with each logic cell.

In some embodiments, the valid signal generator 808 can apply the enable signal to the daisy chain of power switches and wait until the enable signal reaches the end of the daisy chain of power switches. Once the enable signal reaches the end of the daisy chain of power switches, then it is ensured that all logic cells in the power island are properly powered on. Therefore, the valid signal generator 808 can use the enable signal, delayed by the daisy chain of power switches, as the valid signal. This self-calibration mechanism can adaptively capture any process-voltage-temperature (PVT) variations of the particular computing device. This way, the computing device need not unnecessarily wait a long period of time for a power island to power-up; the computing device can wait only the amount of time needed to appropriately power-up the power island.

In some embodiments, a power island can be always powered-on. In other words, a power island can be designed not to enter into a low-power mode in which no power supply voltage is provided. Such a power island can be referred to as an always-on power island.

In some embodiments, an always-on power-island can be used to monitor external signals. For example, the always-on power island can be used to monitor signals from General-Purpose-Input-Output (GPIO) pins, external interfaces, and/or internal functional blocks such as a low frequency timer or power-on reset. This way, the computing device 100 can analyze external signals, determine whether one or more power islands need to be powered up to respond to the external signals, and adaptively power-up only the power-islands that are needed to respond to the external signals.

Figure 10:
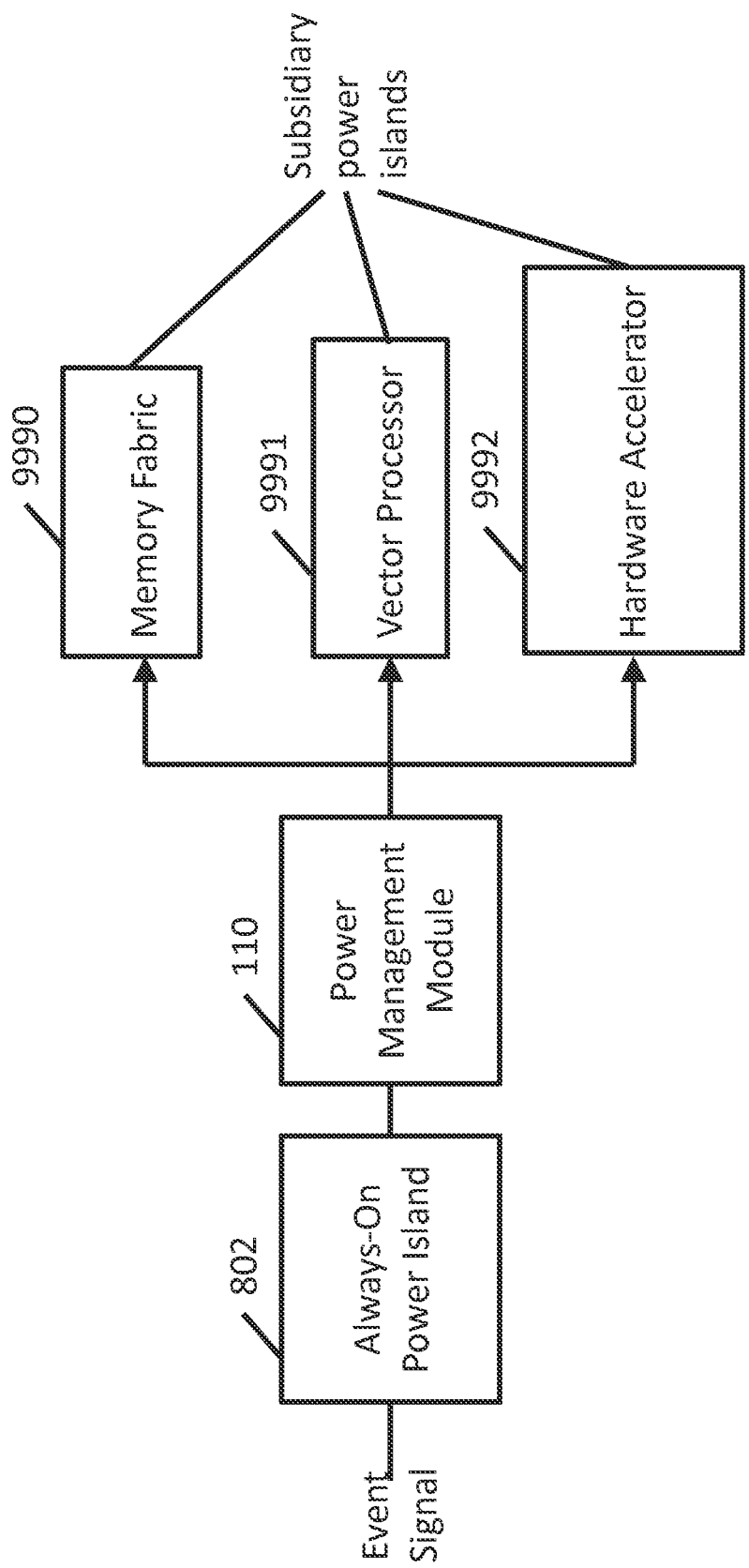
FIG. 10 illustrates an event signal monitoring mechanism in accordance with some embodiments.

FIG. 10 illustrates an event signal monitoring mechanism in accordance with some embodiments. FIG. 10 shows an always-on power island 802 and a power management module 110. The always-on power island 802 can include a power domain for the peripheral device 108. Since the always-on power island 802 does not enter into a low-power mode, the peripheral device 108 in the always-on power island 802 can monitor signals that are asynchronous with a clock of the computing device 100. When the peripheral device 108 detects an event signal to which the computing device 100 should respond, the peripheral device 108 can alert the power management module 110. In turn, the power management module 110 can determine which one of the power islands in the computing device 100 should be turned on. Subsequently, the power management module 110 can cause one or more of the power islands to be powered on.

In some embodiments, the peripheral device 108 can include a software defined interface, whose functionality may be defined using software. More particularly, the peripheral devices 108 can include an interface protocol emulation (IPE) module that is capable of emulating the functionality of standardized interface protocols, such as SPI, I2C, I2S, or any other suitable protocol. The software defined interface is beneficial because the peripheral device 108 can maintain only a single software defined interface that can be programmed to accommodate a plurality of interface protocols, instead of maintaining a plurality of interfaces each dedicated to one particular interface protocol. Since a single software defined interface can consume a lot less die area compared to a plurality of dedicated interfaces, the single software defined interface can drastically reduce the cost associated with interfaces.

Figure 11:
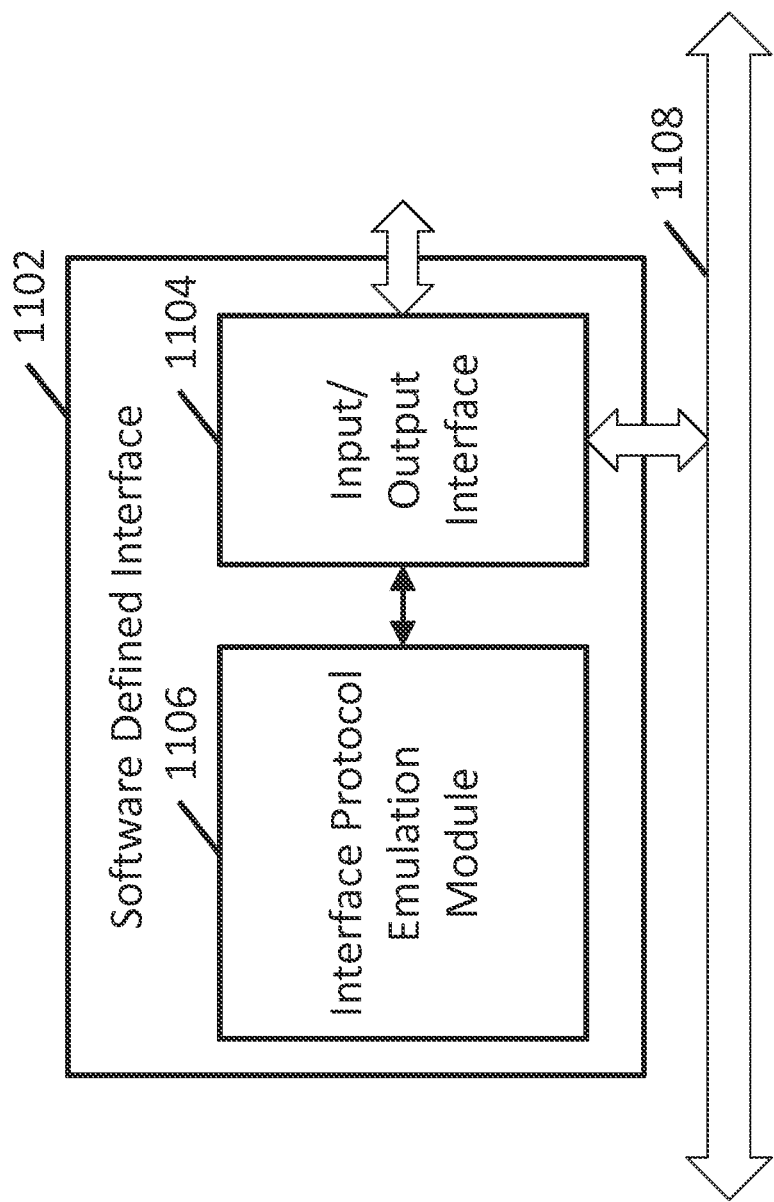
FIG. 11 shows a software defined interface in accordance with some embodiments.

FIG. 11 shows a software defined interface in accordance with some embodiments. FIG. 11 shows a software defined interface that includes a generic input/output (I/O) interface 1104, an IPE module 1106, and an internal bus 1108 for a computing device 100. The generic input/output interface 1104 can include an interface for communicating with an external device, such as a sensor or a camera module.

The functionality of an I/O interface 1104 can be configured using an IPE module 1106. For example, when an IPE module 1106 determines that the I/O interface 1104 should operate as an I2C interface, then the IPE module 1106 can program the I/O interface 1104 to use the I2C interface protocol for communication with the external device. In some embodiments, the TPE module 1106 can be programmed using software. The IPE module 1106 can be programmed so that the IPE module 1106 can configure the I/O interface 1104 to implement standardized interface protocols, such as SPI, I2C, I2S, or any other suitable standards.

Figure 12:
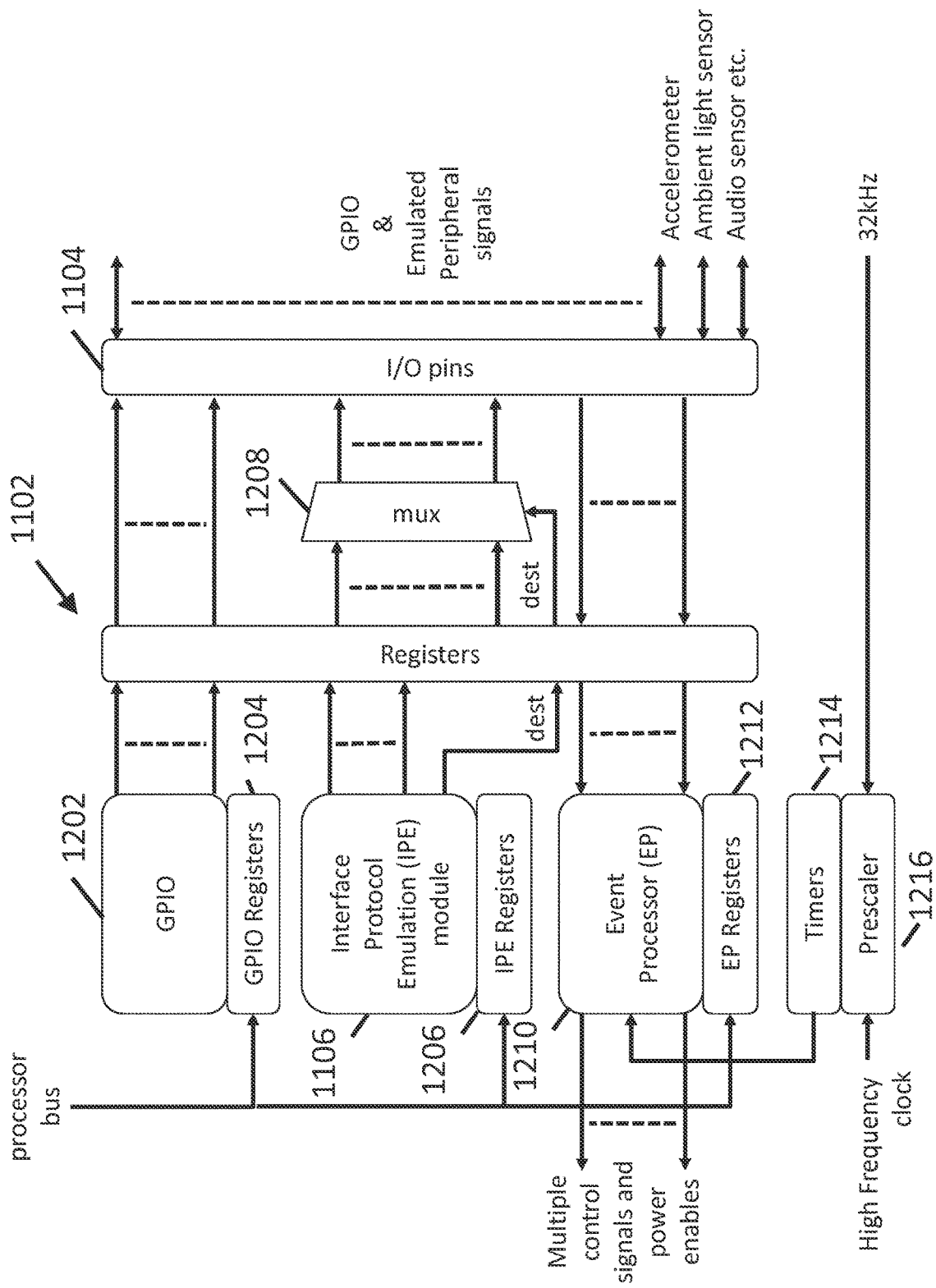
FIG. 12 shows a detailed implementation of a software defined interface in accordance with some embodiments.

FIG. 12 shows a detailed implementation of a software defined interface in accordance with some embodiments. The software defined interface 1102 can include a general-purpose input/output (GPIO) interface 1202 and its registers 1204. A host processor can control the operation of the GPIO 1202 by configuring bits in the GPIO registers 1204. The GPIO 1202 can control some of the pins in the I/O interface 1104 to communicate with external devices, such as an accelerometer, an ambient light sensor, or an audio sensor.

The software defined interface 1102 can also include an IPE module 1106 and its registers 1206. A host processor can control the operation of the IPE module 1106 by configuring bits in the IPE registers 1206. The IPE module 1106 can be configured to determine (1) an interface protocol to be implemented by the software defined interface 1102 and (2) I/O interface pins to be used to implement the interface protocol. Once the IPE module 1106 determines the I/O interface pins to be used to implement the interface protocol, the IPE module 1106 can send a control signal to a multiplexer 1208 to multiplex the selected I/O interface pins to the IPE module 1106. The IPE module 1106 can cause the I/O interface pins to emulate the interface protocol by causing the I/O interface pins to send control signals and data in accordance with the interface protocol.

In some embodiments, the timer 1214 and/or the prescaler 1216 can be used to convert a high frequency reference clock (e.g., in the range of hundreds of mega-hertz) to a low frequency clock (e.g., in the range of hundreds of kilo-hertz) to provide an adequate clock signal to the IPE. In some embodiments, the frequency of the output clock from the prescaler 1216 can be multiplied by an integer value to emulate certain interfaces. For example, when the output clock of the prescaler 1216 is operating at 500 kHz, the frequency of the output clock from the prescaler 1216 can be multiplied by three to emulate I2C interfaces. This way, the 500 kHz clock can be used to operate the IPE logic and to sample the output registers connected to the I/O pins.

In some embodiments, the IPE module 1106 in the peripheral device 108 can be configured to perform a bypass between input pins and output pins of the I/O interface 1104, thereby emulating an input on one side of the computing device 100 and an output on the other side of the computing device 100 without actually powering up the processing units. This allows a first external device, such as an accelerometer coupled to the computing device 100 via I2C. to communicate with a second external device, such as an application processor SoC, without waking up the processing units of the computing device 100.

The software defined interface 1102 can also include an event processor 1210 and its registers 1212. The event processor 1210 can be configured to receive external signals and detect any events to which the computing device 100 should respond. The functionality of the event processor 1210 can be configured using EP registers 1212. In some embodiments, once the event processor 1210 detects an event to respond to, the event processor 1210 can determine the vector processors 102, hardware accelerators 104, and/or memory fabric 106 needed to respond to the event, and send a power-enable signal to the power island associated with the determined vector processors 102, hardware accelerators 104, and/or memory fabric 106.

Figure 13:
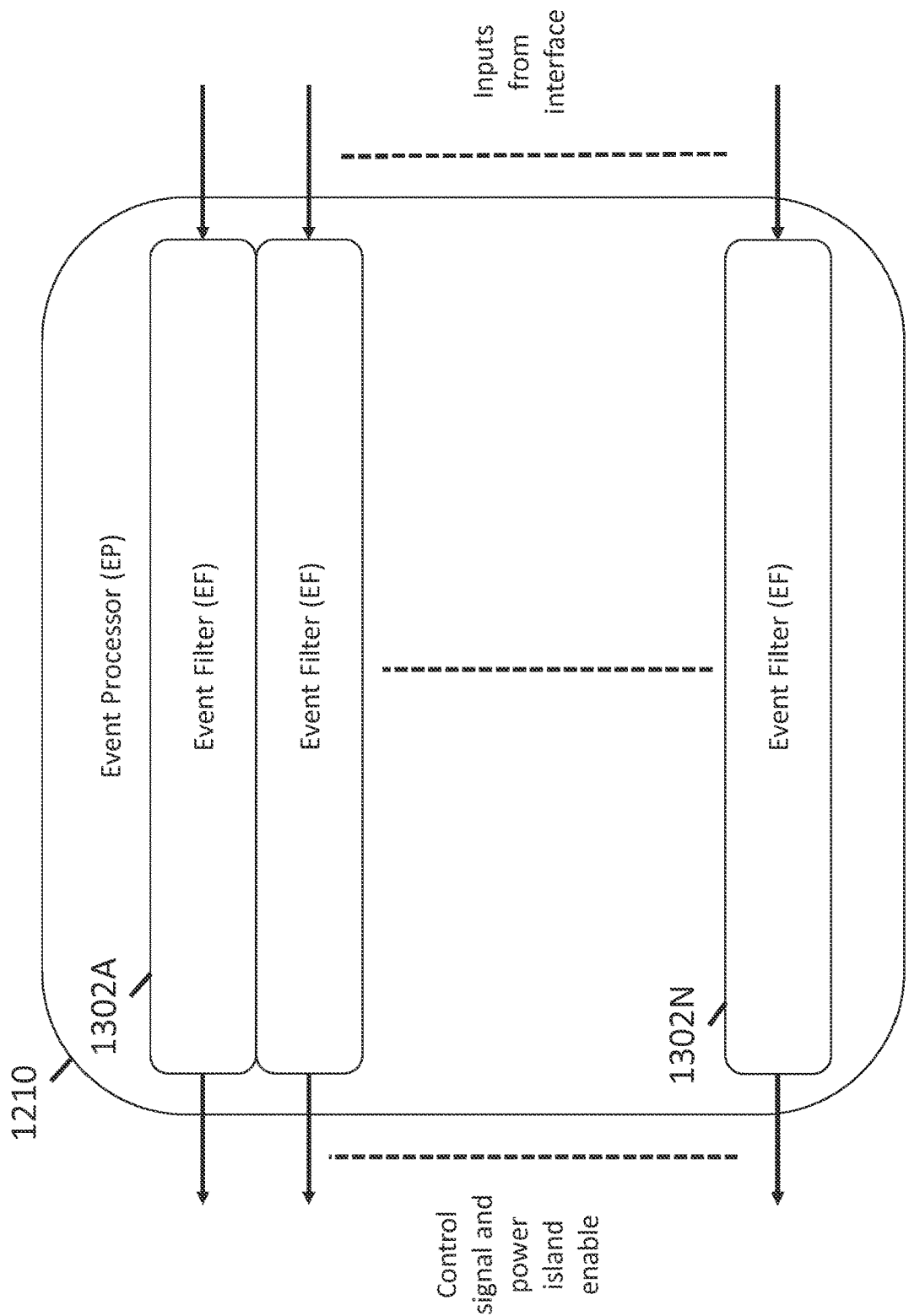
FIG. 13 illustrates an event processor in accordance with some embodiments.

FIG. 13 illustrates an event processor in accordance with some embodiments. As discussed above, the event processor 1210 may communicate with external devices and receive signals from the external devices. The signals can include audio samples, accelerometer values, ambient light sensor values, or any other inputs that can be provided via a communication interface, such as a GPIO. The event processor 1210 can be configured to compare the received signals to a particular configuration to recognize an event or a sequence of events. Once the event processor 1210 recognizes an event or a sequence of events, the event processor 1210 can cause one or more components in the computing device 100 to wake from a low power mode and commence operation.

In some embodiments, the event processor 1210 can include one or more event filters 1302A-1302N. An event filter 1302 is configured to receive an input signal from an interface 1104, and determine whether a particular event has occurred. If the particular event has occurred, the event filter 1302 can send a control signal and/or a power island enable to one of a plurality of power islands in the computing device 100.

Figure 14:
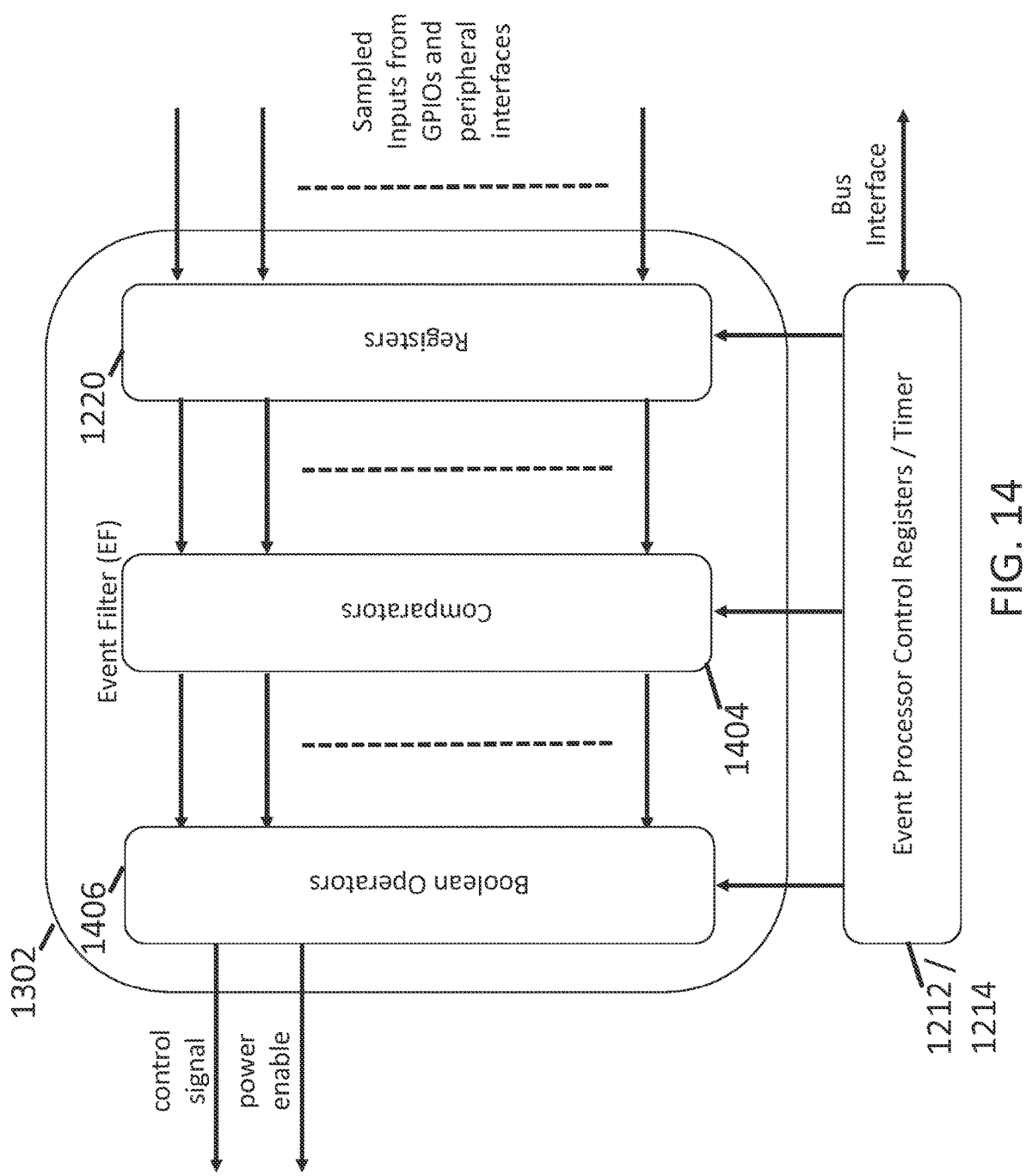
FIG. 14 illustrates an event filter in an event processor in accordance with some embodiments.

FIG. 14 shows an implementation of an event filter in accordance with some embodiments. The event filter 1302 can include a register 1402, a comparator 1404, and a Boolean operator 1406. The event filter 1302 can be controlled via the event processor control registers 1212 and a timer 1214.

The input registers 1402 can be configured to receive input signals from one or more external devices and to provide the received input signals a bank of comparators 1404. The comparators 1404 can be configured to support a wide range of input signal representations, including Boolean, integer, fixed-point, and floating-point representations.

Subsequently, the outputs from the comparators 1404 can be logically combined based on the timer value from the EP timer 1214 in order to determine if a particular event or a sequence of events has happened. In some cases, the particular event or the sequence of events is deemed to have happened when a particular relationship between comparator outputs persists for a predetermined period of time. Once the event filter 1302 determines that a particular event or a sequence of events has happened, the event filter 1302 can output control signals for controlling other components in the computing device 100, such as a vector processor 102 or a hardware accelerator 104, or external devices coupled to the peripheral device 108.

The event processor 1210 can be configured to detect an event in which a user starts using an electronic device. The event processor 1210 can subsequently turn on components in the computing device 100 to respond to the start-up event. For instance, the event processor 1210 can be configured to detect a change in ambient light, which may indicate that the electronic device has been removed from a pocket. When the ambient light remains at a high level for more than a few milliseconds, the event processor 1210 can check the audio input to determine whether there is a change in input audio signals. When the event processor 1210 detects a change in input audio signals, the event processor 1210 can enable a digital signal processor in the computing device 100 to detect a spoken command. This way, the event processor 1210 allows components in the computing device 100 to remain in a low-power mode and perform operations only when an event or a sequence of events has occurred. Therefore, the event processor 1210 can significantly reduce the average standby power of the computing device 100.

Figure 15:
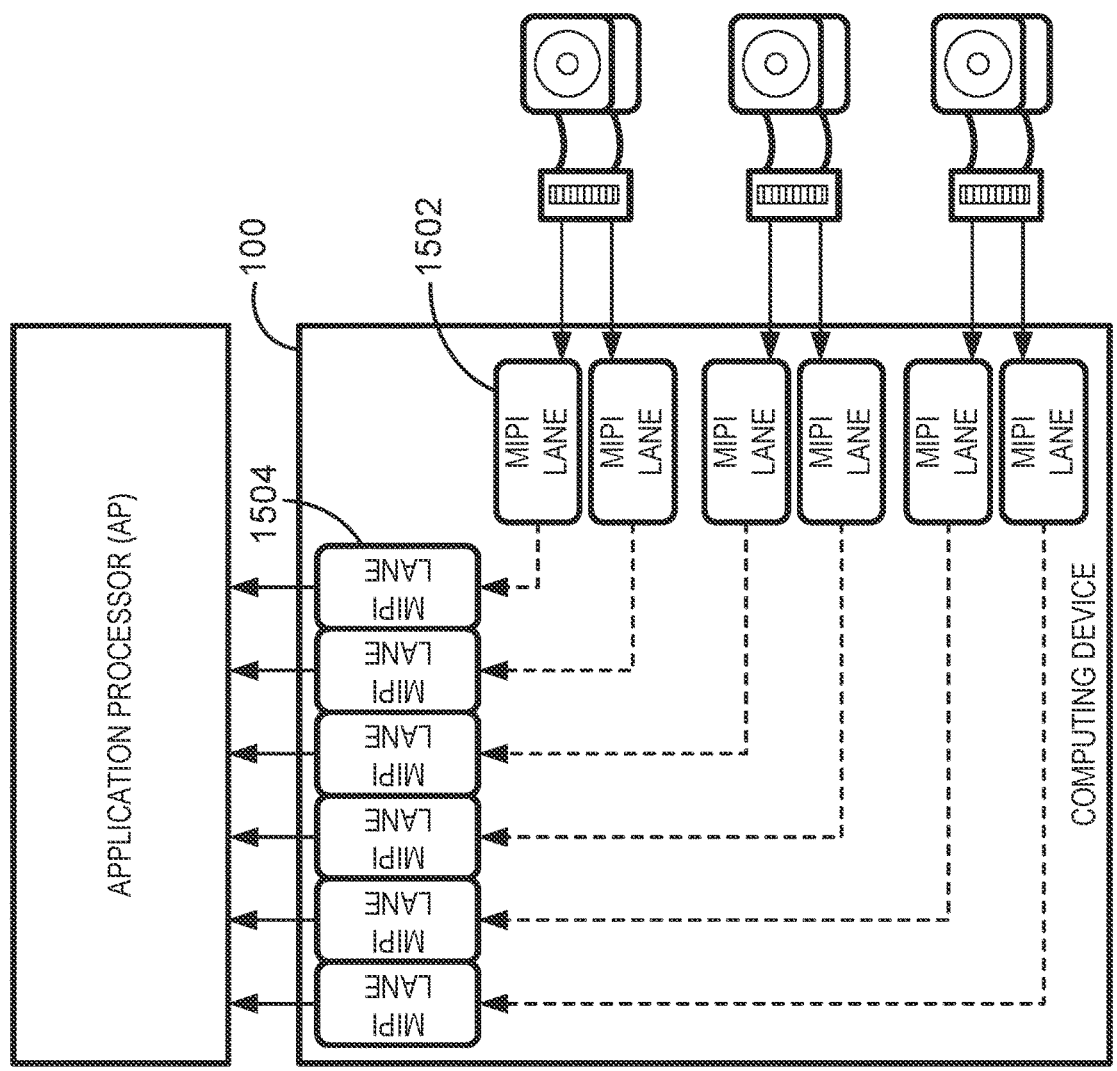
FIG. 15 shows a bypass mode of a peripheral device in accordance with some embodiments.

FIG. 15 shows a bypass mode of a peripheral device in accordance with some embodiments. In FIG. 15, the computing device 100 can be in a low-power operation mode in which one or more power islands are in a low-power mode (e.g., no power supply voltage applied to the one or more power islands.) In this case, the IPE module 1106 can be configured to perform a bypass between input pins and output pins of the I/O interface 1104, such as an input MIPI lane 1502 and an output MIPI lane 1504. In this example, the input MIPI lane 1502 is coupled to a camera module and the output MIPI lane 1504 is coupled to an application processor. Therefore, the camera module can be coupled to the application processor without actually waking up the one or more power islands that are in a low-power mode.

In some embodiments, peripheral devices 108 for different interface protocols can share physical pins (or pads) of the computing device 100. For example, the peripheral devices 108 can include a first interface for a first communication protocol and a second interface for a second communication protocol. The first interface and the second interface can be configured to time-multiplex the physical I/O pins so that the number of IO pins dedicated to the peripheral devices 108 can be reduced. In some cases, the peripheral devices 108 can include a table that includes a mapping between signals in the first and second interfaces and physical pins.

In applications where the computing device 100 is connected to a range of MIPI devices, such as cameras and displays, or to an application processor or other devices where the computing device 100 "appears" as a camera, the configuration of the computing device 100, in terms of the number of MIPI interface blocks and associated pins, may not be known at design time. For this reason, it is advantageous to connect a set of MIPI I/O pins to a plurality of programmable MIPI I/O protocol control blocks so that the number of MIPI inputs and outputs required to support a particular MIPI use case can be configured at run-time via software.

Figure 16:
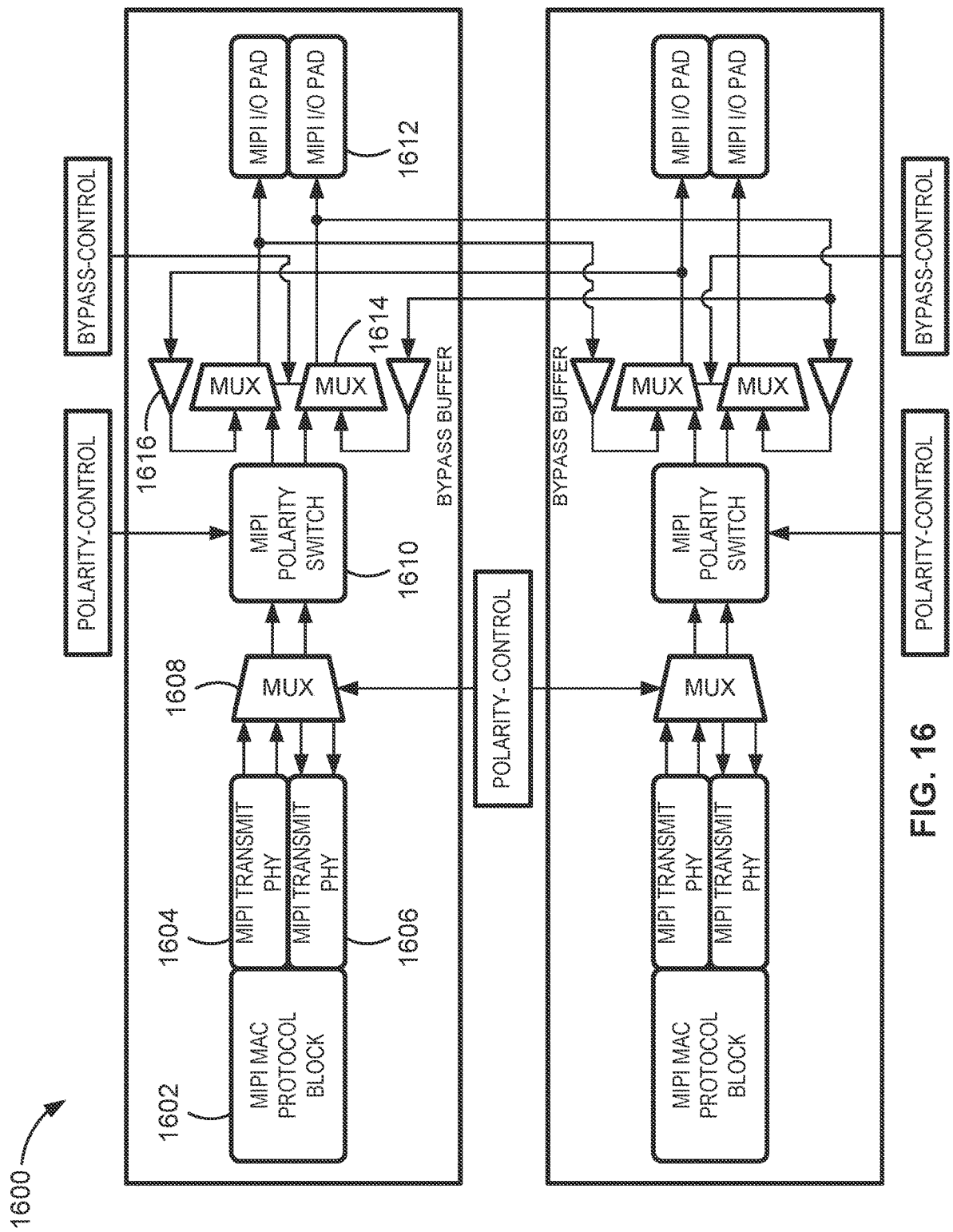
FIG. 16 shows a programmable Mobile Industry Processor Interface (MIPI) interface in accordance with some embodiments.

FIG. 16 shows a programmable MIPI interface in accordance with some embodiments. The programmable MIPI interface 1600 can include a MIPI media access control (MAC) protocol block 1602, a MIPI transmitter 1604, a MIPI receiver 1606, a multiplexer 1608 that is configured to channel signals from either one of the MIPI transmitter 1604 or the MIPI receiver 1606, a MIPI polarity switch 1610 that is configured to change the polarity of the differential MIPI I/O pads 1612, and a bypass multiplexer 1614 and a bypass buffer 1616 for performing a bypass between input pins and output pins of the I/O interface 1104 as illustrated with respect to FIG. 15.

In some embodiments, the MIPI MAC protocol block 1602 is designed to control the operation of the MIPI transmitter 1604 and/or the MIPI receiver 1606 so that the operation of the MIPI transmitter 1604 and/or the MIPI receiver 1606 conforms with the MIPI protocol.

In some embodiments, the programmable MTPI interface 1600 can allow only one of the MIPI transmitter 1604 or the MIPI receiver 1606 to communicate via the MIPI I/O pad 1612 at a particular time instance. For example, the programmable MIPI interface 1600 can couple only one of the MIPI transmitter 1604 or the MIPI receiver 1606 with the MTPI I/O pad 1612 via a multiplexer 1608. This way, to an external device, the MIPI I/O pad 1612 can be considered a bi-directional MIPI interface.

Figure 17:
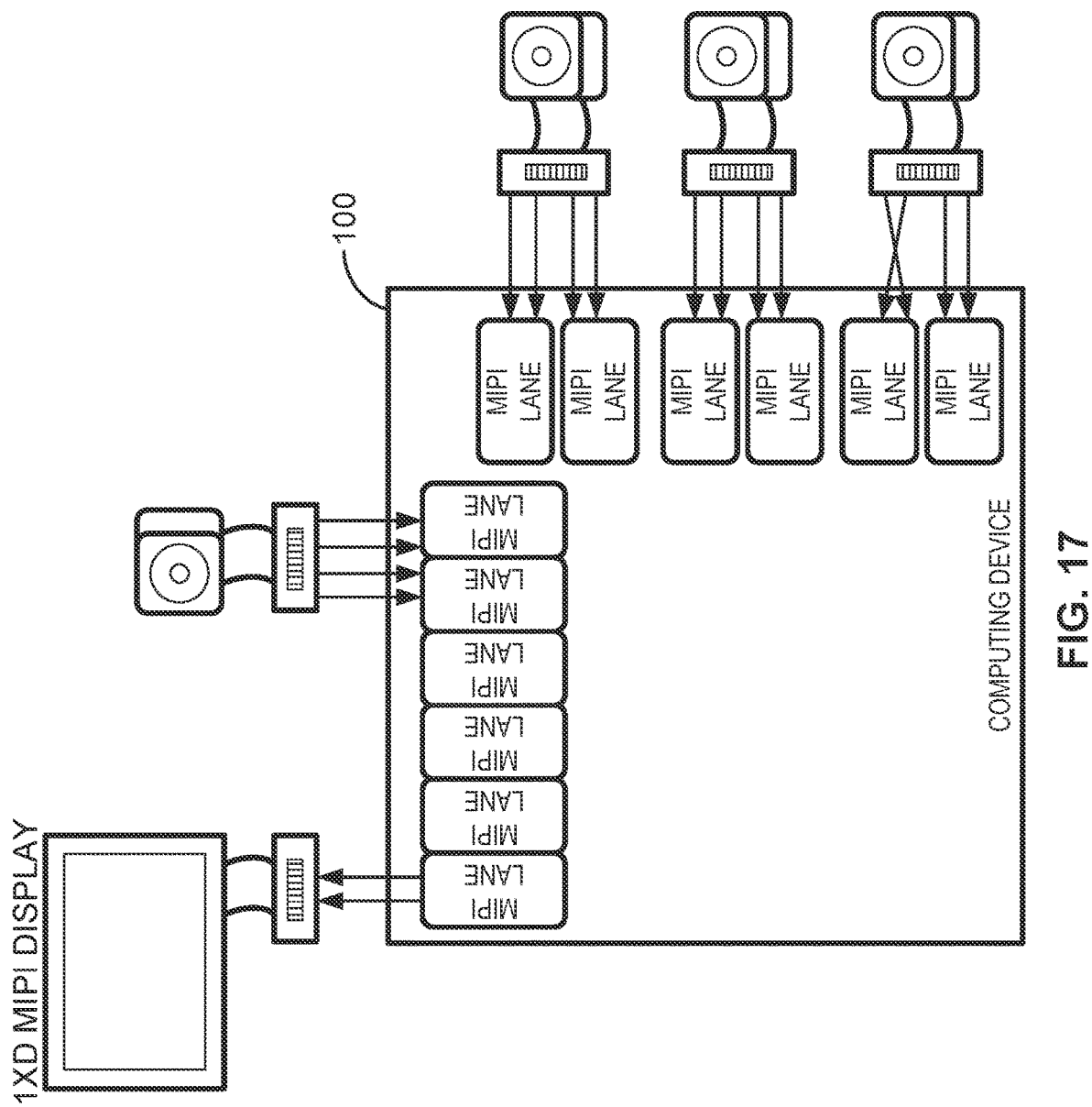
FIG. 17 illustrates an application of a polarity reversal mechanism for an input/output interface in accordance with some embodiments.

In some embodiments, the programmable MIPI interface 1600 can use the MIPI polarity switch 1610 to reverse the polarity of the differential MTPI I/O pads so that the polarity of the differential MTPI I/O pads can be reversed at run time in order to achieve better impedance matching or to correct errors in external PCB design without rework. FIG. 17 illustrates an application of a polarity reversal mechanism for an input/output interface in accordance with some embodiments. While FIG. 17 illustrates the application of the polarity reversal mechanism for MIPI I/O pads, the polarity reversal mechanism can be used in a variety of other interfaces that use differential pair of signal lines.

In some embodiments, as described generally above with respect to FIG. 15, the programmable MIPI interface 1600 can provide a low-power MIPI bypass mode by providing MIPI multiplexers 1614 and buffers 1616 that allow MIPI I/O pads 1612 to be connected to outputs without requiring the processing units of the computing device 100 to be powered up. This feature is desirable in modes where multiple camera sensors are connected to the computing device 100 to perform computer vision tasks while in other use-cases the computing device 100 is not required and the application processor performs still or video image capture using the same set of sensors. With the provision of internal MIPI multiplexers 1614, such uses cases can be supported via the internal bypass multiplexers 1614 rather than using external components and greatly simplifies the cost and complexity of the PCB on which the chips are combined.

In some embodiments, the memory fabric 106 can include cache memory that is designed to exploit data locality, in terms of both the spatial and temporal locality. When a computing device 100 is not coupled to an external memory device, then the memory fabric 106 can allow vector processors 102 and hardware accelerators 104 to use the cache memory as a general memory device. In some embodiments, the cache memory can be partitioned into sections so that each section is exclusively used by one of the vector processors or one of the hardware accelerators.

In some embodiments, the memory fabric 106 is configured to maintain state information of the computing device 100 when the computing device 100 is in a power saving mode. This way, when the computing device 100 is switched on again, the computing device 100 can redistribute the state information to appropriate devices so that the delay associated with the "wake-up" procedure can be reduced.

In some cases, the state information is maintained in cache memory. In such cases, the cache memory that stores the state information may be powered on even when the computing device 100 enters a power saving mode. The state information can include binaries of application(s) loaded at boot-time or during run-time. The state information can also include configuration information such as register settings, operating mode, pipeline configuration, and runtime environment settings loaded at boot-time and modified during run-time which would otherwise have to be stored in external non-volatile memory and retrieved in the event of a power-down to power-up sequence. The state information can also include data such as image data, and values from other sensors. The state information can also include the state of communications protocols between the computing device 100 and other system components which would otherwise need to be stored and retrieved from external non-volatile memory in the event of a power-down to power-up sequence.

Figure 18:
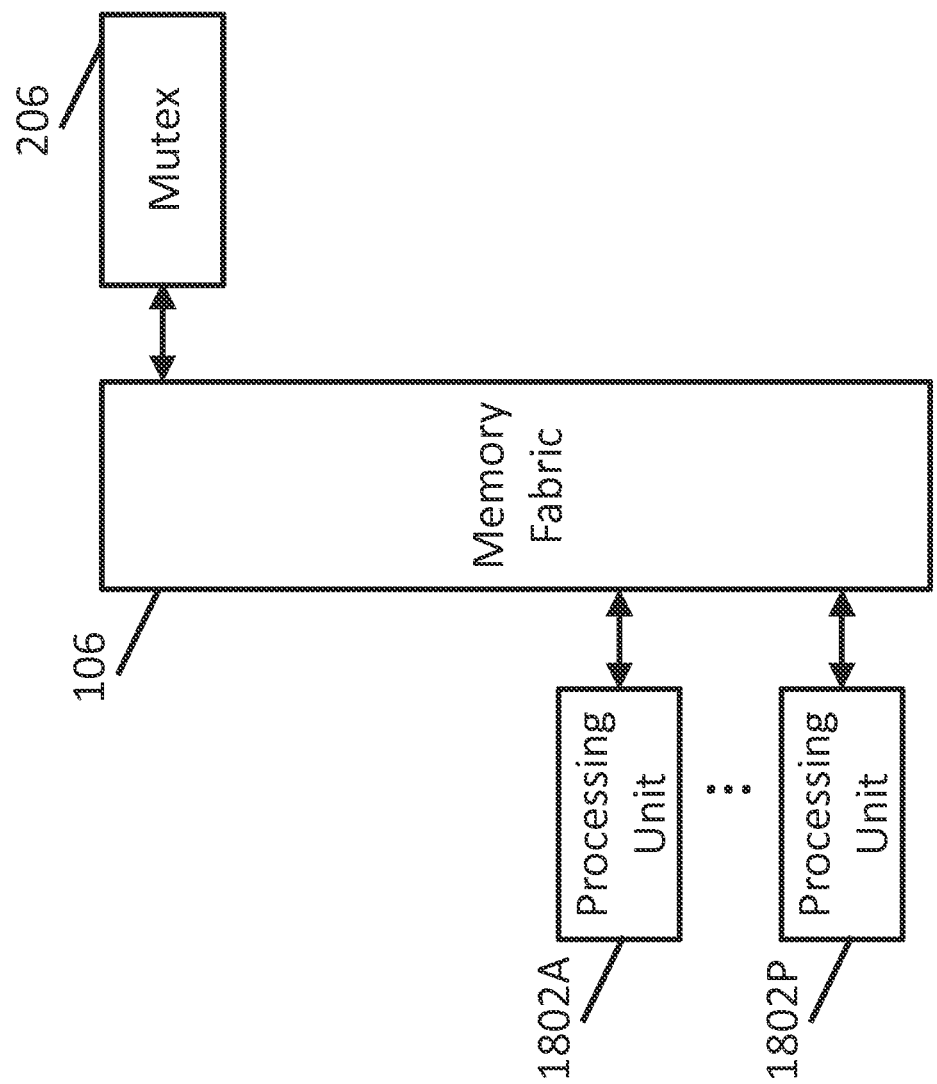
FIG. 18 illustrates a memory fabric having a hardware-based mutual exclusion (mutex) controller in accordance with some embodiments.

In some embodiments, the memory fabric 106 can include a hardware-based mutual-exclusion (mutex) controller 206. FIG. 18 illustrates a memory fabric having a hardware-based mutex controller in accordance with some embodiments. FIG. 18 shows a plurality of processing units 1802A-1802P, a memory fabric 106, and a mutex controller 206. A processing unit 1802 can include a vector processor 102 or a hardware accelerator 104. The mutex controller 206 can include one or more independently addressable mutex elements that are configured to coordinate multitasking of processing units 1802 that share a data element. More particularly, a mutex element can be configured to lock a shared data element, stored in the memory fabric 106 or other parts of the computing device 100, to a first processing unit 1802A so that other processing units 1802P that also use the shared data element can wait until the first processing unit 1802A releases the shared data element. Because the mutex controller 206 resides within the memory fabric 106, the time to release or lock a shared resource is reduced when compared to using a shared bus or other means.

Traditionally, when a mutex controller receives a request for an exclusive access to a shared resource, the mutex controller immediately responds to the request, indicating whether the requesting processing unit can get an exclusive access to the shared resource. Therefore, if the requesting processing unit does not get an exclusive access, the requesting processing unit has to request the mutex controller continuously until the requesting processing unit receives the exclusive access from the mutex controller. This can increase the traffic on the bus between the traditional mutex controller and processing units.

To address this issue, in some embodiments, when a processing unit 1802A sends an exclusive access request, requesting an exclusive access to a shared resource, the mutex controller 206 can monitor the status of the request on its own. Once the mutex controller 206 determines that the processing unit 1802A is granted with the exclusive access, the mutex controller 206 can send an acknowledgment message to the processing unit 1802A, indicating that the processing unit 1802A has the exclusive access to the shared resource. This way, the processing unit 1802A is not required to send the exclusive access request multiple times until the processing unit 1802A receives the exclusive access; the processing unit 1802A can send the exclusive access request only once and wait to receive the exclusive access from the mutex controller 206. This messaging mechanism can reduce the communication load on the memory fabric 106.

In some embodiments, the memory fabric 106 can include a flexible bus architecture that provides communication between processing units. Frequently, an interface for communication between processing units includes a buffer, such as a First-In-First-Out (FIFO). For example, when a first processing unit is ready to send a message to a second processing unit, the first processing unit can send the message to a buffer that is assigned to the second processing unit. When the second processing unit is ready to receive the message, the second processing unit can retrieve the message from the buffer.

However, buffers in traditional interfaces have a limited storage capacity. Therefore, buffers in traditional interfaces are often limited to storing control messages and could not accommodate large amount of data, such as image and video data. Furthermore, each buffer is permanently assigned to one of the processing units. Therefore, while a first buffer assigned to a first processing unit may be overflowing, a second buffer assigned to a second processing unit may be empty. Thus, the capacity of buffers may not be fully utilized at the system level.

The memory fabric 106 addresses these shortcomings of traditional interfaces by increasing the capacity of buffers and by dynamically assigning buffers to processing units based on the real-time needs for communication. The memory fabric 106 provides a flexible mechanism for creating, managing, and releasing buffers. The buffers can be created for the duration of a process, and can be released once the process is completed. The released buffer can be made available for other applications or processing units under a software program control.

Figure 19:
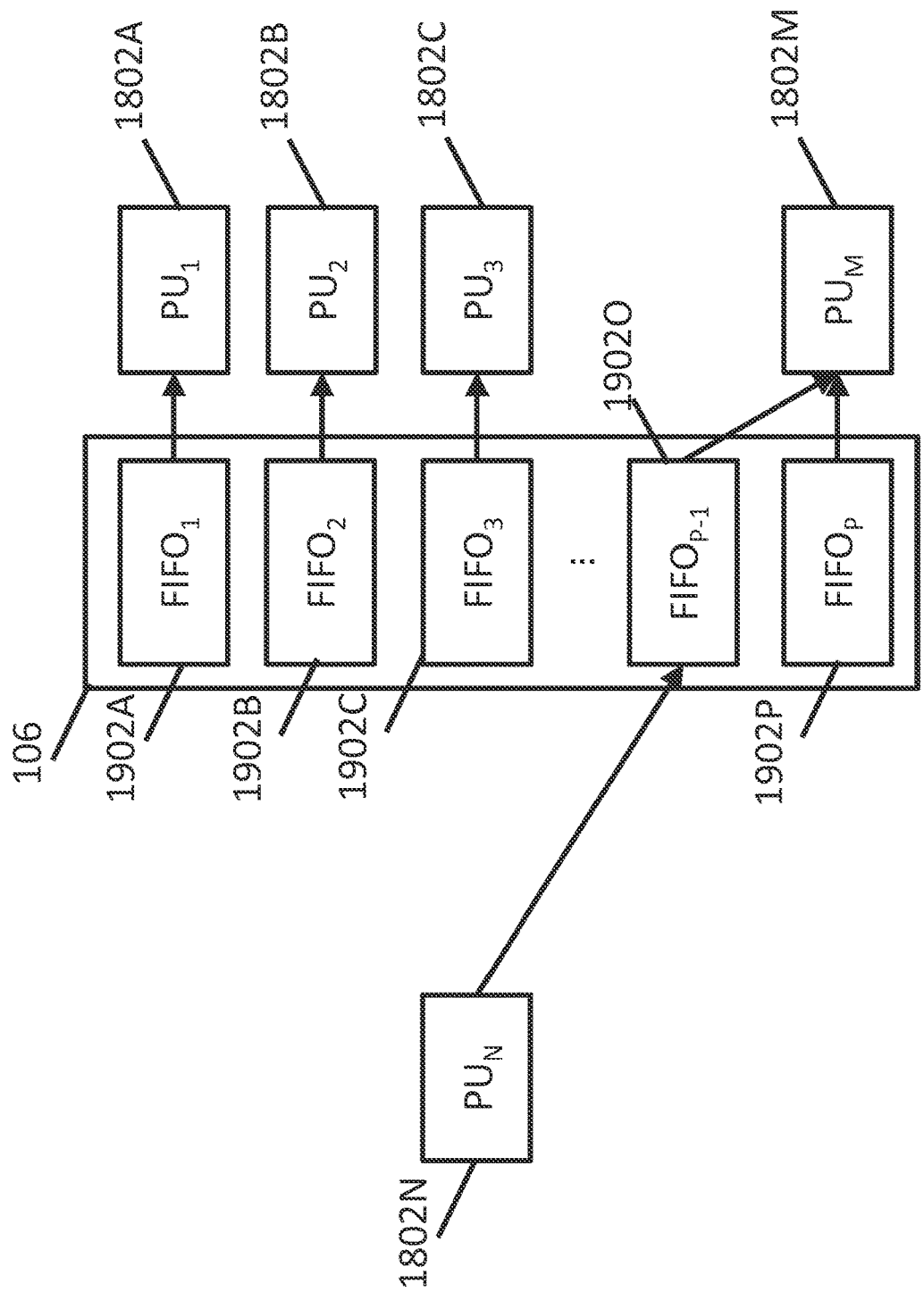
FIG. 19 illustrates a dynamic assignment of buffers in accordance with some embodiments.

FIG. 19 illustrates a dynamic assignment of buffers in accordance with some embodiments. The memory fabric 106 can include a plurality of buffers 1902A-1902P, each of which may be exclusively assigned to one of the processing units, such as a vector processor or a hardware accelerator. In some cases, multiple buffers 1902 can be assigned to the same processing unit.

In some embodiments, the plurality of buffers 1902 can be a part of a repository of buffers that can be partitioned and exclusively assigned to one of the processing units. The repository can comprise a memory slice from the memory fabric 106. In some embodiments, each of the plurality of buffers 1902 may have the same capacity. In other embodiments, one or more of the buffers 1902 may have a variable capacity. For example, when a first processing unit 1802N attempts to send a small number of control messages to a second processing unit 1802C, the memory fabric 106 can assign a small buffer 1902C to the second processing unit 1802C so that the second processing unit 1802C can receive the small number of control messages. However, when the first processing unit 1802N attempts to send a large amount of video data to the second processing unit 1802M, the memory fabric 106 can assign a buffer having a large capacity to the second processing unit 1802M so that the second processing unit 1802M can receive the large amount of video.

In some embodiments, one or more of the plurality of buffers 1902 can be associated with particular applications, such as a communications interface including USB, MTPI or Ethernet that can be foreseen at the device (system-on-chip) design time.

Figure 20:
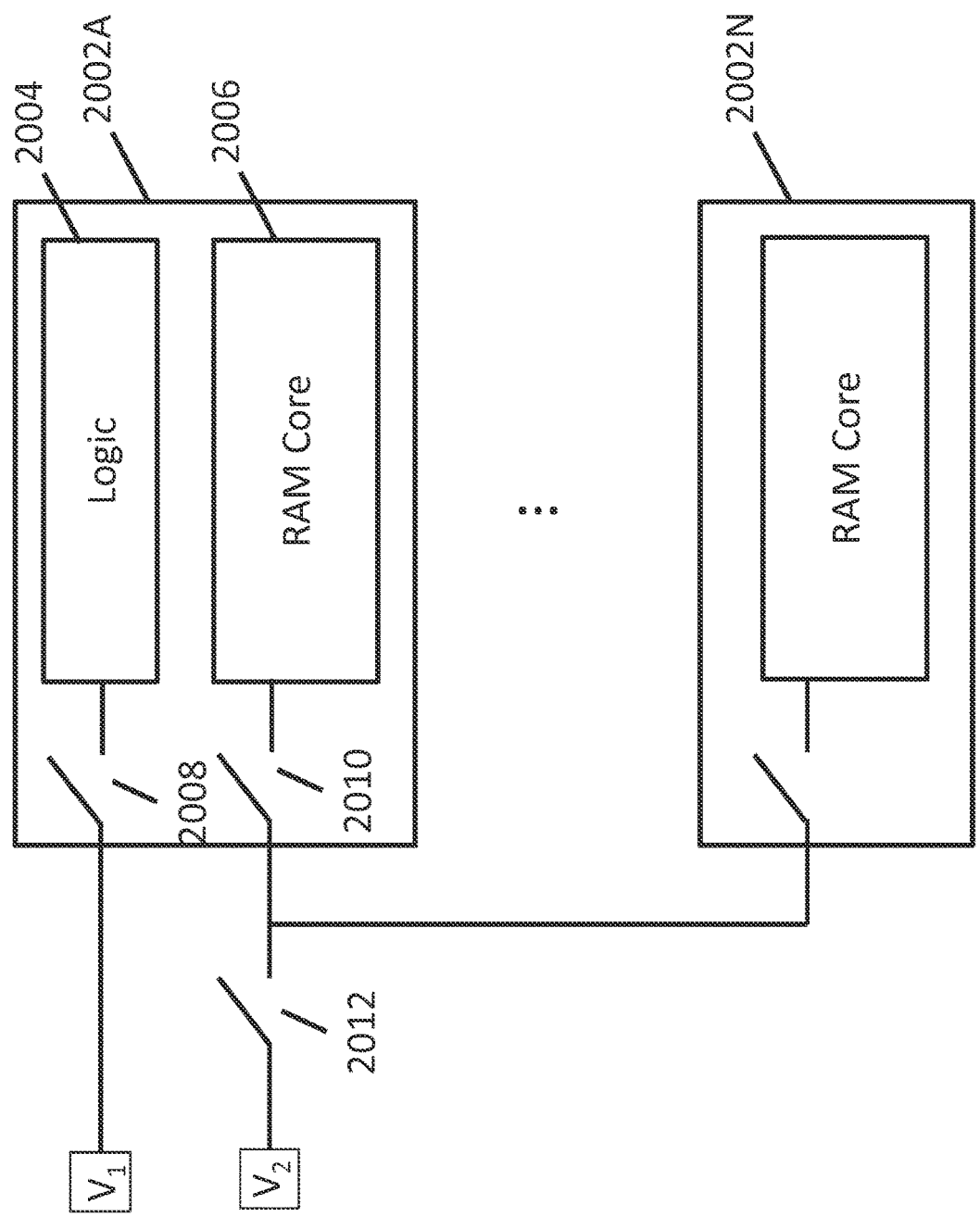
FIG. 20 illustrates a power management mechanism that provides different voltages to logic circuits memory devices in accordance with some embodiments.

In some embodiments, the power management module 110 can be configured to provide a different power supply voltage to logic circuits and memory devices. FIG. 20 illustrates a power management mechanism that provides different voltages to logic circuits memory devices in accordance with some embodiments. A single power island 2002A can include a logic circuit area 2004 and a memory area 2006. The power management module 110 can be configured to provide a first voltage $V_1$ to the logic circuit area 2004 and a second voltage $V_2$ to a memory area 2006. In some embodiments, the first voltage and the second voltage can be provided by a different power regulator. Therefore, the first voltage and the second voltage can be controlled independently.

In some embodiments, the logic circuit area 2004 and the memory area 2006 can independently enter a low-power mode. For example, the power management module 110 can use local switches 2008, 2010 to cut off the power supply voltage to the logic circuit area 2004 and the memory area 2006, respectively. In some embodiments, the power management module 110 can use the global switch 2012 to cut off the power supply voltage to memory areas 2006 in one or more power islands 2002A, . . . , 2002N.

In some embodiments, the memory fabric 106 can include a direct memory access (DMA) engine. The DMA engine can maintain an operation list, which includes a double linked list of DMA data structures. Each DMA data structure indicates a particular operation to be performed by the DMA engine. The DMA data structures are maintained in the order in which the DMA engine should perform operations associated with the DMA data structures.

Because the operation list includes a double linked list of DMA data structures, it takes a significant amount of time to remove a DMA operation to the sequence of operations represented by the double linked list. In some embodiments, the DMA engine can address this issue by maintaining a buffer that indicates whether a DMA data structure should be executed. Each bit in the buffer can be considered an enable signal for the associated DMA data structure.

Figure 21:
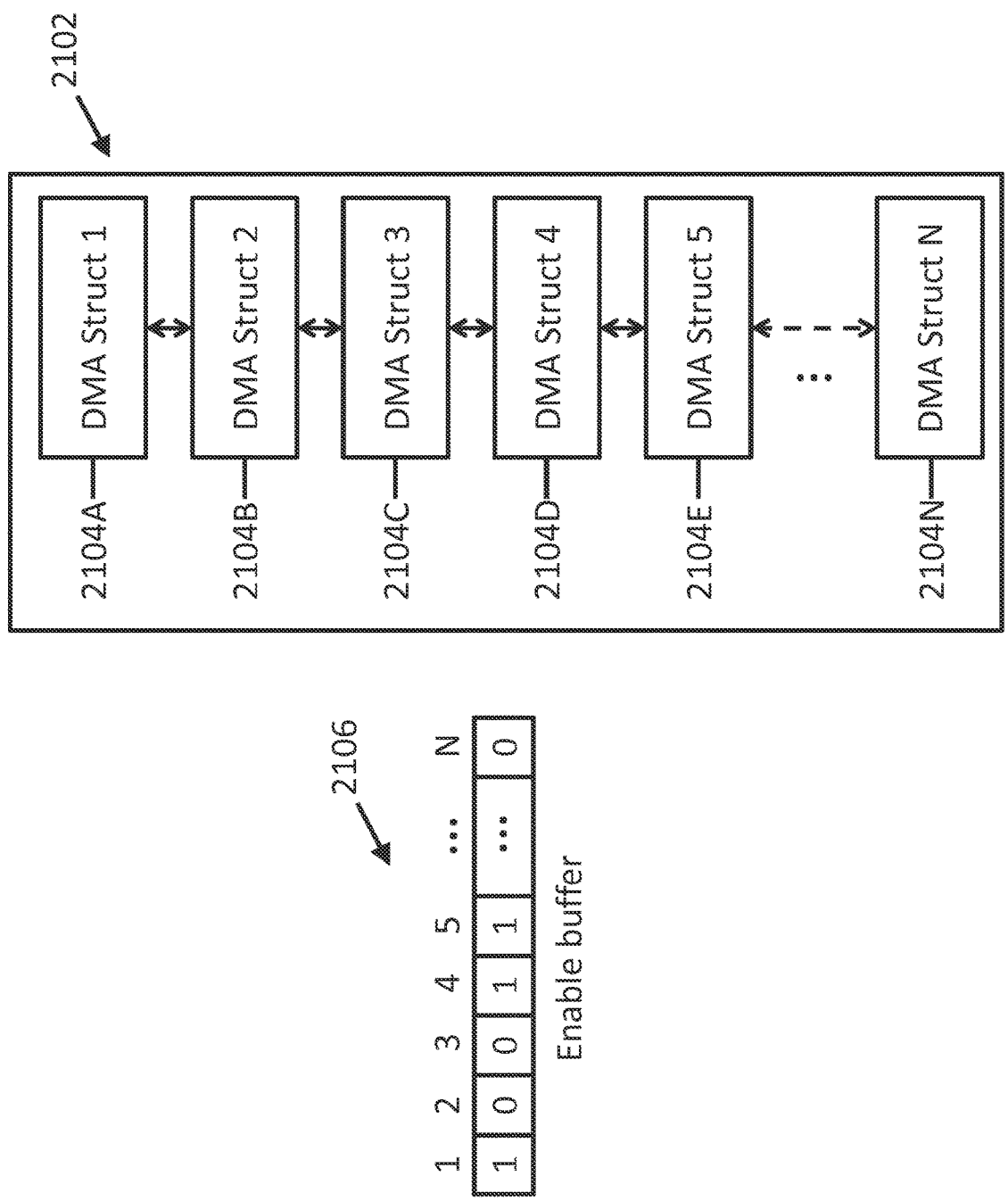
FIG. 21 illustrates a direct memory access (DMA) engine that implements a buffer-based DMA data structure enable mechanism in accordance with some embodiments.

FIG. 21 illustrates a DMA engine that implements a buffer-based DMA data structure enable mechanism in accordance with some embodiments. The DMA engine includes an operation list 2102 that has a plurality of DMA data structures 2104. The plurality of DMA data structures 2104 can be coupled to one another as a double linked list. The DMA engine also includes an enable buffer 2106. The enable buffer 2106 can include a plurality of bits. The number of bits in the enable buffer 2106 can be identical to the number of DMA data structures in the operation list 2102. Each bit in the enable buffer 2106 can indicate whether a DMA data structure associated with the bit is enabled. For example, when a first bit in the buffer is a "1", then the DMA engine can determine that the first DMA data structure is enabled and execute the first DMA data structure. When a second bit in the buffer is a "0", then the DMA engine can determine that the second DMA data structure is enabled and not execute the second DMA data structure. This way, the DMA engine can selectively execute a subset of the DMA data structures in the operation list without actually removing DMA data structures from the operation list. Since the DMA engine does not need to remove DMA data structures, the delay associated with disabling one or more DMA data structures can be small.

Figure 22:
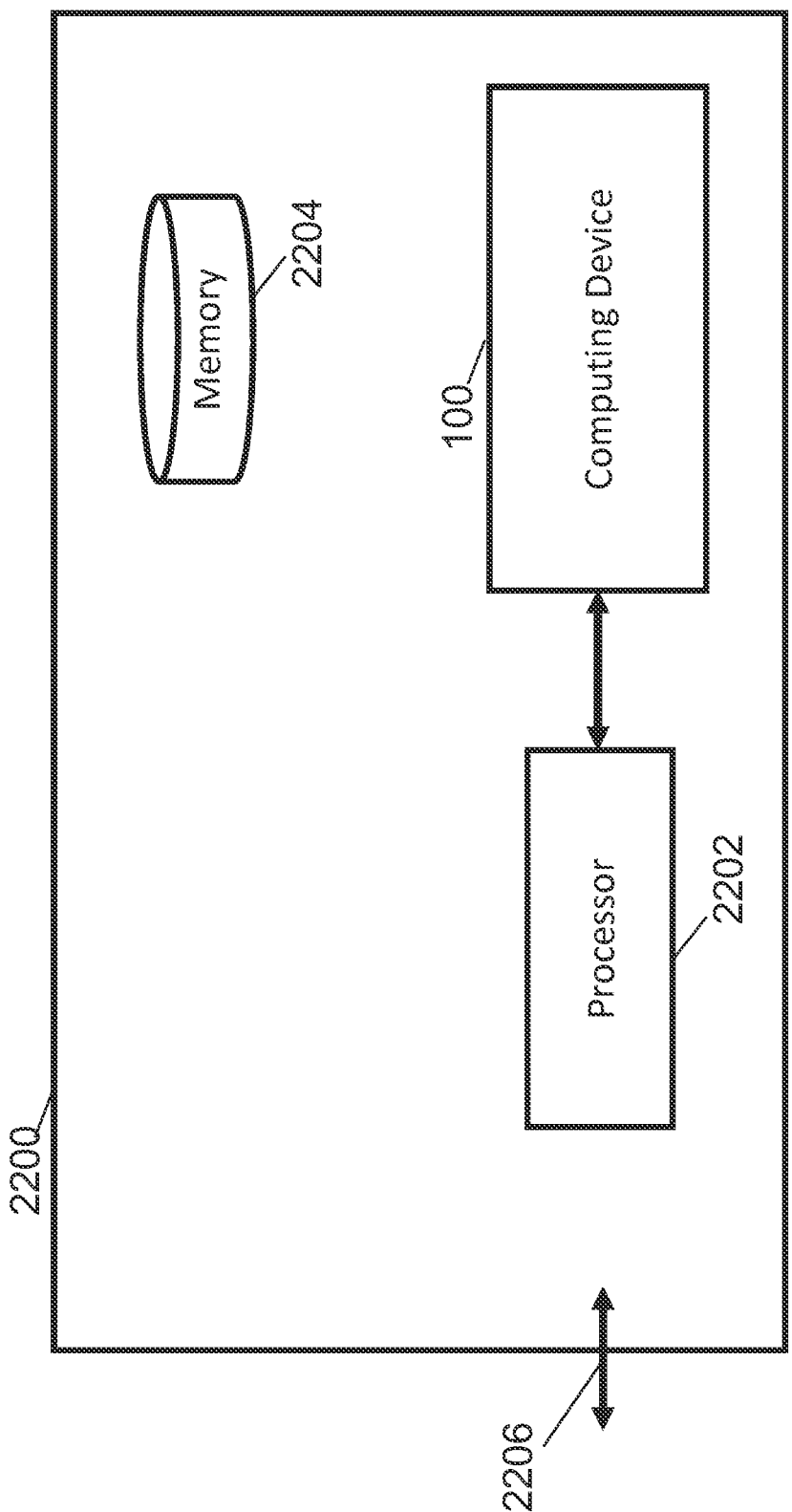
FIG. 22 illustrates an electronic device that includes the computing device in accordance with some embodiments.

In some embodiments, the parallel computing device 100 can reside in an electronic device. FIG. 22 illustrates an electronic device that includes the computing device in accordance with some embodiments. The electronic device 2200 can include a processor 2202, memory 2204, one or more interfaces 2206, and the computing device 100.

The electronic device 2200 can have memory 2204 such as a computer readable medium, flash memory, a magnetic disk drive, an optical drive, a programmable read-only memory (PROM), and/or a read-only memory (ROM). The electronic device 2200 can be configured with one or more processors 2202 that process instructions and run software that may be stored in memory 2204. The processor 2202 can also communicate with the memory 2204 and interfaces 2206 to communicate with other devices. The processor 2202 can be any applicable processor such as a system-on-a-chip that combines a CPU, an application processor, and flash memory, or a reduced instruction set computing (RISC) processor.

The memory 2204 can be a non-transitory computer readable medium, flash memory, a magnetic disk drive, an optical drive, a programmable read-only memory (PROM), a read-only memory (ROM), or any other memory or combination of memories. The software can run on a processor capable of executing computer instructions or computer code. The processor might also be implemented in hardware using an application specific integrated circuit (ASIC), programmable logic array (PLA), field programmable gate array (FPGA), or any other integrated circuit.

The interfaces 2206 can be implemented in hardware or software. The interfaces 2206 can be used to receive both data and control information from the network as well as local sources, such as a remote control to a television. The electronic device can also provide a variety of user interfaces such as a keyboard, a touch screen, a trackball, a touch pad, and/or a mouse. The electronic device may also include speakers and a display device in some embodiments.

In some embodiments, a processing unit, such as a vector processor 102 and a hardware accelerator 104, in the computing device 100 can include an integrated chip capable of executing computer instructions or computer code. The processor might also be implemented in hardware using an application specific integrated circuit (ASIC), programmable logic array (PLA), field programmable gate array (FPGA), or any other integrated circuit.

In some embodiments, the computing device 100 can be implemented as a system on chip (SOC). In other embodiments, one or more blocks in the parallel computing device can be implemented as a separate chip, and the parallel computing device can be packaged in a system in package (SIP). In some embodiments, the parallel computing device 400 can be used for data processing applications. The data processing applications can include image processing applications and/or video processing applications. The image processing applications can include an image processing process, including an image filtering operation; the video processing applications can include a video decoding operation, a video encoding operation, a video analysis operation for detecting motion or objects in videos. Additional applications of the present invention include machine learning and classification based on sequence of images, objects or video and augmented reality applications including those where a gaming application extracts geometry from multiple camera views including depth enabled cameras, and extracts features from the multiple views from which wireframe geometry (for instance via a point-cloud) can be extracted for subsequent vertex shading by a GPU.

The electronic device 2200 can include a mobile device, such as a cellular phone. The mobile device can communicate with a plurality of radio access networks using a plurality of access technologies and with wired communications networks. The mobile device can be a smart phone offering advanced capabilities such as word processing, web browsing, gaming, e-book capabilities, an operating system, and a full keyboard. The mobile device may run an operating system such as Symbian OS, iPhone OS, RIM's Blackberry, Windows Mobile, Linux, Palm WebOS, and Android. The screen may be a touch screen that can be used to input data to the mobile device and the screen can be used instead of the full keyboard. The mobile device may have the capability to run applications or communicate with applications that are provided by servers in the communications network. The mobile device can receive updates and other information from these applications on the network.

The electronic device 2200 can also encompasses many other devices such as televisions (TVs), video projectors, set-top boxes or set-top units, digital video recorders (DVR), computers, netbooks, laptops, tablet computers, and any other audio/visual equipment that can communicate with a network. The electronic device can also keep global positioning coordinates, profile information, or other location information in its stack or memory.

It will be appreciated that whilst several different arrangements have been described herein, that the features of each may be advantageously combined together in a variety of forms to achieve advantage.

In the foregoing specification, the application has been described with reference to specific examples. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word "comprising" does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A computing device to coordinate memory operations comprising:
    memory fabric circuitry including a first memory slice and a second memory slice;
    first processor circuitry in circuit with the first memory slice via a first bus;
    second processor circuitry in circuit with the second memory slice via a second bus;
    first power circuitry to provide a first supply voltage to the first processor circuitry;
    second power circuitry to provide a second supply voltage to the second processor circuitry; and
    first and second input registers in circuit with the first and second power circuitry, respectively, the first and second input registers to release input data from the memory fabric circuitry to one or more of the first or second processor circuitry in response to an indication that respective first or second power circuitry is ready.

2. The computing device as defined in claim 1, further including a first tile in circuit with the first memory slice, the first tile including at least one port to communicate with the first processor circuitry.

3. The computing device as defined in claim 2, wherein the first tile includes random access memory.

4. The computing device as defined in claim 2, further including tile control circuitry to perform a data access request corresponding to a memory address of the memory fabric circuitry.

5. The computing device as defined in claim 4, wherein the tile control circuitry is to provide a data access grant for the first memory slice in response to an indication the data access request does not include a clash.

6. The computing device as defined in claim 5, wherein the tile control circuitry is to permit a direct memory access by the first memory slice to the memory address of the memory fabric circuitry when the indication that the data access request does not include the clash.

7. The computing device as defined in claim 1, further including signal generator circuitry to generate an enable signal at an input of the first and second power circuitry.

8. The computing device as defined in claim 7, wherein the signal generator circuitry is to cause the first and second input registers to release the input data in response to detecting the enable signal has propagated through the first and second power circuitry.

9. A system comprising:
- memory fabric circuitry including a first memory slice and a second memory slice;
- first processor circuitry communicatively connected with the first memory slice via first means for bus communication;
- second processor circuitry communicatively connected with the second memory slice via second means for bus communication;
- first means for power control to provide a first supply voltage to the first processor circuitry;
- second means for power control to provide a second supply voltage to the second processor circuitry; and
- first and second register means communicatively connected with the first and second power circuitry, respectively, the first and second register means to release input data from the memory fabric circuitry to one or more of the first or second processor circuitry in response to an indication that respective first means for power control or second means for power control is ready.

10. The system as defined in claim 9, further including first tile means communicatively connected with the first memory slice, the first tile means including at least one means for port communication with the first processor circuitry.

11. The system as defined in claim 10, wherein the first tile means includes random access memory (RAM).

12. The system as defined in claim 10, further including means for tile control to perform a data access request corresponding to a memory address of the memory fabric circuitry.

13. The system as defined in claim 12, wherein the means for tile control is to provide a data access grant for the first memory slice in response to an indication the data access request does not include a clash.

14. The system as defined in claim 13, wherein the means for tile control is to permit a direct memory access by the first memory slice to the memory address of the memory fabric circuitry when the indication that the data access request does not include the clash.

15. The system as defined in claim 9, further including means for signal generation to generate an enable signal at an input of the first and second means for power control.

16. The system as defined in claim 15, wherein the means for signal generation is to cause the first and second register means to release the input data in response to detecting the enable signal has propagated through the first and second means for power control.

17. The computing device as defined in claim 1, wherein the first processor circuitry includes a vector processor, and the second processor circuitry includes a hardware accelerator.

18. The system as defined in claim 9, wherein one of the first processor circuitry or the second processor circuitry includes a vector processor, and an other one of the first processor circuitry or the second processor circuitry includes a hardware accelerator.

* * * * *